(12) United States Patent
Matsuzaki et al.

(10) Patent No.: US 11,984,147 B2
(45) Date of Patent: May 14, 2024

(54) SEMICONDUCTOR DEVICE INCLUDING SENSE AMPLIFIER AND OPERATION METHOD OF SEMICONDUCTOR DEVICE

(71) Applicant: Semiconductor Energy Laboratory Co., Ltd., Atsugi (JP)

(72) Inventors: Takanori Matsuzaki, Atsugi (JP); Tatsuya Onuki, Atsugi (JP); Yuki Okamoto, Isehara (JP); Toshiki Hamada, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 131 days.

(21) Appl. No.: 17/602,431

(22) PCT Filed: Apr. 15, 2020

(86) PCT No.: PCT/IB2020/053526
§ 371 (c)(1),
(2) Date: Oct. 8, 2021

(87) PCT Pub. No.: WO2020/217138
PCT Pub. Date: Oct. 29, 2020

(65) Prior Publication Data
US 2022/0172766 A1     Jun. 2, 2022

(30) Foreign Application Priority Data
Apr. 26, 2019   (JP) ................. 2019-085084

(51) Int. Cl.
    *G11C 11/405*     (2006.01)
    *G11C 11/4091*     (2006.01)
    *G11C 11/56*     (2006.01)
    *H01L 29/786*     (2006.01)

(52) U.S. Cl.
CPC ........ *G11C 11/405* (2013.01); *G11C 11/4091* (2013.01); *G11C 11/5642* (2013.01);
(Continued)

(58) Field of Classification Search
CPC .............. G11C 11/405; G11C 11/4091; G11C 11/5642; G11C 11/565; G11C 2211/5634;
(Continued)

(56) References Cited

U.S. PATENT DOCUMENTS 4,841,483 A    6/1989   Furuyama
9,177,872 B2   11/2015   Sandhu
(Continued)

FOREIGN PATENT DOCUMENTS

EP         0273639 A    7/1988
JP         63-149900 A   6/1988
(Continued)

OTHER PUBLICATIONS

International Search Report (Application No. PCT/IB2020/053526) dated Oct. 6, 2020.
(Continued)

*Primary Examiner* — Sultana Begum
(74) *Attorney, Agent, or Firm* — Eric J. Robinson; Robinson Intellectual Property Law Office, P.C.

(57) ABSTRACT

A semiconductor device storing data as a multilevel potential is provided. The semiconductor device includes a memory cell, first and second reference cells, first and second sense amplifiers, and first to third circuits. The first circuit has a function of outputting, to a first wiring and a third wiring, a first potential corresponding to a first signal output from the memory cell. The second circuit has a function of outputting, to a second wiring, a first reference potential corresponding to a second signal output from the first reference cell. The third circuit has a function of outputting, to the fourth wiring, a second reference potential corresponding to a third signal output from the second reference cell when a second switch is in an off state. The first sense amplifier refers to the first potential and the first (Continued)

reference potential and changes potentials of the first wiring and the second wiring. The second sense amplifier refers to the first potential and the second reference potential and changes potentials of the third wiring and the fourth wiring.

10 Claims, 26 Drawing Sheets

(52) U.S. Cl.
CPC ........ *G11C 11/565* (2013.01); *H01L 29/7869* (2013.01); *H01L 29/78696* (2013.01); *G11C 2211/5634* (2013.01)

(58) Field of Classification Search
CPC ........... H01L 29/7869; H01L 29/78696; H01L 29/788; H01L 29/792
See application file for complete search history.

(56) References Cited

U.S. PATENT DOCUMENTS

| | | |
|---|---|---|
| 9,478,276 B2 | 10/2016 | Onuki |
| 9,634,097 B2 | 4/2017 | Rabkin et al. |
| 9,754,657 B2 | 9/2017 | Onuki et al. |
| 9,865,325 B2 | 1/2018 | Onuki |
| 11,205,461 B2 | 12/2021 | Onuki et al. |
| 11,699,465 B2 | 7/2023 | Onuki et al. |
| 2011/0065270 A1 | 3/2011 | Shim et al. |
| 2015/0294710 A1 | 10/2015 | Onuki |
| 2016/0336057 A1 | 11/2016 | Onuki et al. |
| 2023/0307012 A1 | 9/2023 | Onuki et al. |

FOREIGN PATENT DOCUMENTS

| | | |
|---|---|---|
| JP | 01-192083 A | 8/1989 |
| JP | 2016-054282 A | 4/2016 |
| JP | 2016-219089 A | 12/2016 |
| KR | 1988-0008337 A | 8/1988 |
| KR | 2016-0145069 A | 12/2016 |
| TW | 201541454 | 11/2015 |
| WO | WO-2015/155635 | 10/2015 |
| WO | WO-2019/003045 | 1/2019 |

OTHER PUBLICATIONS

Written Opinion (Application No. PCT/IB2020/053526) dated Oct. 6, 2020.

CAP(CAPB)

CAP(CAPB)

RFC(RFCB)

RFC(RFCB)

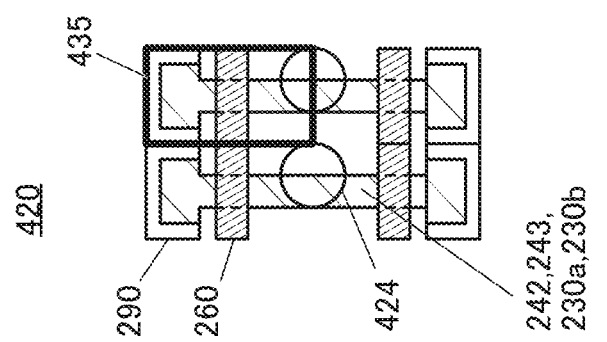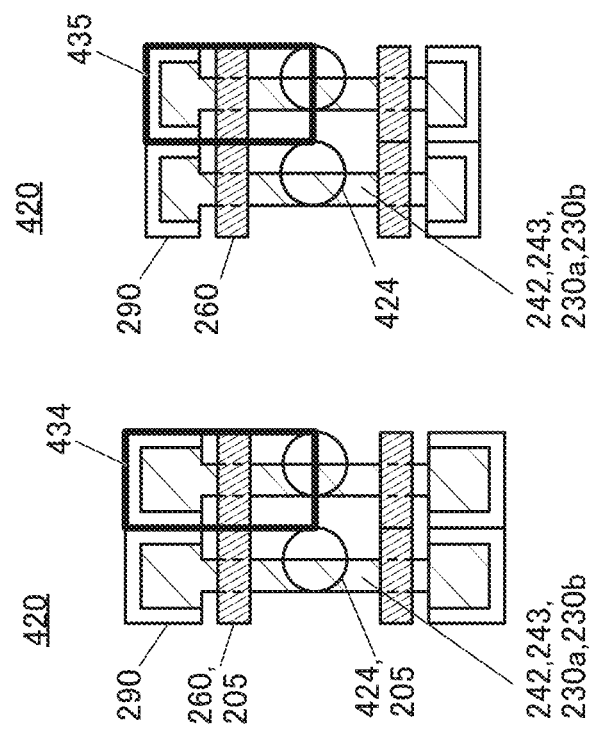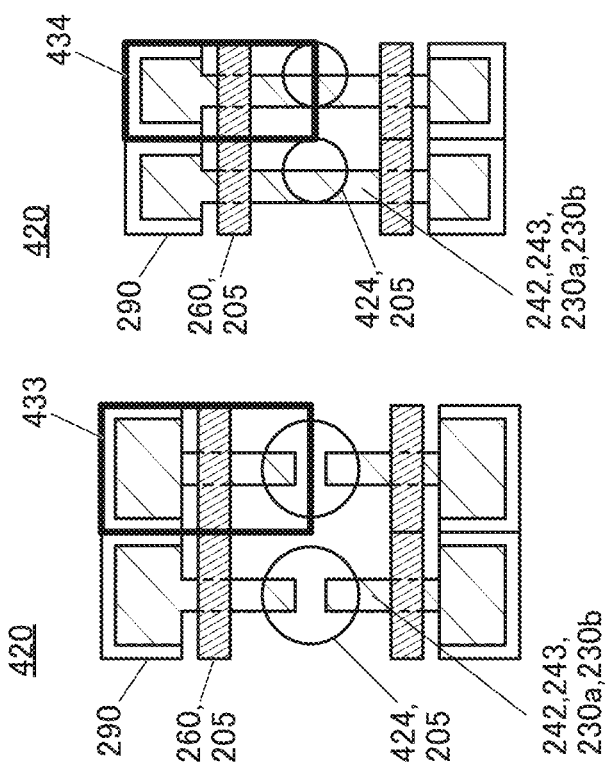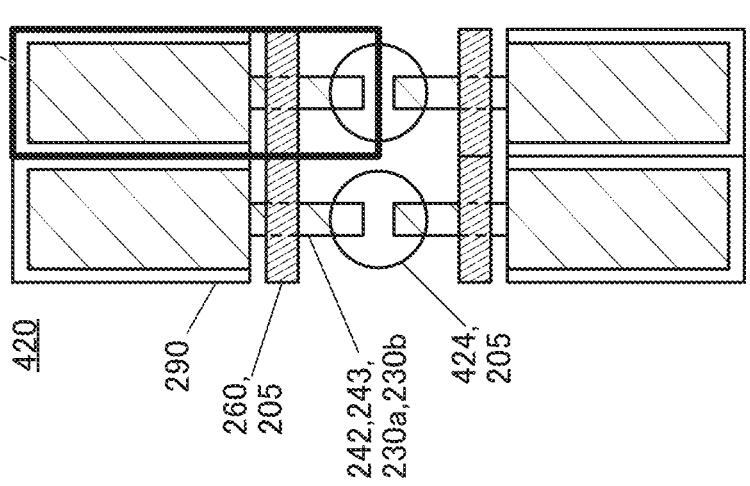

FIG. 21A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 21B
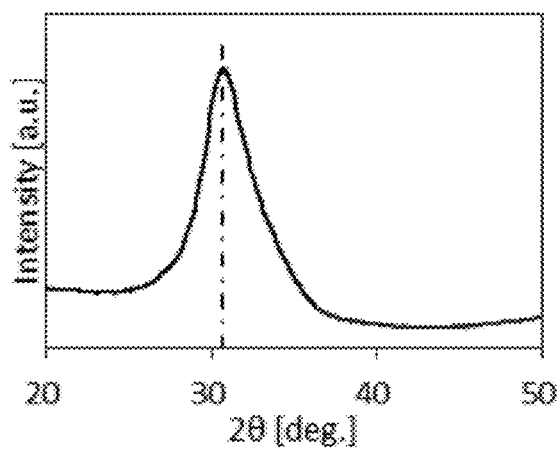
FIG. 21C
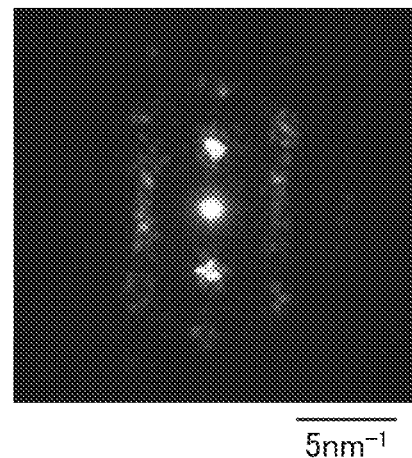

SEMICONDUCTOR DEVICE INCLUDING SENSE AMPLIFIER AND OPERATION METHOD OF SEMICONDUCTOR DEVICE

TECHNICAL FIELD

One embodiment of the present invention relates to a semiconductor device and an operation method of the semiconductor device.

Note that one embodiment of the present invention is not limited to the above technical field. The technical field of the invention disclosed in this specification and the like relates to an object, an operation method (driving method), or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, with an increasing amount of data to process, a semiconductor device having a larger storage capacity has been required. To increase storage capacity per unit area, stacking memory cells is effective (see Patent Document 1, Patent Document 2, and Patent Document 3). Stacking memory cells can increase storage capacity per unit area in accordance with the number of stacked memory cells.

REFERENCE

Patent Documents

[Patent Document 1] United States Patent Application Publication No. 2011/0065270
[Patent Document 2] U.S. Pat. No. 9,634,097
[Patent Document 3] U.S. Pat. No. 9,177,872

SUMMARY OF THE INVENTION

Problems to be Solved by the Invention

As a means for increasing storage capacity of a semiconductor device, retaining multilevel potentials can be given, for example. Note that in the case of a semiconductor device that can retain multilevel data in one memory cell, voltage distribution are needed for each data state in accordance with the number of bits that can be retained in the memory cell. For example, in the case of a memory cell that can retain 2-bit data, four voltage distributions are needed and thus three threshold voltages are needed as references for distinguishing the four voltage distributions. In particular, as the number of bits that can be retained is increased, the voltage distribution width of one data state has to be narrowed. In the case where the voltage distribution width is narrow, a wrong value might be read from the memory cell in data reading because of deviation from the value of originally retained data. Therefore, in the case of processing multilevel data, the semiconductor device preferably includes a circuit that can accurately read multilevel data values.

An object of one embodiment of the present invention is to provide a semiconductor device that can retain multilevel data and read the multilevel data. Another object of one embodiment of the present invention is to provide a semiconductor device with higher bit density. Another object of one embodiment of the present invention is to provide a novel semiconductor device. Another object of one embodiment of the present invention is to provide a novel operation method of a semiconductor device.

Note that the objects of one embodiment of the present invention are not limited to the objects listed above. The objects listed above do not preclude the existence of other objects. Note that the other objects are objects that are not described in this section and are described below. The objects that are not described in this section are derived from the descriptions of the specification, the drawings, and the like and can be extracted as appropriate from these descriptions by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)
One embodiment of the present invention is a semiconductor device including a memory cell, a first reference cell, a second reference cell, a first sense amplifier, a second sense amplifier, a first circuit, a second circuit, a third circuit, a first switch, a second switch, a first wiring, a second wiring, a third wiring, and a fourth wiring. The memory cell is electrically connected to the first circuit. The first reference cell is electrically connected to the second circuit. The second reference cell is electrically connected to the third circuit. The first wiring is electrically connected to the first circuit, a first terminal of the first switch, and the first sense amplifier. The second wiring is electrically connected to the second circuit, a first terminal of the second switch, and the first sense amplifier. The third wiring is electrically connected to a second terminal of the first switch and the second sense amplifier. The fourth wiring is electrically connected to the third circuit, a second terminal of the second switch, and the second sense amplifier. The first circuit has a function of outputting, to the first wiring and the third wiring, a first potential corresponding to a first signal output from the memory cell, when the first switch is in an on state. The second circuit has a function of outputting, to the second wiring, a second potential corresponding to a second signal output from the first reference cell, when the second switch is in an off state. The third circuit has a function of outputting, to the fourth wiring, a third potential corresponding to a third signal output from the second reference cell, when the second switch is in an off state.

(2)
Another embodiment of the present invention is a semiconductor device including a memory cell, a first reference cell, a second reference cell, a first sense amplifier, a second sense amplifier, a first circuit, a second circuit, a third circuit, a first switch, a second switch, a first wiring, a second wiring, a third wiring, and a fourth wiring. The memory cell is electrically connected to the first circuit. The first reference cell is electrically connected to the second circuit. The second reference cell is electrically connected to the third circuit. The first wiring is electrically connected to the first circuit, a first terminal of the first switch, and the first sense amplifier. The second wiring is electrically connected to the second circuit, a first terminal of the second switch, and the first sense amplifier. The third wiring is electrically connected to a second terminal of the first switch and the second sense amplifier. The fourth wiring is electrically connected to the third circuit, a second terminal of the second switch, and the second sense amplifier. The first circuit has a function of outputting, to the first wiring and the third wiring, a first potential corresponding to a first signal output from the memory cell, when the first switch is in an on state. The second circuit has a function of outputting, to the second wiring, a second potential corresponding to a second signal output from the first reference cell, when the second switch is in an off state. The third circuit has a function of outputting, to the fourth wiring, a third potential corresponding to a third signal output from the second reference cell, when the second switch is in an off state.

(3)

Another embodiment of the present invention is the semiconductor device having the above structure (1) or (2), in which the first circuit includes a first transistor, the second circuit includes a second transistor, the third circuit includes a third transistor, a gate of the first transistor is electrically connected to the memory cell, a first terminal of the first transistor is electrically connected to the first wiring, a gate of the second transistor is electrically connected to the first reference cell, a first terminal of the second transistor is electrically connected to the second wiring, a gate of the third transistor is electrically connected to the second reference cell, and a first terminal of the third transistor is electrically connected to the third wiring.

(4)

Another embodiment of the present invention is the semiconductor device having any of the above structures (1) to (3), in which the memory cell includes a fourth transistor and a capacitor, a first terminal of the fourth transistor is electrically connected to a first terminal of the capacitor, and a second terminal of the fourth transistor is electrically connected to the first circuit.

(5)

Another embodiment of the present invention is the semiconductor device with the above structure (4) further including a first layer and a second layer. The first layer includes the first sense amplifier and the second sense amplifier. The second layer includes the memory cell, the first reference cell, and the second reference cell. The second layer is positioned above the first layer. The first to fourth transistors each contain a metal oxide in a channel formation region. Transistors included in the first sense amplifier and the second sense amplifier each contain silicon in a channel formation region.

(6)

Another embodiment of the present invention is an operation method of a semiconductor device including a memory cell, a first reference cell, a second reference cell, a first sense amplifier, a second sense amplifier, a first circuit, a second circuit, a third circuit, a first switch, a second switch, a first wiring, a second wiring, a third wiring, and a fourth wiring. The memory cell is electrically connected to the first circuit. The first reference cell is electrically connected to the second circuit. The second reference cell is electrically connected to the third circuit. The first wiring is electrically connected to the first circuit, a first terminal of the first switch, and the first sense amplifier. The second wiring is electrically connected to the second circuit, a first terminal of the second switch, and the first sense amplifier. The third wiring is electrically connected to a second terminal of the first switch and the second sense amplifier. The fourth wiring is electrically connected to the third circuit, a second terminal of the second switch, and the second sense amplifier. The operation method includes a first period to a sixth period. The first period includes a period in which a first signal output from the memory cell is input to the first circuit. The second period includes a period in which the first switch is in an on state and a first potential corresponding to the first signal is output from the first circuit to the first wiring and the third wiring. The third period includes a period in which the second switch is brought into an off state. The fourth period includes a period in which a second signal output from the first reference cell is input to the second circuit and a second potential corresponding to the second signal is output from the second circuit to the second wiring, and a period in which a third signal output from the second reference cell is input to the third circuit and a third potential corresponding to the third signal is output from the third circuit to the third wiring. The fifth period includes a period in which the first switch is brought into an off state. The sixth period includes a period in which the first sense amplifier refers to the first potential of the first wiring and the second potential of the second wiring, changes the first potential of the first wiring to one of a high-level potential and a low-level potential, and changes the second potential of the second wiring to the other of the high-level potential and the low-level potential, and a period in which the second sense amplifier refers to the first potential of the third wiring and the third potential of the fourth wiring, changes the first potential of the third wiring to one of a high-level potential and a low-level potential, and changes the third potential of the fourth wiring to the other of the high-level potential and the low-level potential.

(7)

Another embodiment of the present invention is the above operation method (6) of a semiconductor device in which the first circuit includes a first transistor, the second circuit includes a second transistor, the third circuit includes a third transistor, a gate of the first transistor is electrically connected to the memory cell, a first terminal of the first transistor is electrically connected to the first wiring, a gate of the second transistor is electrically connected to the first reference cell, a first terminal of the second transistor is electrically connected to the second wiring, a gate of the third transistor is electrically connected to the second reference cell, and a first terminal of the third transistor is electrically connected to the third wiring.

(8)

Another embodiment of the present invention is the above operation method (6) or (7) of a semiconductor device in which the memory cell includes a fourth transistor and a capacitor, a first terminal of the fourth transistor is electrically connected to a first terminal of the capacitor, and a second terminal of the fourth transistor is electrically connected to the first circuit.

(9)

Another embodiment of the present invention is the above operation method (8) of a semiconductor device further including a first layer and a second layer. The first layer includes the first sense amplifier and the second sense amplifier. The second layer includes the memory cell, the first reference cell, and the second reference cell. The second layer is positioned above the first layer. The first to fourth transistors each contain a metal oxide in a channel formation region. Transistors included in the first sense amplifier and the second sense amplifier each contain silicon in a channel formation region.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to determine whether a current flows or not.

For example, in the case where X and Y are functionally connected, at least one circuit that enables functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description "X and Y are electrically connected" includes the case where X and Y are electrically connected (that is, the case where X and Y are connected with another element or another circuit interposed therebetween), the case where X and Y are functionally connected (that is, the case where X and Y are functionally connected with another circuit interposed therebetween), and the case where X and Y are directly connected (that is, the case where X and Y are connected without another element or another circuit interposed therebetween). That is, the explicit description "X and Y are electrically connected" is the same as the explicit simple description "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between the source and the drain, a diode, and a coil. Thus, the term "resistor" can be replaced with the terms "resistance", "load", and "a region having a resistance value", and the like; inversely, the terms "resistance", "load", and "a region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. Alternatively, the resistance value may be greater than or equal to 1Ω and less than or equal to $1 \times 10^9 \Omega$, for example.

In this specification and the like, a "capacitor" can be, for example, a circuit element having an electrostatic capacitance higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be replaced with the "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the terms "high-level potential" and "low-level potential" do not mean specific potentials. For example, in the case where two wirings are both described as "functioning as a wiring for supplying a high-level potential", the high-level potentials supplied by the wirings are not necessarily equal to each other. Similarly, in the case where two wirings are both described as "functioning as a wiring for supplying a low-level potential", the low-level potentials supplied by the wirings are not necessarily equal to each other.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a positive carrier moves, and the amount of current is expressed as a positive value. In other words, the direction in which a negative carrier moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over" and "under", are sometimes used for convenience to describe the positional relation between components with reference to drawings. The positional relation between components is changed as appropriate in accordance with a direction in which the components are described. Thus, terms for the description are not limited to terms used in the specification and the like, and the description can be made appropriately according to circumstances. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. As another example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the terms "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch has a function of being in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Effect of the Invention

One embodiment of the present invention can provide a semiconductor device that can retain multilevel data and read the multilevel data. Another embodiment of the present invention can provide a semiconductor device with higher bit density. Another embodiment of the present invention can provide a novel semiconductor device. Another embodiment of the present invention can provide a novel operation method of a semiconductor device.

Note that the effects of one embodiment of the present invention are not limited to the effects listed above. The effects listed above do not preclude the existence of other effects. Note that the other effects are effects that are not described in this section and are described below. The effects that are not described in this section are derived from the descriptions of the specification, the drawings, and the like and can be extracted as appropriate from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 20A to FIG. 20D are top views each illustrating a structure example of a semiconductor device.

FIG. 21A is a diagram showing the classification of crystal structures of IGZO. FIG. 21B is a diagram showing an XRD spectrum of a CAAC-IGZO film. FIG. 21C is a diagram showing a nanobeam electron diffraction pattern of the CAAC-IGZO film.

MODE FOR CARRYING OUT THE INVENTION

Figure 1:
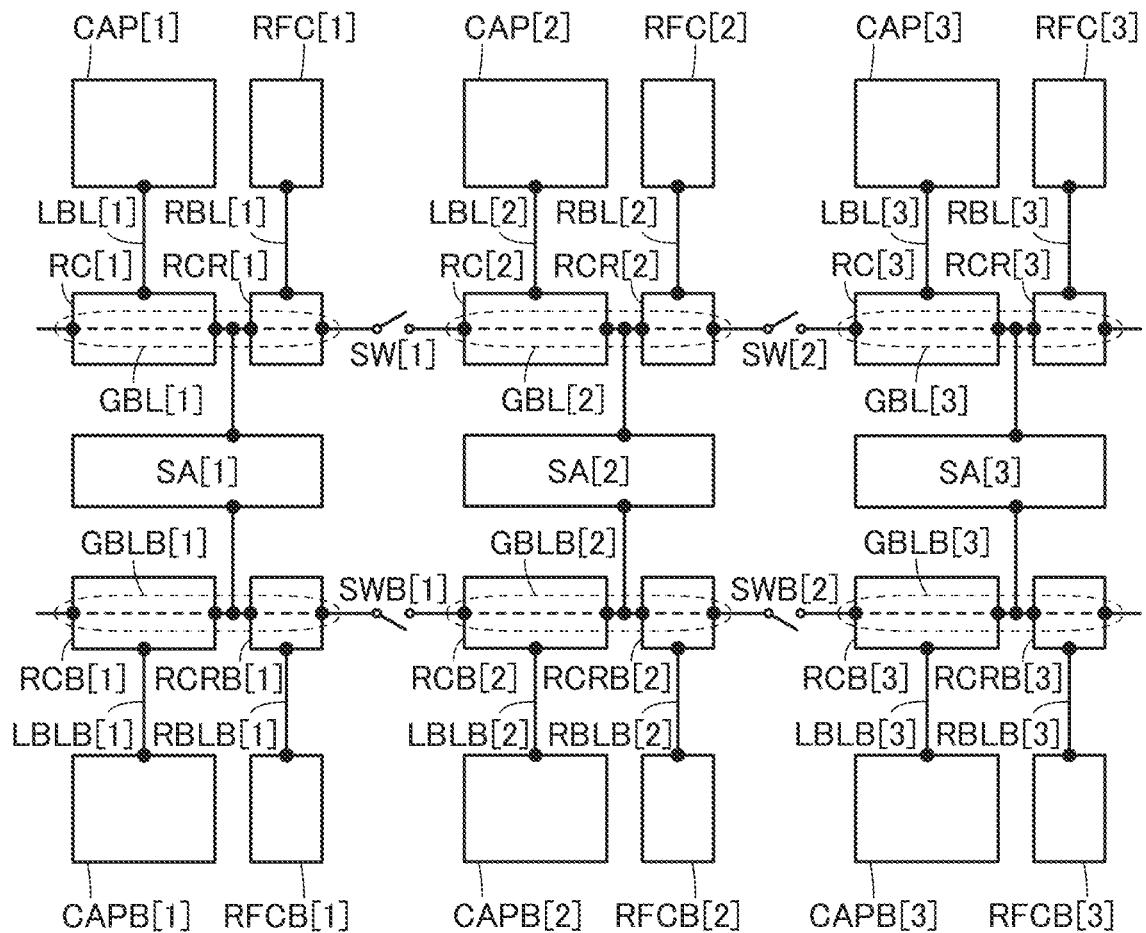
FIG. 1 is a block diagram illustrating a configuration example of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. Moreover, when an OS FET or an OS transistor is described, it can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1" "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, variations in signal, voltage, or current due to noise, variations in signal, voltage, or current due to difference in timing, or the like can be included.

(Embodiment 1)

In this embodiment, configuration examples and an operation example of a memory device that is a semiconductor device of one embodiment of the present invention are described.

<Configuration Example>

FIG. 1 is a block diagram illustrating an example of a memory device 100, and the memory device 100 is a memory device that can write and read a four-level potential as data.

Specifically, the memory device 100 has a function of writing any of $V_{00}$, $V_{01}$, $V_{10}$, and $V_{11}$, for example, as a potential corresponding to four-level data to a memory cell included in the memory device 100, and the memory device 100 has a function of reading any of $V_{00}$, $V_{01}$, $V_{10}$, and $V_{11}$ written to the memory cell. As for the potential levels of $V_{00}$, $V_{01}$, $V_{10}$, and $V_{11}$, $V_{00}$ is the lowest, $V_{01}$ is the second lowest, $V_{10}$ is the second highest, and $V_{11}$ is the highest, for example.

The memory device 100 includes, for example, a cell array portion CAP[1] to a cell array portion CAP[3], a cell array portion CAPB[1] to a cell array portion CAPB[3], a reference cell portion RFC[1] to a reference cell portion RFC[3], a reference cell portion RFCB[1] to a reference cell portion RFCB[3], a circuit RC[1] to a circuit RC[3], a circuit RCB[1] to a circuit RCB[3], a circuit RCR[1] to a circuit RCR[3], a circuit RCRB[1] to a circuit RCRB[3], a sense amplifier SA[1] to a sense amplifier SA[3], a switch SW[1], a switch SW[2], a switch SWB[1], and a switch SWB[2].

As the switch SW[1], the switch SW[2], the switch SWB[1], and the switch SWB[2], an electrical switch or a mechanical switch can be used, for example.

The cell array portion CAP[1] is electrically connected to the circuit RC[1] through a wiring LBL[1]. The reference cell portion RFC[1] is electrically connected to the circuit RCR[1] through a wiring RBL[1]. The circuit RC[1] and the circuit RCR[1] are electrically connected to a wiring GBL[1]. The wiring GBL[1] is electrically connected to the sense amplifier SA[1].

The cell array portion CAPB[1] is electrically connected to the circuit RCB[1] through a wiring LBLB[1]. The reference cell portion RFCB[1] is electrically connected to the circuit RCRB[1] through a wiring RBLB[1]. The circuit RCB[1] and the circuit RCRB[1] are electrically connected to a wiring GBLB[1]. The wiring GBLB[1] is electrically connected to the sense amplifier SA[1].

As illustrated in FIG. 1, the electrical connection configuration of the cell array portion CAP[2], the reference cell portion RFC[2], the circuit RC[2], the circuit RCR[2], and the sense amplifier SA[2] can be similar to the electrical connection configuration of the cell array portion CAP[1], the reference cell portion RFC[1], the circuit RC[1], the circuit RCR[1], and the sense amplifier SA[1]. The electrical connection configuration of the cell array portion CAPB[2], the reference cell portion RFCB[2], the circuit RCB[2], the circuit RCRB[2], and the sense amplifier SA[2] can be similar to the electrical connection configuration of the cell array portion CAPB[1], the reference cell portion RFCB[1], the circuit RCB[1], the circuit RCRB[1], and the sense amplifier SA[1]. Note that a wiring LBL[2] functions as a wiring that electrically connects the cell array portion CAP[2] and the circuit RC[2], and a wiring RBL[2] functions as a wiring that electrically connects the reference cell portion RFC[2] and the circuit RCR[2]. A wiring LBLB[2] functions as a wiring that electrically connects the cell array portion CAPB[2] and the circuit RCB[2], and a wiring RBLB[2] functions as a wiring that electrically connects the reference cell portion RFCB[2] and the circuit RCRB[2].

As illustrated in FIG. 1, the electrical connection configuration of the cell array portion CAP[3], the reference cell portion RFC[3], the circuit RC[3], the circuit RCR[3], and the sense amplifier SA[3] can be similar to the electrical connection configuration of the cell array portion CAP[1], the reference cell portion RFC[1], the circuit RC[1], the circuit RCR[1], and the sense amplifier SA[1]. The electrical connection configuration of the cell array portion CAPB[3], the reference cell portion RFCB[3], the circuit RCB[3], the circuit RCRB[3], and the sense amplifier SA[3] can be similar to the electrical connection configuration of the cell array portion CAPB[1], the reference cell portion RFCB[1], the circuit RCB[1], the circuit RCRB[1], and the sense amplifier SA[1]. Note that a wiring LBL[3] functions as a wiring that electrically connects the cell array portion CAP[3] and the circuit RC[3], and a wiring RBL[3] functions as a wiring that electrically connects the reference cell portion RFC[3] and the circuit RCR[3]. A wiring LBLB[3] functions as a wiring that electrically connects the cell array portion CAPB[3] and the circuit RCB[3], and a wiring RBLB[3] functions as a wiring that electrically connects the reference cell portion RFCB[3] and the circuit RCRB[3].

A first terminal of the switch SW[1] is electrically connected to the wiring GBL[1], and a second terminal of the switch SW[1] is electrically connected to a wiring GBL[2]. A first terminal of the switch SW[2] is electrically connected to the wiring GBL[2], and a second terminal of the switch SW[2] is electrically connected to a wiring GBL[3]. A first terminal of the switch SWB[1] is electrically connected to the wiring GBLB[1], and a second terminal of the switch SWB[1] is electrically connected to a wiring GBLB[2]. A first terminal of the switch SWB[2] is electrically connected to the wiring GBLB[2], and a second terminal of the switch SWB[2] is electrically connected to a wiring GBLB[3].

<<Cell Array Portion CAP and Cell Array Portion CAPB>>

Next, the cell array portion CAP[1] to the cell array portion CAP[3] and the cell array portion CAPB[1] to the cell array portion CAPB[3] that are included in the memory device 100 in FIG. 1 are described.

Figure 2A:
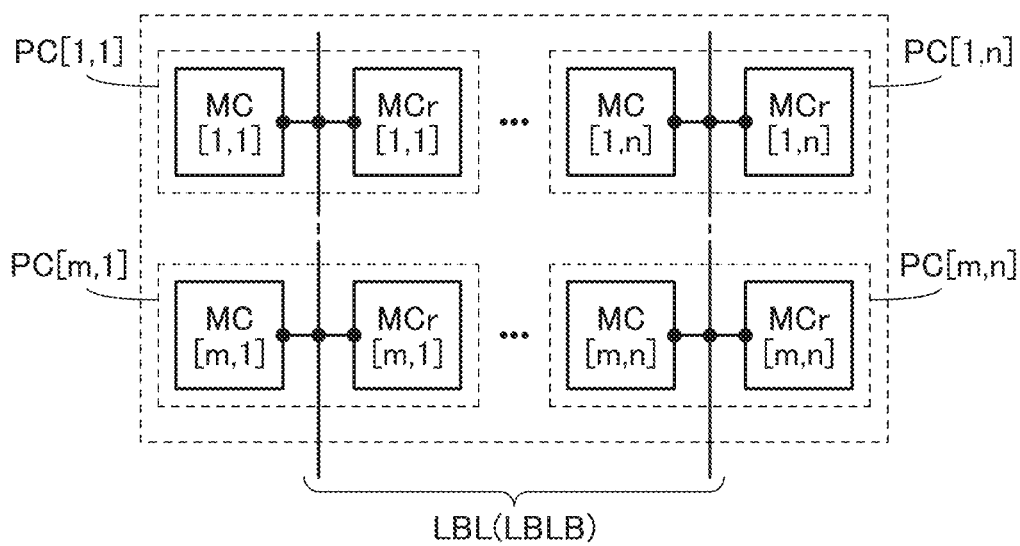
FIG. 2A and FIG. 2B are block diagrams each illustrating a configuration example of a circuit included in a semiconductor device.

FIG. 2A is a block diagram illustrating a configuration example of a circuit that can be used as the cell array portion CAP[1] to the cell array portion CAP[3] and the cell array portion CAPB[1] to the cell array portion CAPB[3]. Note that the identification sign [ ] is omitted in FIG. 2A; the cell array portion CAP[1] to the cell array portion CAP[3] are referred to as the cell array portion CAP, the cell array portion CAPB[1] to the cell array portion CAPB[3] are referred to as the cell array portion CAPB, the wiring LBL[1] to the wiring LBL[3] are referred to as the wiring LBL, and the wiring LBLB[1] to the wiring LBLB[3] are referred to as the wiring LBLB.

Hereinafter, the circuit having the configuration illustrated in FIG. 2A is described as the cell array portion CAP. Since the cell array portion CAPB can have a configuration similar to that of the cell array portion CAP, the following description of the cell array portion CAP is referred to for the description of the cell array portion CAPB. In that case, the wiring LBL is replaced with the wiring LBLB in the following description.

The cell array portion CAP includes, for example, a pair cell PC[1,1] to a pair cell PC[m,n] (m is an integer of 1 or more, and n is an integer of 1 or more).

In the cell array portion CAP in FIG. 2A, n wirings LBL are provided. A circuit MC[1,1] to a circuit MC[m,1] and a circuit MCr[1,1] to a circuit MCr[m,1] that are positioned in the first column are electrically connected to the first wiring LBL, for example, and a circuit MC[1,n] to a circuit MC[m,n] and a circuit MCr[1,n] to a circuit MCr[m,n] that are positioned in the n-th column are electrically connected to the n-th wiring LBL, for example. Although a wiring other than the wiring LBL needs to be provided depending on the circuit configurations of the circuit MC[1,1] to the circuit MC[m,n] and the circuit MCr[1,1] to the circuit MCr[m,n], only the wiring LBL is illustrated in FIG. 2A.

The circuit MC[1,1] to the circuit MC[m,n] and the circuit MCr[1,1] to the circuit MCr[m,n] that are included in the cell array portion CAP each function as a memory cell of the memory device 100. When the circuit MC and the circuit MCr having the same address form the pair cell PC as illustrated in FIG. 2A, the memory device 100 can have higher memory cell density in some cases. Specifically, the circuit MC[1,1] and the circuit MCr[1,1] form the pair cell PC[1,1], the circuit MC[m,1] and the circuit MCr[m,1] form the pair cell PC[m,1], the circuit MC[1,n] and the circuit MCr[1,n] form the pair cell PC[1,n], and the circuit MC[m,n] and the circuit MCr[m,n] form the pair cell PC[m,n], for example.

Figure 2B:
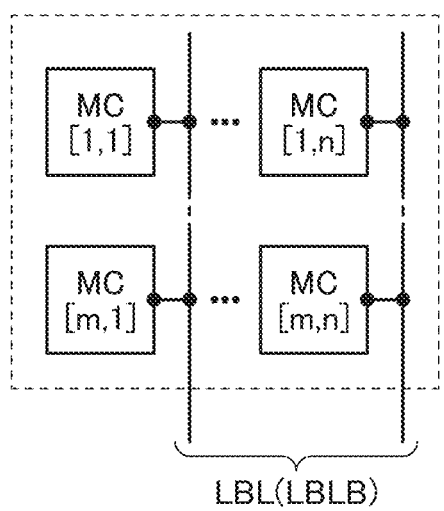

The cell array portion CAP that can be used in one embodiment of the present invention is not limited to having the configuration in FIG. 2A. For example, as in the cell array portion CAP illustrated in FIG. 2B, the cell array portion CAP that can be used in one embodiment of the present invention may employ the configuration of the cell array portion CAP in FIG. 2A not provided with the circuit MCr[1,1] to the circuit MCr[m,n] so that no pair cell is included.

Next, configuration examples of a circuit that can be used as the circuit MC[1,1] to the circuit MC[m,n] and the circuit MCr[1,1] to the circuit MCr[m,n] are described.

FIG. 3A to FIG. 3F are circuit diagrams illustrating the configuration examples of a circuit that can be used as the circuit MC[1,1] to the circuit MC[m,n] and the circuit MCr[1,1] to the circuit MCr[m,n]. In FIG. 3A to FIG. 3F, the identification sign [,] is omitted; the circuit MC[1,1] to the circuit MC[m,n] are referred to as the circuit MC, and the circuit MCr[1,1] to the circuit MCr[m,n] are referred to as the circuit MCr.

Hereinafter, the circuit having any of the configurations illustrated in FIG. 3A to FIG. 3F is described as the circuit MC. Since the circuit MCr can have a configuration similar to that of the circuit MC, the following description of the circuit MC is referred to for the description of the circuit MCr.

In FIG. 3A to FIG. 3F, the circuit MC is electrically connected to the wiring LBL in the case where the memory cell MC is included in the cell array portion CAP, and the circuit MC is electrically connected to the wiring LBLB in the case where the circuit MC is included in the cell array portion CAPB.

Figure 3A:
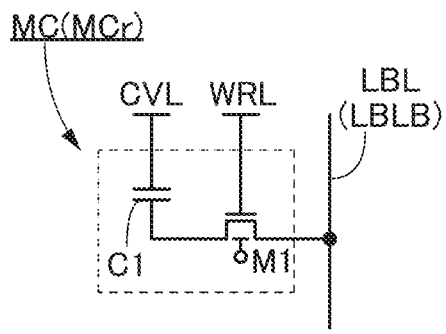
FIG. 3A to FIG. 3H are circuit diagrams each illustrating a configuration example of a circuit included in a semiconductor device.

The circuit MC illustrated in FIG. 3A has a configuration of a memory cell mainly used for a DRAM (Dynamic Random Access Memory) or the like. The circuit MC in FIG. 3A includes a transistor M1 and a capacitor C1, for example. A first terminal of the transistor M1 is electrically connected to a first terminal of the capacitor C1, a second terminal of the transistor M1 is electrically connected to the wiring LBL, and a gate of the transistor M1 is electrically connected to a wiring WRL. A second terminal of the capacitor C1 is electrically connected to a wiring CVL.

The wiring WRL functions as a wiring for supplying a high-level potential or a low-level potential to switch an on state and an off state of the transistor M1. In particular, the wiring WRL functions as a write word line and a read word line in the circuit MC.

The wiring CVL functions as a wiring for supplying a constant voltage. The constant voltage can be a ground potential, a low-level potential, or a high-level potential, for example. Alternatively, the wiring CVL may be supplied with not a constant voltage but a pulse signal, for example.

Data is written to the circuit MC in FIG. 3A in such a manner, for example, that a high-level potential is supplied to the wiring WRL to bring the transistor M1 into an on state, and then a potential corresponding to the data is written from the wiring LBL to the first terminal of the capacitor C1. After that, a low-level potential is supplied to the wiring WRL to bring the transistor M1 into an off state, whereby the potential corresponding to the data can be retained in the first terminal of the capacitor C1 of the circuit MC. Data is read from the circuit MC in FIG. 3A in such a manner, for example, that the wiring LBL is precharged with a low-level potential, then a high-level potential is supplied to the wiring WRL to bring the transistor M1 into an on state, and a read signal corresponding to the data is output from the circuit MC to the wiring LBL.

The transistor M1 is preferably an OS transistor, for example. For a metal oxide included in a channel formation region of the OS transistor, one or more materials selected from indium, an element M (M is aluminum, gallium, yttrium, or tin), and zinc can be used, for example. In particular, a metal oxide containing indium, gallium, and zinc is an intrinsic (also referred to as i-type) or substantially intrinsic semiconductor that has a wide bandgap, and the carrier concentration of the metal oxide is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm 3. The off-state current per micrometer of channel width of the OS transistor including the metal oxide in the channel formation region can be lower than or equal to 10 aA ($1\times10^{-17}$ A), preferably lower than or equal to 1 aA ($1\times10^{-18}$ A), further preferably lower than or equal to 10 zA ($1\times10^{-20}$ A), still further preferably lower than or equal to 1 zA ($1\times10^{-21}$ A), yet further preferably lower than or equal to 100 yA ($1\times10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

Note that the off-state current of an n-channel transistor in this specification and the like can be a leakage current that flows between a source and a drain when a source-gate voltage applied to the transistor is lower than the threshold voltage of the transistor. Furthermore, the off-state current can be a leakage current that flows when the transistor is in an off state.

As described above, an OS transistor has a feature of an extremely low off-state current; thus, when using an OS transistor, the transistor M1 can have a low off-state current compared with the case of using a Si transistor. Thus, a potential written to the first terminal of the capacitor C1 of the circuit MC in FIG. 3A can be retained for a long time.

In addition, the circuit MC using an OS transistor as the transistor M1 can have a configuration of a memory cell used for a memory device called a DOSRAM (Dynamic Oxide Semiconductor Random Access Memory) (registered trademark).

As illustrated in FIG. 3A, the transistor M1 may have a structure with a back gate. Although a portion to which the back gate of the transistor M1 is electrically connected is not illustrated in FIG. 3A, the portion to which the back gate of the transistor M1 is electrically connected may be freely determined in a design stage of the memory device 100. For example, with a configuration in which the gate and the back gate of the transistor M1 are electrically connected to each other, the amount of current flowing through the transistor M1 in an on state can be increased. Furthermore, for example, with a configuration in which the back gate of the transistor M1 is provided with a wiring for electrical connection to an external circuit, the threshold voltage of the transistor M1 can be changed by potential application from the external circuit to the back gate of the transistor M1. The transistor M1 may have a structure without a back gate.

Note that the transistor M1 can be, other than an OS transistor, a transistor containing silicon in a channel formation region (hereinafter referred to as a Si transistor), for example. Single crystal silicon, microcrystalline silicon, polycrystalline silicon, hydrogenated amorphous silicon, or the like can be used as the silicon. The transistor M1 can be, other than an OS transistor and a Si transistor, a transistor containing Ge or the like in an active layer; a transistor containing a compound semiconductor such as ZnSe, CdS, GaAs, InP, GaN, or SiGe in an active layer; a transistor containing a carbon nanotube in an active layer; or a transistor containing an organic semiconductor in an active layer; for example.

The transistor M1 is illustrated as an n-channel transistor in FIG. 3A, but may be a p-channel transistor according to circumstances.

In addition, the transistor M1 can be replaced with another electrical switch. Specifically, an analog switch can be used instead of the transistor M1, for example. Alternatively, a mechanical switch can be used instead of the transistor M1, for example.

Figure 3B:
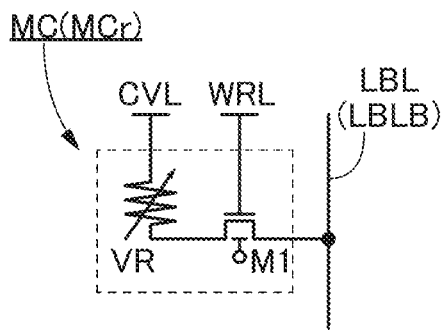
Figure 3C:
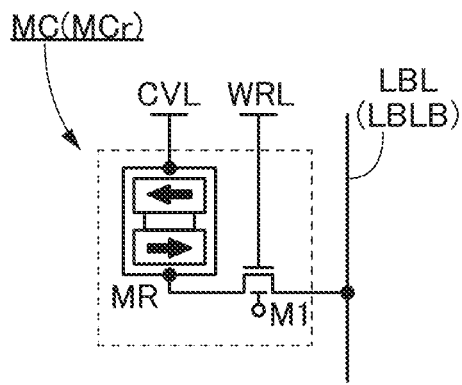

The circuit MC illustrated in FIG. 3B has a configuration in which the capacitor C1 of the circuit MC in FIG. 3A is replaced with a variable resistor VR, which is a configuration of a memory cell mainly used for a ReRAM (Resistive Random Access Memory) or the like. A first terminal of the variable resistor VR is electrically connected to the first terminal of the transistor M1, and a second terminal of the variable resistor VR is electrically connected to the wiring CVL.

The wiring CVL can be a wiring having a function similar to that of the wiring CVL of the circuit MC in FIG. 3A. The wiring CVL may be a wiring having a function of supplying potentials different between the writing operation and reading operation of the circuit MC.

Data is written to the circuit MC in FIG. 3B in such a manner, for example, that a high-level potential is supplied to the wiring WRL to bring the transistor M1 into an on state, and then a potential corresponding to the data is applied from the wiring LBL to the first terminal of the variable resistor VR. Accordingly, the resistance value of the variable resistor VR becomes a value corresponding to the potential. After that, a low-level potential is supplied to the wiring WRL to bring the transistor M1 into an off state, whereby the resistance value corresponding to the potential can be retained in the variable resistor VR of the circuit MC. Data is read from the circuit MC in FIG. 3B in such a manner, for example, that a certain potential is input to the wiring LBL, and then a high-level potential is input to the wiring WRL to bring the transistor M1 into an on state so that a current flows between the wiring CVL and the wiring LBL. Because the amount of the current is determined in accordance with a voltage between the first terminal and the second terminal of the variable resistor VR and the resistance value of the variable resistor VR, the data can be read from the amount of the current.

Figure 3D:
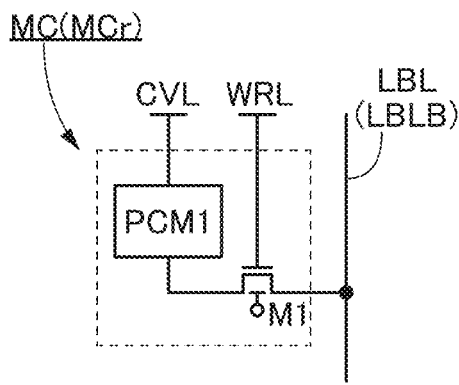

Although the circuit MC in FIG. 3B is described as a configuration example including a variable resistor, the circuit MC may have a configuration in which the variable resistor is replaced with another circuit element. Specifically, as in the circuit MC illustrated in FIG. 3C, the variable resistor VR of the circuit MC in FIG. 3B may be replaced with a circuit MR including an MTJ (magnetic tunnel junction) element, for example. Alternatively, a circuit including a phase-change memory (PCM) can be used instead of a variable resistor or a circuit including an MTJ element. FIG. 3D illustrates the circuit MC in which the variable resistor VR of the circuit MC in FIG. 3B is replaced with a circuit PCM1 including a phase-change memory.

Figure 3E:
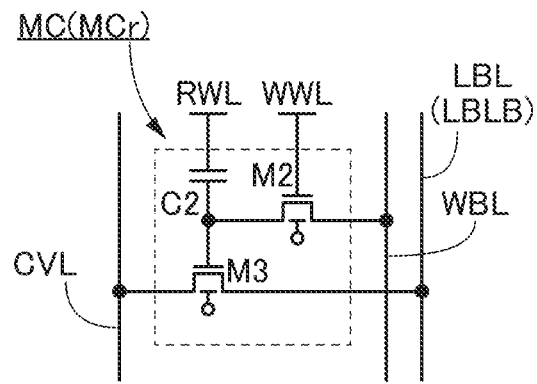

The circuit MC illustrated in FIG. 3E has a configuration of a memory cell mainly used for a NOSRAM (Nonvolatile Oxide Semiconductor Random Access Memory) (registered trademark) or the like. The circuit MC in FIG. 3E includes a transistor M2, a transistor M3, and a capacitor C2, for example. A first terminal of the transistor M2 is electrically connected to a gate of the transistor M3 and a first terminal of the capacitor C2, a second terminal of the transistor M2 is electrically connected to a wiring WBL, and a gate of the transistor M2 is electrically connected to a wiring WWL. A first terminal of the transistor M3 is electrically connected to the wiring LBL, and a second terminal of the transistor M3 is electrically connected to the wiring CVL. A second terminal of the capacitor C2 is electrically connected to a wiring RWL.

As the transistor M2 and the transistor M3, a transistor that can be used as the transistor M1 can be used, for example. In particular, the transistor M2 can be replaced with an electrical switch other than a transistor or a mechanical switch, for example, like the transistor M1.

The wiring WWL functions as a wiring for supplying a high-level potential or a low-level potential to switch an on state and an off state of the transistor M2. In particular, the wiring WWL functions as a write word line in the circuit MC.

The wiring WBL functions as a wiring for supplying a potential corresponding to data to be written to the circuit MC. That is, the wiring WBL functions as a write bit line in the circuit MC.

The wiring CVL functions as a wiring for supplying a constant voltage, as in the circuit MC in FIG. 3A. The constant voltage can be a ground potential, a low-level potential, or a high-level potential, for example.

The wiring RWL functions as a wiring for supplying a high-level potential or a low-level potential. In particular, by changing the potential supplied by the wiring RWL from a high-level potential to a low-level potential or from a low-level potential to a high-level potential when the transistor M2 is in an off state, the gate potential of the transistor M3 can be changed owing to capacitive coupling by the capacitor C2. By changing the gate potential of the transistor M3 in this manner, an on state and an off state of the transistor M3 can be switched. When the transistor M3 is in an on state, a current flowing between the first terminal and the second terminal of the transistor M3 is determined in accordance with a potential supplied from the wiring WBL and written to the first terminal of the capacitor C2; thus, by obtaining the amount of current flowing to the wiring LBL or the potential of the wiring LBL, data written to the circuit MC can be read. Therefore, the wiring RWL functions as a read word line in the circuit MC.

Data is written to the circuit MC in FIG. 3E in such a manner, for example, that a high-level potential is supplied to the wiring WWL to bring the transistor M2 into an on state, a low-level potential is supplied to the wiring RWL, and then a potential corresponding to the data is written from the wiring WBL to the first terminal of the capacitor C2. After that, a low-level potential is supplied to the wiring WWL to bring the transistor M2 into an off state, whereby the potential corresponding to the data can be retained in the capacitor C2 of the circuit MC. Data is read from the circuit MC in FIG. 3E in such a manner, for example, that a high-level potential (for example, VDD here) is supplied to the wiring CVL, the wiring LBL is precharged with a potential lower than VDD (for example, VSS here), the wiring LBL is bought into an electrically floating state, and then a high-level potential is supplied to the wiring RWL. In this case, the transistor M3 is brought into an on state when a source-gate voltage of the transistor M3 becomes higher than the threshold voltage of the transistor M3. When the transistor M3 is in an on state, the potential of the wiring LBL increases until the transistor M3 is brought into an off state. The potential of the wiring LBL when the transistor M3 is brought into an off state is determined in accordance with a potential written to the first terminal of the capacitor C2; thus, data written to the circuit MC can be obtained by reading the potential of the wiring LBL. As a reading method different from the above, for example, a low-level potential (for example, VSS here) may be supplied to the wiring CVL, the wiring LBL may be precharged with a constant voltage higher than VSS (for example, VDD here), and a high-level potential may be supplied to the wiring RWL. In this case, the transistor M3 is brought into an on state when the source-gate voltage of the transistor M3 becomes higher than the threshold voltage of the transistor M3. When the transistor M3 is in an on state, the potential of the wiring LBL decreases until the transistor M3 is brought into an off state. The potential of the wiring LBL when the transistor M3 is brought into an off state is determined in accordance with a potential written to the first terminal of the capacitor C2; thus, data written to the circuit MC can be obtained by reading the potential of the wiring LBL. As a reading method different from the above, for example, a voltage may be applied to the source, drain, and gate of the transistor M3 within the range where the transistor M3 operates in a saturation region. In the case where the transistor M3 operates in a saturation region, a current flowing through the transistor M3 is determined in accordance with the gate-source voltage, and does not much depend on the source-drain voltage. Thus, data written to the circuit MC can be obtained also by reading a current flowing through the transistor M3 when an appropriate voltage is applied to the source, drain, and gate of the transistor M3.

Figure 3F:
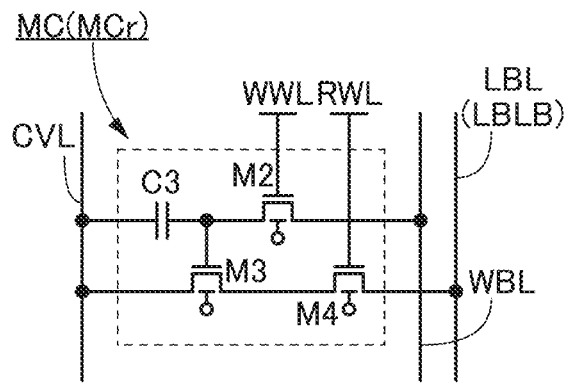

Like the circuit MC in FIG. 3E, the circuit MC illustrated in FIG. 3F has a configuration of a memory cell mainly used for a NOSRAM or the like. The circuit MC in FIG. 3F includes the transistor M2 to a transistor M4 and a capacitor C3, for example. The first terminal of the transistor M2 is electrically connected to the gate of the transistor M3 and a first terminal of the capacitor C3, the second terminal of the transistor M2 is electrically connected to the wiring WBL, and the gate of the transistor M2 is electrically connected to the wiring WWL. The first terminal of the transistor M3 is electrically connected to a first terminal of the transistor M4, and the second terminal of the transistor M3 is electrically connected to the wiring CVL. A second terminal of the transistor M4 is electrically connected to the wiring LBL, and a gate of the transistor M4 is electrically connected to the wiring RWL.

As the transistor M4, a transistor that can be used as the transistor M1 can be used, for example. Like the transistor M1, the transistor M4 can be replaced with an electrical switch other than a transistor or a mechanical switch, for example.

As in the circuit MC in FIG. 3E, the wiring WWL functions as a write word line in the circuit MC in FIG. 3F.

As in the circuit MC in FIG. 3E, the wiring CVL functions as a wiring for supplying a constant voltage. The constant voltage can be a ground potential, a low-level potential, or a high-level potential, for example.

The wiring RWL functions as a wiring for supplying a high-level potential or a low-level potential. Although the wiring RWL is electrically connected to the gate of the transistor M3 through the capacitor C2 in the circuit MC in FIG. 3E, the wiring RWL is electrically connected to the gate of the transistor M4 in the circuit MC in FIG. 3F. That is, the circuit MC in FIG. 3E and the circuit MC in FIG. 3F differ in a means for switching electrical continuity and discontinuity between the wiring CVL and the wiring LBL.

Data is written to the circuit MC in FIG. 3F in such a manner, for example, that a high-level potential is supplied to the wiring WWL to bring the transistor M2 into an on state, and a potential corresponding to the data is written from the wiring WBL to the first terminal of the capacitor C3. After that, a low-level potential is supplied to the wiring WWL to bring the transistor M2 into an off state, whereby the potential corresponding to the data can be retained in the capacitor C3 of the circuit MC. Data is read from the circuit MC in FIG. 3F in such a manner, for example, that a high-level potential (for example, VDD here) is supplied to the wiring CVL, the wiring LBL is precharged with a potential lower than VDD (for example, VSS here), the wiring LBL is bought into an electrically floating state, and then a high-level potential is supplied to the wiring RWL. Accordingly, the transistor M4 is brought into an on state. When the transistor M3 is in an on state, the potential of the wiring LBL increases until the transistor M3 is brought into an off state. The potential of the wiring LBL when the transistor M3 is brought into an off state is determined in accordance with a potential written to the first terminal of the capacitor C3; thus, data written to the circuit MC can be obtained by reading the potential of the wiring LBL. As a reading method different from the above, for example, a low-level potential (for example, VSS here) is supplied to the wiring CVL, the wiring LBL is precharged with a constant voltage higher than VSS (for example, VDD here), and a high-level potential is supplied to the wiring RWL. In this case, the transistor M3 is brought into an on state when the source-gate voltage of the transistor M3 becomes higher than the threshold voltage of the transistor M3. When the transistor M3 and the transistor M4 are each in an on state, the potential of the wiring LBL decreases until the transistor M3 is brought into an off state. The potential of the wiring LBL when the transistor M3 is brought into an off state is determined in accordance with a potential written to the first terminal of the capacitor C3; thus, data written to the circuit MC can be obtained by reading the potential of the wiring LBL. As a reading method different from the above, for example, a voltage may be applied to the source, drain, and gate of the transistor M3 within the range where the transistor M3 operates in a saturation region. In the case where the transistor M3 operates in a saturation region, a current flowing through the transistor M3 is determined in accordance with the gate-source voltage, and does not much depend on the source-drain voltage. Thus, data written to the circuit MC can be obtained also by reading a current flowing through the transistor M3 when an appropriate voltage is applied to the source, drain, and gate of the transistor M3.

Figure 3G:
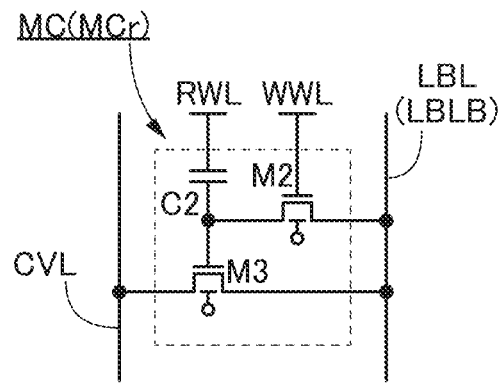
Figure 3H:
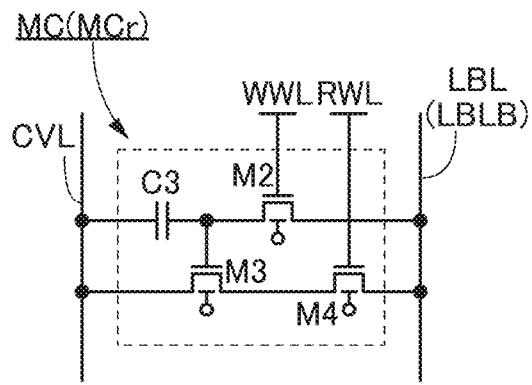

Note that the circuit MC of the memory device of one embodiment of the present invention is not limited to having any of the configurations of the circuits MC in FIG. 3A to FIG. 3F. The circuit MC of the memory device of one embodiment of the present invention may have a configuration changed from that of the circuit MC selected from FIG. 3A to FIG. 3F according to circumstances. For example, as illustrated in FIG. 3G and FIG. 3H, the wiring LBL and the wiring WBL in the circuit MC illustrated in FIG. 3E and FIG. 3F may be combined into one wiring LBL.

<<Reference Cell Portion RFC and Reference Cell Portion RFCB>>

Next, the reference cell portion RFC[1] to the reference cell portion RFC[3] and the reference cell portion RFCB[1] to the reference cell portion RFCB[3] that are included in the memory device 100 in FIG. 1 are described.

Figure 4A:
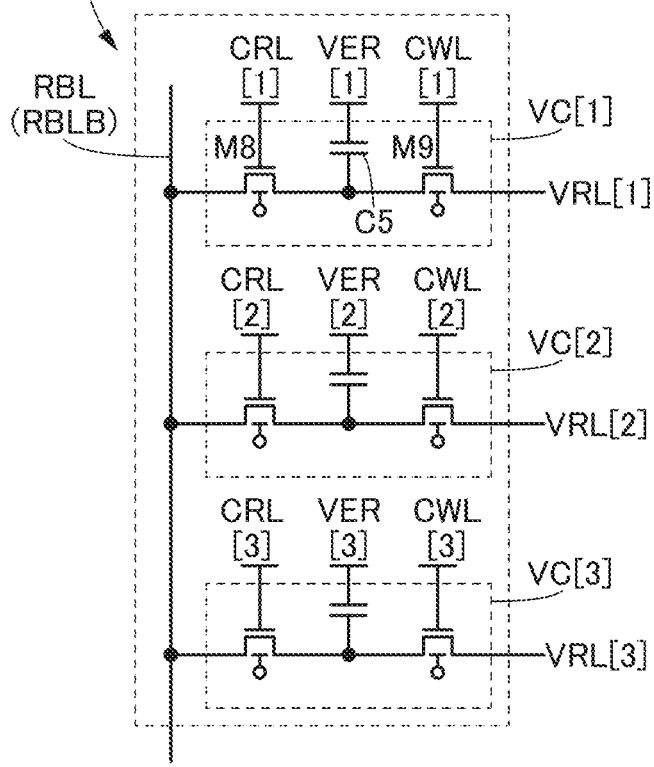
FIG. 4A to FIG. 4C are circuit diagrams of configuration examples of a circuit included in a semiconductor device.

FIG. 4A illustrates a configuration example of a circuit that can be used as the reference cell portion RFC[1] to the reference cell portion RFC[3] and the reference cell portion RFCB[1] to the reference cell portion RFCB[3]. In FIG. 4A, the identification sign [ ] is omitted as in FIG. 2A; the reference cell portion RFC[1] to the reference cell portion RFC[3] are referred to as the reference cell portion RFC, the reference cell portion RFCB[1] to the reference cell portion RFCB[3] are referred to as the reference cell portion RFCB, the wiring RBL[1] to the wiring RBL[3] are referred to as the wiring RBL, and the wiring RBLB[1] to the wiring RBLB[3] are referred to as the wiring RBLB.

Hereinafter, the circuit having the configuration illustrated in FIG. 4A is described as the reference cell portion RFC. Since the reference cell portion RFCB can have a configuration similar to that of the reference cell portion RFC, the following description of the reference cell portion RFC is referred to for the description of the reference cell portion RFCB. In that case, the wiring RBL is replaced with the wiring RBLB in the following description.

The reference cell portion RFC includes a reference cell VC[1] to a reference cell VC[3], for example.

The reference cell VC[1] includes a transistor M8, a transistor M9, and a capacitor C5, for example. A first terminal of the transistor M8 is electrically connected to a first terminal of the capacitor C5 and a second terminal of the transistor M9, a second terminal of the transistor M8 is electrically connected to the wiring RBL, and a gate of the transistor M8 is electrically connected to a wiring CRL[1]. The second terminal of the transistor M9 is electrically connected to a wiring VRL[1], and a gate of the transistor M9 is electrically connected to a wiring CWL[1]. A second terminal of the capacitor C5 is electrically connected to a wiring VER[1].

As each of the transistor M8 and the transistor M9, a transistor that can be used as the transistor M1 can be used, for example. Like the transistor M1, the transistor M8 and the transistor M9 can each be replaced with an electrical switch other than a transistor or a mechanical switch, for example.

The wiring CRL[1] functions as a wiring for supplying a high-level potential or a low-level potential to switch an on state and an off state of the transistor M8.

The wiring CWL[1] functions as a wiring for supplying a high-level potential or a low-level potential to switch an on state and an off state of the transistor M9.

The wiring VER[1] functions as a wiring for supplying a constant voltage. The constant voltage can be a ground potential, a low-level potential, or a high-level potential, for example. Alternatively, the wiring CVL may be supplied with not a constant voltage but a pulse signal, for example.

The wiring VRL[1] functions as a wiring for supplying a constant voltage. The constant voltage can be, for example, a threshold voltage for reading the potentials $V_{00}$, $V_{01}$, $V_{10}$, and $V_{11}$ that represent four-level data retained in the circuit MC of the memory device 100. Here, the wiring VRL[1] is a wiring for supplying a first threshold voltage $V_{th}[1]$ that is a constant voltage, for example. Note that $V_{th}[1]$ is a potential higher than $V_{00}$ and lower than $V_{01}$.

The reference cell VC[1] has a function of retaining the first threshold voltage $V_{th}[1]$. As a method for retaining $V_{th}[1]$ in the reference cell VC[1], for example, a low-level potential is supplied to the wiring CRL[1] to bring the transistor M8 into an off state and a high-level potential is supplied to the wiring CWL[1] to bring the transistor M9 into an on state so that electrical continuity is established between the wiring VRL[1] and the first terminal of the capacitor C5. Accordingly, $V_{th}[1]$ supplied from the wiring VRL[1] can be written to the first terminal of the capacitor C5. After $V_{th}[1]$ is written to the first terminal of the capacitor C5, a low-level potential is supplied to the wiring CWL[1] to bring the transistor M9 into an off state, whereby $V_{th}[1]$ can be retained in the first terminal of the capacitor C5.

In addition, the reference cell VC[1] can supply charge accumulated in the first terminal of the capacitor C5 to the wiring RBL at a predetermined timing. Specifically, for example, after $V_{th}[1]$ is retained in the first terminal of the capacitor C5, a high-level potential is supplied to the wiring CRL[1] at the timing to bring the transistor M8 into an on state. Accordingly, the charge accumulated in the first terminal of the capacitor C5 is supplied to the wiring RBL, whereby the potential of the wiring RBL can be changed.

The reference cell VC[2] and the reference cell VC[3] have a configuration similar to that of the reference cell VC[1] but are connected to different wirings from the reference cell VC[1]. In the reference cell VC[2], a wiring CRL[2] is electrically connected to the gate of the transistor M8, a wiring CWL[2] is electrically connected to the gate of the transistor M9, a wiring VRL[2] is electrically connected to the second terminal of the transistor M9, and a wiring VER[2] is electrically connected to the second terminal of the capacitor C5. In the reference cell VC[3], a wiring CRL[3] is electrically connected to the gate of the transistor M8, a wiring CWL[3] is electrically connected to the gate of the transistor M9, a wiring VRL[3] is electrically connected to the second terminal of the transistor M9, and a wiring VER[3] is electrically connected to the second terminal of the capacitor C5.

The description of the wiring CRL[1] is referred to for the wiring CRL[2] and the wiring CRL[3], the description of the wiring CWL[1] is referred to for the wiring CWL[2] and the wiring CWL[3], and the description of the wiring VER[1] is referred to for the wiring VER[2] and the wiring VER[3].

Like the wiring VRL[1], the wiring VRL[2] functions as a wiring for supplying a threshold voltage for reading the potentials $V_{00}$, $V_{01}$, $V_{10}$, and $V_{11}$ that represent four-level data retained in the circuit MC of the memory device 100, for example. Here, the wiring VRL[2] is a wiring for supplying a second threshold voltage $V_{th}[2]$ that is a constant voltage, for example. The second threshold voltage $V_{th}[2]$ is a potential higher than $V_{01}$ and lower than $V_{10}$.

That is, the reference cell VC[2] can retain $V_{th}$[2] in the first terminal of the capacitor C5 and can supply charge accumulated in the first terminal of the capacitor C5 to the wiring RBL at a predetermined timing to change the potential of the wiring RBL.

Like the wiring VRL[1] and the wiring VRL[2], the wiring VRL[3] functions as a wiring for supplying a threshold voltage for reading the potentials $V_{00}$, $V_{01}$, $V_{10}$, and $V_{11}$ that represent four-level data retained in the circuit MC of the memory device 100, for example. Here, the wiring VRL[3] is a wiring for supplying a third threshold voltage $V_{th}$[3] that is a constant voltage, for example. The third threshold voltage $V_{th}$[3] is a potential higher than $V_{10}$ and lower than $V_{11}$.

That is, the reference cell VC[3] can retain $V_{th}$[3] in the first terminal of the capacitor C5 and can supply charge accumulated in the first terminal of the capacitor C5 to the wiring RBL at a predetermined timing to change the potential of the wiring RBL.

Since the reference cell portion RFC includes the reference cell VC[1] to the reference cell VC[3], the reference cell portion RFC can change a potential of the wiring RBL to a potential corresponding to any one of $V_{th}$[1] to $V_{th}$[3] owing to the functions of the reference cell VC[1] to the reference cell VC[3].

Note that the wiring VRL[1] to the wiring VRL[3] may be wirings for supplying voltages corresponding to the first to third threshold voltages, not wirings for supplying the first to third threshold voltages.

Note that the reference cell portion RFC of the memory device of one embodiment of the present invention is not limited to having the configuration of the reference cell portion RFC in FIG. 4A. The reference cell portion RFC of the memory device of one embodiment of the present invention may have a configuration changed from that of the reference cell portion RFC in FIG. 4A according to circumstances.

Figure 4B:
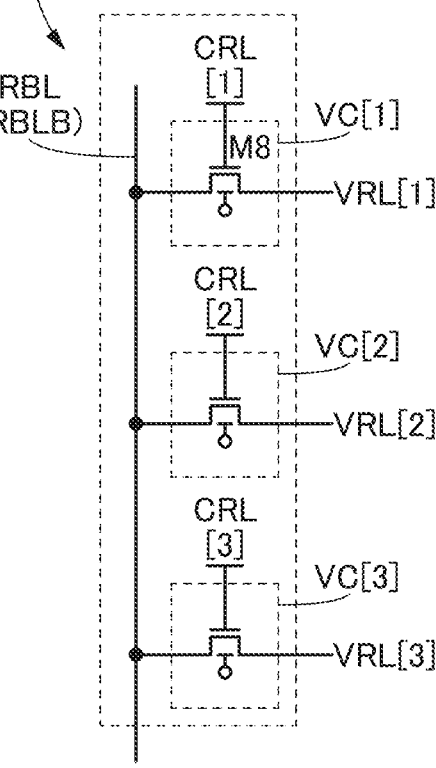

For example, as illustrated in FIG. 4B, a configuration may be employed in which the transistor M9 and the capacitor C5 are not included, which is different from the reference cell portion RFC in FIG. 4A. In the reference cell portion RFC in FIG. 4B, the second terminals of the transistors M8 of the reference cell VC[1] to the reference cell VC[3] are electrically connected to the wiring VRL[1] to the wiring VRL[3], respectively. Thus, in the reference cell portion RFC in FIG. 4B, the potential of the wiring RBL can be any one of $V_{th}$[1] to $V_{th}$[3] by supplying a high-level potential to any one of the wiring CRL[1] to the wiring CRL[3] and supplying a low-level potential to the other two wirings. The reference cell portion RFC in FIG. 4B includes fewer circuit elements than the reference cell portion RFC in FIG. 4A, and thus can have a smaller circuit area.

Figure 4C:
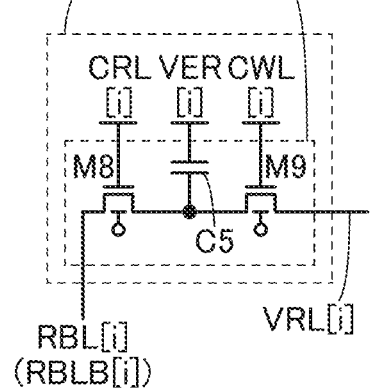

As illustrated in FIG. 4C, the reference cell portion RFC of the memory device of one embodiment of the present invention may have a configuration including a reference cell VC[i](i is an integer greater than or equal to 1 and less than or equal to 3). FIG. 4C illustrates a circuit configuration example of a reference cell portion RFC[i] (a reference cell portion RFCB[i]), and [i] of the reference cell VC[i], a wiring RBL[i], a wiring VRL[i], a wiring CRL[i], a wiring VER[i], and a wiring CWL[i] shown in FIG. 4C can be the same number as [i] of the reference cell portion RFC[i]. For example, when the reference cell portion RFC[i] in FIG. 4C is used as the reference cell portion RFC[1] to the reference cell portion RFC[3] of the memory device 100 in FIG. 1, the potential of the wiring RBL[1] can be changed to a potential corresponding to $V_{th}$[1] because the reference cell portion RFC[1] includes the reference cell VC[1]; the potential of the wiring RBL[2] can be changed to a potential corresponding to $V_{th}$[2] because the reference cell portion RFC[2] includes the reference cell VC[2]; and the potential of the wiring RBL[3] can be changed to a potential corresponding to $V_{th}$[3] because the reference cell portion RFC[3] includes the reference cell VC[3]. In addition, as in FIG. 4B, the reference cell portion RFC[i] in FIG. 4C includes fewer wirings and circuit elements than the reference cell portion RFC in FIG. 4A, and thus can have a smaller circuit area. Moreover, the reference cell portion RFC[i] in FIG. 4C can include fewer wirings than the reference cell portion RFC in FIG. 4A, and thus can have a lower power consumption needed for supplying potentials to the wirings.

<<Circuit RC, Circuit RCR, Circuit RCB, and Circuit RCRB>>

Next, the circuit RC[1] to the circuit RC[3], the circuit RCR[1] to the circuit RCR[3], the circuit RCB[1] to the circuit RCB[3], and the circuit RCRB[1] to the circuit RCRB[3] that are included in the memory device in FIG. 1 are described.

Figure 5A:
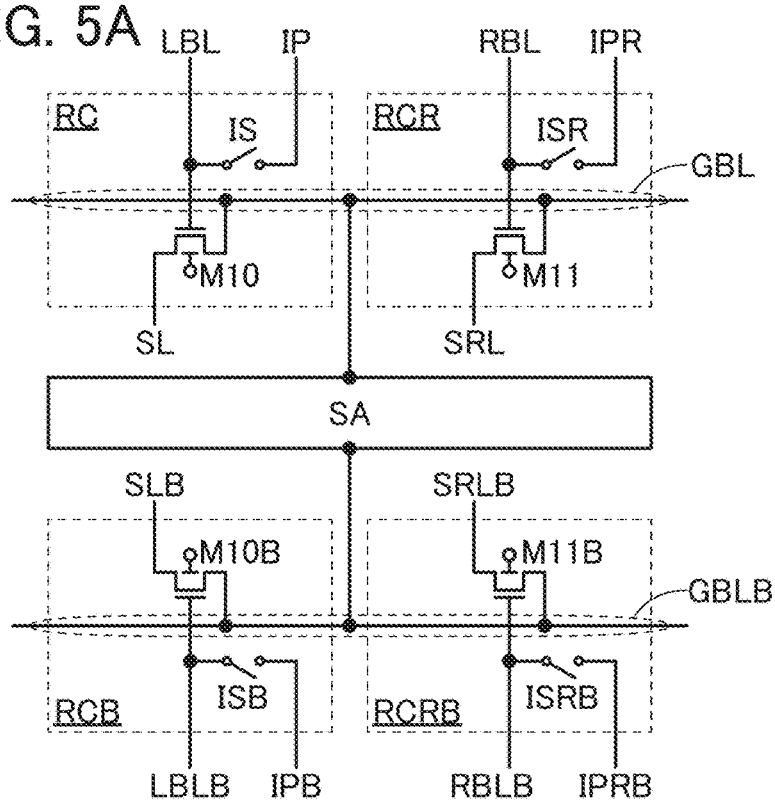
FIG. 5A and FIG. 5B are block diagrams each illustrating a configuration example of a circuit included in a semiconductor device.

FIG. 5A illustrates circuit configurations of the circuit RC, the circuit RCR, the circuit RCB, and the circuit RCRB. FIG. 5A also illustrates the sense amplifier SA to show the electrical connections of the circuit RC, the circuit RCR, the circuit RCB, and the circuit RCRB.

The circuit configurations of the circuit RC, the circuit RCR, the circuit RCB, and the circuit RCRB illustrated in FIG. 5A are examples that can be applied to the circuit RC[1], the circuit RCR[1], the circuit RCB[1], and the circuit RCRB[1] in FIG. 1, respectively. Similarly, the circuit RC, the circuit RCR, the circuit RCB, and the circuit RCRB in FIG. 5A can be used as the circuit RC[2], the circuit RCR[2], the circuit RCB[2], and the circuit RCRB[2] in FIG. 1, respectively. Similarly, the circuit RC, the circuit RCR, the circuit RCB, and the circuit RCRB in FIG. 5A can be used as the circuit RC[3], the circuit RCR[3], the circuit RCB[3], and the circuit RCRB[3] in FIG. 1, respectively. Thus, as in FIG. 2A, the identification sign [ ] is omitted in FIG. 5A; the circuit RC[1] to the circuit RC[3] are referred to as the circuit RC, the circuit RCR[1] to the circuit RCR[3] are referred to as the circuit RCR, the circuit RCB[1] to the circuit RCB[3] are referred to as the circuit RCB, and the circuit RCRB[1] to the circuit RCRB[3] are referred to as the circuit RCRB. In addition, the sense amplifier SA[1] to the sense amplifier SA[3] are referred to as the sense amplifier SA, the wiring LBL[1] to the wiring LBL[3] are referred to as the wiring LBL, the wiring RBL[1] to the wiring RBL[3] are referred to as the wiring RBL, the wiring LBLB[1] to the wiring LBLB[3] are referred to as the wiring LBLB, and the wiring RBLB[1] to the wiring RBLB[3] are referred to as the wiring RBLB.

The circuit RC includes a transistor M10 and a switch IS, for example. A first terminal of the transistor M10 is electrically connected to the wiring GBL, a second terminal of the transistor M10 is electrically connected to a wiring SL, and a gate of the transistor M10 is electrically connected to a first terminal of the switch IS and the wiring LBL. A second terminal of the switch IS is electrically connected to a wiring IP.

The wiring IP functions as a wiring for supplying a constant voltage. The constant voltage can be a ground potential, a low-level potential, or a high-level potential, for example. In particular, the wiring IP functions as a wiring for supplying an initialization potential to the wiring LBL and a wiring for supplying a potential that brings the transistor M10 into an off state. The transistor M10 is illustrated as an n-channel transistor in FIG. 5A, but may be a p-channel transistor. In this case, a constant voltage supplied by the wiring IP is preferably a high-level potential, for example.

The wiring SL functions as a wiring for supplying a constant voltage to the circuit RC. The constant voltage can be a ground potential or a low-level potential, for example.

The circuit RCR includes a transistor M11 and a switch ISR, for example. A first terminal of the transistor M11 is electrically connected to the wiring GBL, a second terminal of the transistor M11 is electrically connected to a wiring SRL, and a gate of the transistor M11 is electrically connected to a first terminal of the switch ISR and the wiring RBL. A second terminal of the switch ISR is electrically connected to a wiring IPR.

Like the wiring IP, the wiring IPR functions as a wiring for supplying a constant voltage such as a ground potential or a low-level potential, for example. In particular, the wiring IPR functions as a wiring for supplying an initialization potential to the wiring RBL and a wiring for supplying a potential that brings the transistor M11 into an off state. The transistor M11 is illustrated as an n-channel transistor in FIG. 5A, but may be a p-channel transistor. In this case, a constant voltage supplied by the wiring IPR is preferably a high-level potential, for example.

The wiring SRL functions as a wiring for supplying a constant voltage to the circuit RCR. The constant voltage can be a ground potential or a low-level potential, for example, like the constant voltage supplied by the wiring SL.

The circuit RC has a function of obtaining, from the wiring LBL, data (for example, a potential here) read from the circuit MC (or the circuit MCr) of the cell array portion CAP, when the switch IS is in an off state. At this time, in the circuit RC, the potential of the wiring LBL corresponding to the data is input to the gate of the transistor M10. In advance, for example, before the potential is input to the gate of the transistor M10, the wiring GBL is precharged with a potential higher than a potential supplied by the wiring SL and the wiring SRL using the sense amplifier SA or the like, whereby the potential of the wiring GBL is finally changed to a potential corresponding to the gate potential of the transistor M10 (a potential corresponding to the data) and the constant voltage supplied by the wiring SL.

In order to initialize the potential of the wiring LBL, the switch IS is brought into an on state so that an initialization potential is supplied from the wiring IP to the wiring LBL. At this time, the transistor M10 is brought into an off state.

That is, the circuit RC in FIG. 5A functions in the case where the circuit MC (the circuit MCr) included in the cell array portion CAP is a circuit that outputs the read data as a potential to the wiring LBL. The circuit MC (the circuit MCr) here can have any of the circuit configurations in FIG. 3A and FIG. 3E to FIG. 3H, for example.

The circuit RCB in FIG. 5A has a configuration similar to that of the circuit RC. Thus, the description of the circuit RC is referred to for the description of the circuit RCB. In the case of the circuit RCB, the transistor M10 is replaced with a transistor M10B, the switch IS is replaced with a switch ISB, the wiring LBL is replaced with the wiring LBLB, the wiring IP is replaced with a wiring IPB, and the wiring SL is replaced with a wiring SLB in the description of the circuit RC.

The circuit RCR has a function of obtaining, from the wiring RBL, data (here, a threshold voltage for reading the potentials $V_{00}$, $V_{01}$, $V_{10}$, and $V_{11}$ that represent four-level data retained in the circuit MC (the circuit MCr)) transmitted from the reference cell portion RFC, when the switch ISR is in an off state. At this time, in the circuit RCR, the potential of the wiring RBL corresponding to the data is input to the gate of the transistor M11. In advance, for example, before the potential is input to the gate of the transistor M11, the wiring GBL is precharged with a potential higher than a potential supplied by the wiring SL and the wiring SRL using the sense amplifier SA or the like, whereby the potential of the wiring GBL is finally changed to a potential corresponding to the gate potential of the transistor M11 (a potential corresponding to the data) and the constant voltage supplied by the wiring SL.

In order to initialize the potential of the wiring RBL, the switch ISR is brought into an on state so that an initialization potential is supplied from the wiring IPR to the wiring RBL. At this time, the transistor M11 is brought into an off state.

The circuit RCRB in FIG. 5A has a configuration similar to that of the circuit RCR. Thus, the description of the circuit RCR is referred to for the description of the circuit RCRB. In the case of the circuit RCRB, the transistor M11 is replaced with a transistor M11B, the switch ISR is replaced with a switch ISRB, the wiring RBL is replaced with the wiring RBLB, the wiring IPR is replaced with a wiring IPRB, the wiring SLR is replaced with a wiring SLRB, and the wiring GBL is replaced with the wiring GBLB in the description of the circuit RCR.

As each of the transistor M10, the transistor M11, the transistor M10B, and the transistor M11B, a transistor that can be used as the transistor M1 can be used, for example. The transistor M10, the transistor M11, the transistor M10B, and the transistor M11B can each be replaced with an electrical switch other than a transistor or a mechanical switch, like the transistor M1.

As each of the switch IS, the switch ISR, the switch ISB, and the switch ISRB, a switch that is similar to the switch SW[1], the switch SW[2], the switch SWB[1], or the switch SWB[2] can be used, for example.

Figure 5B:
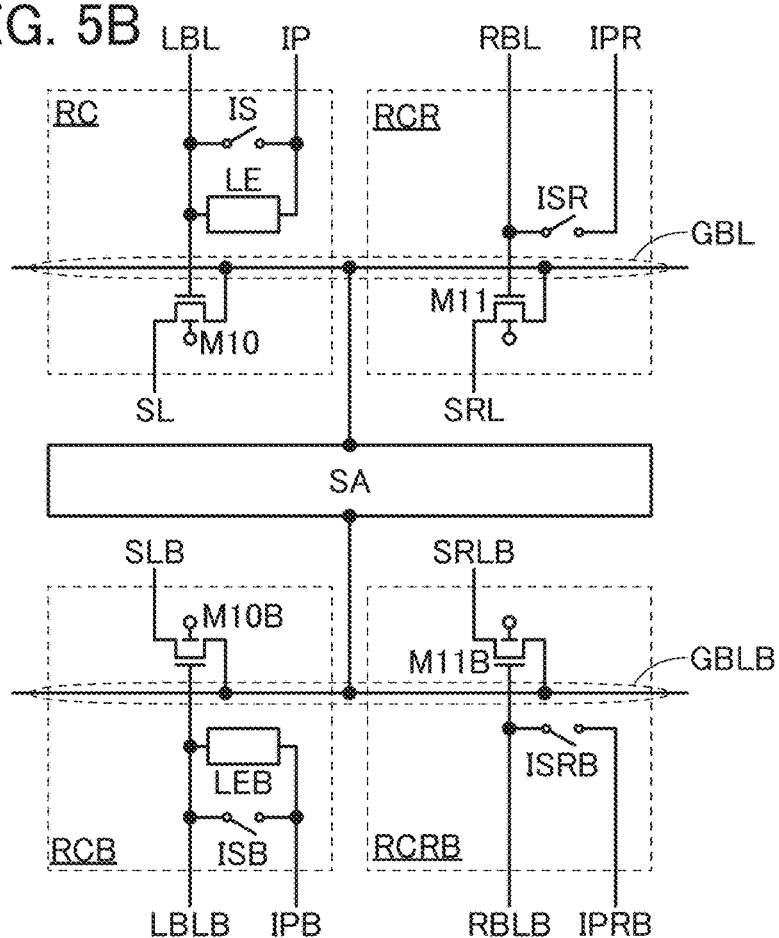

Note that the circuit RC, the circuit RCR, the circuit RCB, and the circuit RCRB of the memory device of one embodiment of the present invention are not limited to the circuit RC, the circuit RCR, the circuit RCB, and the circuit RCRB in FIG. 5A, respectively. The circuit configurations of the circuit RC, the circuit RCR, the circuit RCB, and the circuit RCRB of the memory device of one embodiment of the present invention may be changed according to circumstances. For example, the circuit RC and the circuit RCB can be changed as illustrated in FIG. 5B. The circuit RC in FIG. 5B has a circuit configuration in which a load LE is added to the circuit RC in FIG. 5A, and the circuit RCB in FIG. 5B has a circuit configuration in which a load LEB is added to the circuit RCB in FIG. 5A.

As the load LE and the load LEB, a resistor, a capacitor, or a current-voltage converter circuit can be used, for example.

The circuit RC in FIG. 5B has a function of obtaining, from the wiring LBL, data (for example, a current here) read from the circuit MC (or the circuit MCr) of the cell array portion CAP, when the switch IS is in an off state. At this time, in the circuit RC, the current of the wiring LBL corresponding to the data is converted into a voltage by the load LE. Thus, a potential corresponding to the current and the load LE is input to the gate of the transistor M10. In advance, for example, before the potential is input to the gate of the transistor M10, the wiring GBL is precharged with a potential higher than a potential supplied by the wiring SL and the wiring SRL using the sense amplifier SA or the like, whereby the potential of the wiring GBL is finally changed to a potential corresponding to the gate potential of the transistor M10 (a potential corresponding to the data) and the constant voltage supplied by the wiring SL.

In order to initialize the potential of the wiring LBL, the switch IS is brought into an on state so that an initialization potential is supplied from the wiring IP to the wiring LBL, as in FIG. 5A. At this time, the transistor M10 is brought into an off state.

That is, the circuit RC in FIG. 5B functions in the case where the circuit MC (the circuit MCr) included in the cell array portion CAP is a circuit that outputs the read data as a current. The circuit MC (the circuit MCr) here can have any of the circuit configurations in FIG. 3B to FIG. 3H, for example.

Figure 6A:
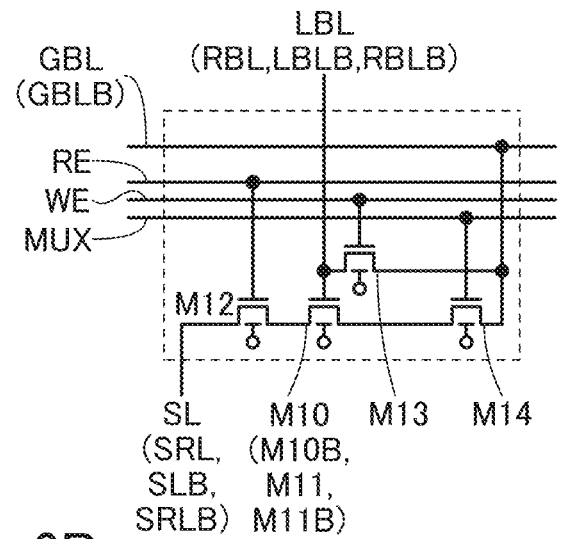
FIG. 6A and FIG. 6B are circuit diagrams of configuration examples of a circuit included in a semiconductor device.

The circuit RC, the circuit RCR, the circuit RCB, and the circuit RCRB in FIG. 5A can be changed as illustrated in FIG. 6A, for example. Note that in FIG. 6A, reference numerals that differ among the circuit RC, the circuit RCR, the circuit RCB, and the circuit RCRB are shown in brackets.

The circuit RC (the circuit RCR, the circuit RCB, or the circuit RCRB) in FIG. 6A includes the transistor M10 (the transistor M10B, the transistor M11, or the transistor M11B) and a transistor M12 to a transistor M14. Depending on the case, the transistor M14 is not necessarily provided in the circuit RC (the circuit RCR, the circuit RCB, or the circuit RCRB), for example.

A first terminal of the transistor M12 is electrically connected to the wiring SL (the wiring SLR, the wiring SLB, or the wiring SRLB), a second terminal of the transistor M12 is electrically connected to the first terminal of the transistor M10 (the transistor M10B, the transistor M11, or the transistor M11B), and a gate of the transistor M12 is electrically connected to a wiring RE. The second terminal of the transistor M10 (the transistor M10B, the transistor M11, or the transistor M11B) is electrically connected to the first terminal of the transistor M14, and the gate of the transistor M10 (the transistor M10B, the transistor M11, or the transistor M11B) is electrically connected to a first terminal of the transistor M13 and the wiring LBL (the wiring RBL, the wiring LBLB, or the wiring RBLB). A gate of the transistor M13 is electrically connected to a wiring WE. A second terminal of the transistor M14 is electrically connected to a second terminal of the transistor M13 and the wiring GBL (the wiring GBLB), and a gate of the transistor M14 is electrically connected to a wiring MUX.

When a high-level potential is input to the wiring WE to bring the transistor M13 into an on state in the circuit in FIG. 6A, electrical continuity can be established between the wiring LBL (the wiring RBL, the wiring LBLB, or the wiring RBLB) and the wiring GBL (the wiring GBLB). In this case, when the sense amplifier SA equalizes the potentials of the wiring GBL and the wiring GBLB, for example, the wiring LBL can be precharged with an equalization potential (e.g., $V_{INI}$ to be described later) from the wiring GBL through the transistor M14 and the transistor M13. That is, the circuit in FIG. 6A has a configuration in which the wiring GBL (the wiring GBLB) serves as the wiring IP, the wiring IPR, the wiring IPB, and the wiring IPRB for supplying an initialization potential, which are described with reference to FIG. 5A and FIG. 5B. In addition, when data is damaged by reading at the time of data reading in the circuit MC in FIG. 3A, the potential of the wiring GBL (the wiring GBLB) amplified by the sense amplifier SA can be written back to the circuit MC as the original data, by bringing the transistor M14 into an on state.

Figure 6B:
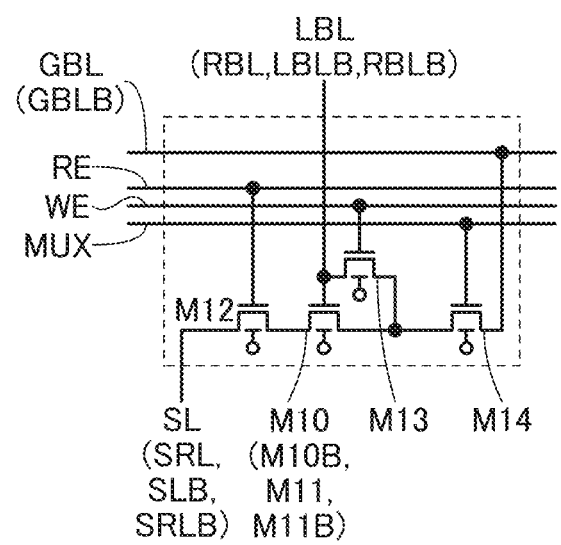

The circuit RC, the circuit RCR, the circuit RCB, and the circuit RCRB in FIG. 5A can be changed as illustrated in FIG. 6B. Note that in FIG. 6B, reference numerals that differ among the circuit RC, the circuit RCR, the circuit RCB, and the circuit RCRB are shown in brackets, as in FIG. 4A.

As in FIG. 4A, the circuit RC (the circuit RCR, the circuit RCB, or the circuit RCRB) in FIG. 6B includes the transistor M10 (the transistor M10B, the transistor M11, or the transistor M11B) and the transistor M12 to the transistor M14.

The circuit RC (the circuit RCR, the circuit RCB, or the circuit RCRB) in FIG. 6B has a configuration in which a portion to which the second terminal of the transistor M13 is electrically connected in FIG. 6A is changed from the second terminal of the transistor M14 (the wiring GBL) to the second terminal of the transistor M10 (the transistor M10B, the transistor M11, or the transistor M11B) (the first terminal of the transistor M14).

Next, an operation example of the circuit RC, the circuit RCR, the circuit RCB, and the circuit RCRB in FIG. 6B is described. Note that the circuit in FIG. 6B is described as the circuit RC below, for example.

First, a high-level potential is input to the wiring WE and the wiring MUX, and a low-level potential is input to the wiring RE. Accordingly, the transistor M13 and the transistor M14 are brought into an on state and the transistor M12 is brought into an off state. At this time, the wiring GBL and the wiring LBL are each precharged with a predetermined potential. For example, the sense amplifier SA can perform equalization to precharge the wiring LBL with an equalization potential (e.g., $V_{INI}$ to be described later) from the wiring GBL through the transistor M14 and the transistor M13.

After that, a low-level potential is input to the wiring MUX and a high-level potential is input to the wiring RE. Accordingly, the transistor M14 is brought into an off state and the transistor M12 is brought into an on state. Here, a potential supplied by the wiring SL is VSS that is a low-level potential, the gate potential of the transistor M10 is VG, and the threshold voltage of the transistor M10 is VTH. In this case, the gate-source voltage of the transistor M10 is VG-VSS, and VG-VSS is a voltage higher than VTH. Since there is electrical continuity between the wiring LBL and the wiring SL through the transistor M13, the transistor M10, and the transistor M12, the potential of the wiring LBL decreases with time. Specifically, the transistor M10 is brought into an off state when the gate-source voltage VG-VSS becomes equal to VTH in the transistor M10, and thus the gate potential decreases until the transistor M10 is brought into an off state. That is, when the transistor M10 is brought into an off state, the gate potential of the transistor M10 is VTH+VSS.

Then, a low-level potential is input to the wiring RE and a low-level potential is input to the wiring WE. Accordingly, the transistor M12 and the transistor M13 are brought into an off state. Through the above operation, variations in the threshold voltage of the transistor M10 can be corrected. Correcting the variations in the threshold voltage of the transistor M10 enables accurate reading of data retained in the circuit MC.

<<Sense Amplifier SA>>

The sense amplifier SA in FIG. 5A and FIG. 5B has a function of comparing a potential of the wiring GBL and a potential of the wiring GBLB, and changing one of the potential of the wiring GBL and the potential of the wiring GBLB to a high-level potential and changing the other of the potential of the wiring GBL and the potential of the wiring GBLB to a low-level potential, on the basis of the comparison result. The sense amplifier SA also has a function of equalizing the wiring GBL and the wiring GBLB to a predetermined potential. Note that, as an operation before reading data from the cell array portion CAP (the cell array portion CAPB) by the circuit RC or the circuit RCB, the wiring GBL and the wiring GBLB may be precharged with a predetermined potential using the equalizing function. Similarly, as an operation before reading a potential corresponding to the threshold voltage from the reference cell portion RFC (the reference cell portion RFCB) by the circuit RCR or the circuit RCRB, the wiring GBL and the wiring GBLB may be precharged with a predetermined potential using the equalizing function. The driving timing of the sense simplifier SA can be determined as appropriate in accordance with the operation of the memory device 100.

Figure 7:
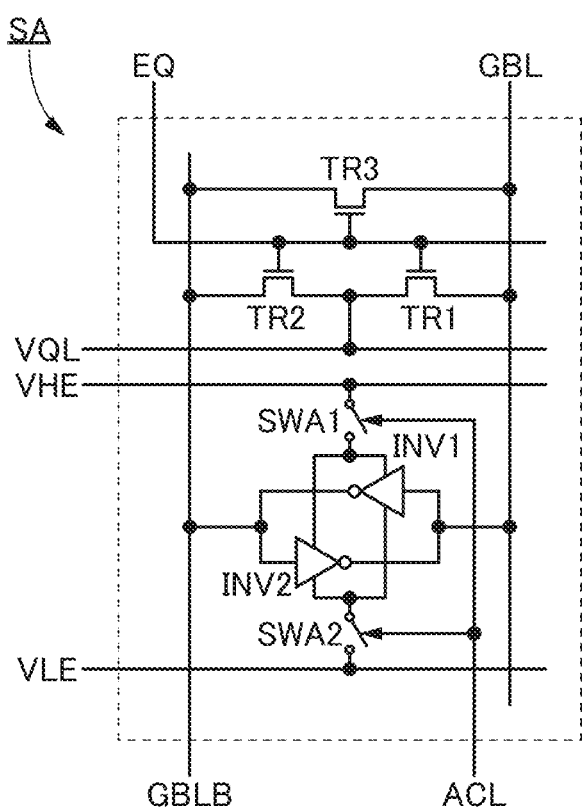
FIG. 7 is a circuit diagram illustrating a configuration example of a circuit included in a semiconductor device.

The sense amplifier SA can have a circuit configuration illustrated in FIG. 7, for example. FIG. 7 also illustrates the wiring GBL and the wiring GBLB to show their electrical connection to the sense simplifier SA.

The sense amplifier SA in FIG. 7 includes a transistor TR1 to a transistor TR3, an inverter circuit INV1, an inverter circuit INV2, a switch SWA1, and a switch SWA2. Note that the switch SWA1 and the switch SWA2 can each be a switch that is brought into an on state when a high-level potential is input to a control terminal and brought into an off state when a low-level potential is input to the control terminal.

The transistor TR1 to the transistor TR3 are configured to function as an equalizer. Specifically, when a high-level potential is supplied to a wiring EQ, the transistor TR1 to the transistor TR3 are each brought into an on state, and accordingly the potentials of the wiring GBL and the wiring GBLB can be equalized. At this time, a wiring VQL functions as a wiring for supplying a potential to the wiring GBL and the wiring GBLB in equalizing the potentials of the wiring GBL and the wiring GBLB.

A first terminal of the transistor TR1 is electrically connected to the wiring GBL, and a first terminal of the transistor TR2 is electrically connected to the wiring GBLB. A second terminal of the transistor TR1 is electrically connected to a second terminal of the transistor TR2 and the wiring VQL, and a gate of the transistor TR1 is electrically connected to a gate of the transistor TR2, a gate of the transistor TR3, and the wiring EQ. A first terminal of the transistor TR3 is electrically connected to the wiring GBL, and a second terminal of the transistor TR3 is electrically connected to the wiring GBLB.

An input terminal of the inverter circuit INV1 is electrically connected to an output terminal of the inverter circuit INV2 and the wiring GBL, and an input terminal of the inverter circuit INV2 is electrically connected to an output terminal of the inverter circuit INV1 and the wiring GBLB. A first terminal of the switch SWA1 is electrically connected to a high potential input terminal of the inverter circuit INV1 and a high potential input terminal of the inverter circuit INV2, and a second terminal of the switch SWA1 is electrically connected to a wiring VHE. A first terminal of the switch SWA2 is electrically connected to a low potential input terminal of the inverter circuit INV1 and a low potential input terminal of the inverter circuit INV2, and a second terminal of the switch SWA2 is electrically connected to a wiring VLE. The control terminal of the switch SWA1 and the control terminal of the switch SWA2 are electrically connected to a wiring ACL.

The wiring VHE functions as a power supply line for supplying a high-level potential to the inverter circuit INV1 and the inverter circuit INV2, and the wiring VLE functions as a power supply line for supplying a low-level potential to the inverter circuit INV1 and the inverter circuit INV2. The wiring ACL functions as a wiring for transmitting a signal for switching an on state and an off state of the switch SWA1 and the switch SWA2.

In FIG. 7, the sense amplifier SA can be activated by supplying a high-level potential to the wiring ACL to bring the switch SWA1 and the switch SWA2 into an on state so that a high-level potential from the wiring VHE and a low-level potential from the wiring VLE are supplied to the inverter circuit INV1 and the inverter circuit INV2. Similarly, the sense amplifier SA can be inactivated by supplying a low-level potential to the wiring ACL to bring the switch SWA1 and the switch SWA2 into an off state so that power supply from the wiring VHE and the wiring VLE to the inverter circuit INV1 and the inverter circuit INV2 is stopped.

Note that the transistor TR1 to the transistor TR3 included in the sense amplifier SA and transistors included in the inverter circuit INV1 and the inverter circuit INV2 can each be a transistor that can be used as the transistor M1, for example. In particular, the transistor TR1 to the transistor TR3 included in the sense amplifier SA and the transistors included in the inverter circuit INV1 and the inverter circuit INV2 are preferably Si transistors. Since a Si transistor has high field-effect mobility and high reliability, it is particularly preferable to use a Si transistor in the circuit configuration of the sense amplifier SA.

Note that the sense amplifier SA of the memory device of one embodiment of the present invention is not limited to the sense amplifier SA in FIG. 7. The sense amplifier of the memory device of one embodiment of the present invention may have a circuit configuration changed from the configuration of the sense amplifier SA in FIG. 7, according to circumstances.

<Operation Example>

Here, an operation example of the memory device of one embodiment of the present invention is described. The memory device is a memory device 100A illustrated in FIG. 8, for example.

Figure 8:
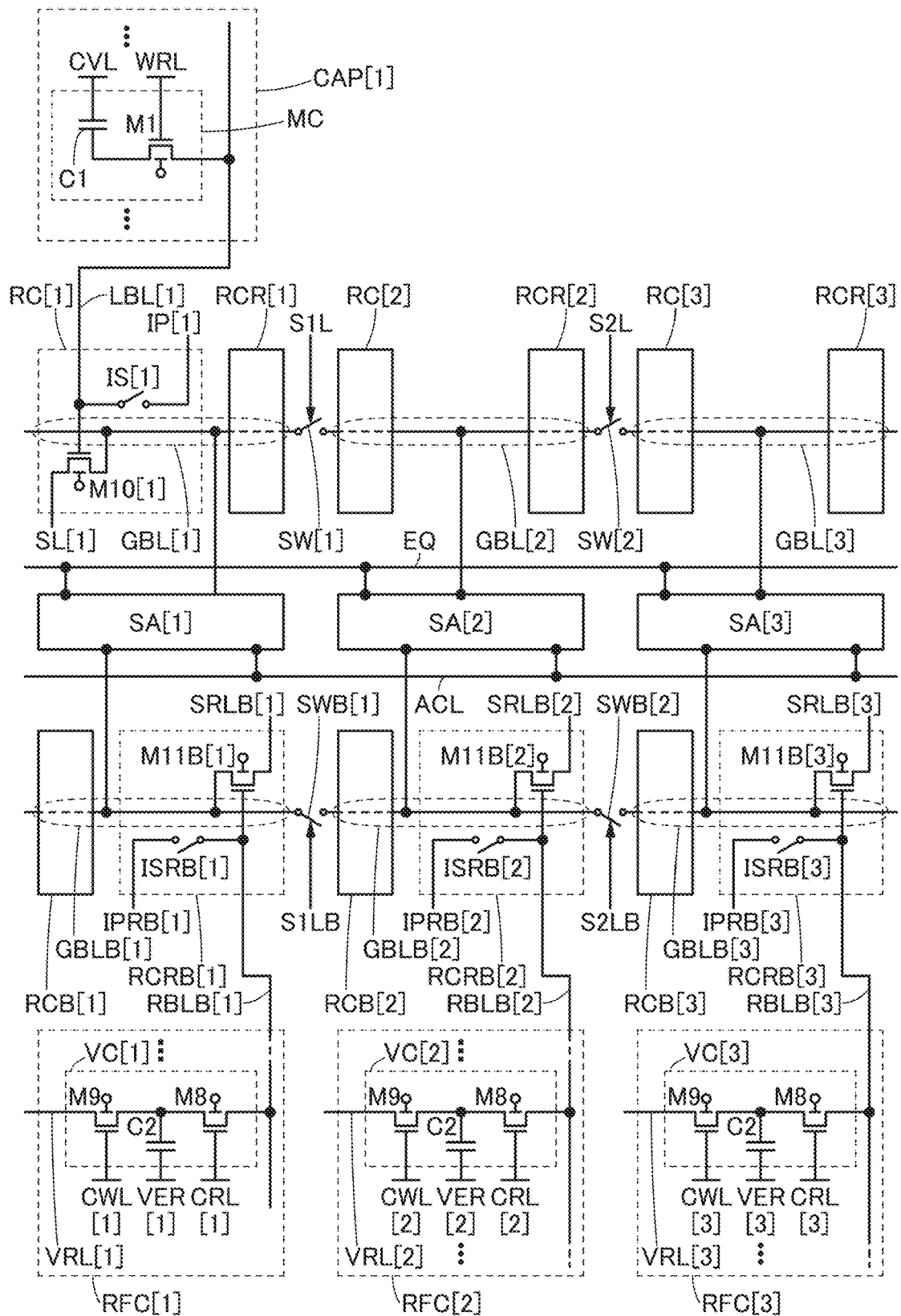
FIG. 8 is a block diagram illustrating a configuration example of a semiconductor device.

The memory device 100A illustrated in FIG. 8 has a configuration of the memory device 100 in FIG. 1 in which the circuit MC in FIG. 3A is used as the circuit MC included in the cell array portion CAP[1], the reference cell portion RFC in FIG. 4A is used as the reference cell portion RFC[1] to the reference cell portion RFC[3], the circuit RC in FIG. 5A is used as the circuit RC[1], and the circuit RCRB in FIG. 5A is used as the circuit RCRB[1] to the circuit RCRB[3].

In FIG. 8, the identification sign [ ] is added to the reference numerals of the circuits and the wirings illustrated in the circuit RC[1] and the circuit RCRB[1] to the circuit RCRB[3].

FIG. 8 also illustrates a wiring S1L, a wiring S2L, a wiring S1LB, and a wiring S2LB that are electrically connected to the control terminals of the switch SW[1], the switch SW[2], the switch SWB[1], and the switch SWB[2], respectively. Each of the switch SW[1], the switch SW[2], the switch SWB[1], and the switch SWB[2] is brought into an on state when a high-level potential is input to the control terminal, and brought into an off state when a low-level potential is input to the control terminal.

FIG. 8 also illustrates the wiring EQ and the wiring ACL. The wiring EQ is electrically connected to the sense amplifier SA[1] to the sense amplifier SA[3], and the wiring ACL is electrically connected to the sense amplifier SA[1] to the sense amplifier SA[3].

As the sense amplifier SA[1] to the sense amplifier SA[3] illustrated in FIG. 8, the sense amplifier in FIG. 7 is used. That is, the wiring EQ functions as a wiring for transmitting a signal that enables or disables equalization. In this operation example, the sense amplifier SA[1] to the sense amplifier SA[3] perform equalization when a high-level potential is input to the wiring EQ, and the sense amplifier SA[1] to the sense amplifier SA[3] stop equalization when a low-level potential is input to the wiring EQ.

The wiring ACL functions as a wiring for transmitting a signal that activates or inactivates the sense amplifier SA[1] to the sense amplifier SA[3]. In this operation example, the sense amplifier SA[1] to the sense amplifier SA[3] are activated when a high-level potential is input to the wiring ACL, and the sense amplifier SA[1] to the sense amplifier SA[3] are inactivated when a low-level potential is input to the wiring ACL.

In FIG. 8, the circuit configurations of the circuit RC[2], the circuit RC[3], the circuit RCR[1] to the circuit RCR[3], and the circuit RCB[1] to the circuit RCB[3] are not illustrated.

In addition, only the reference cell VC[1] is illustrated in the reference cell portion RFC[1], only the reference cell VC[2] is illustrated in the reference cell portion RFC[2], and only the reference cell VC[3] is illustrated in the reference cell portion RFC[3].

The circuit RC[2] and the circuit RC[3] can have a circuit configuration similar to that of the circuit RC[1], for example; however, in this operation example, no current is supplied to the wiring GBL[2] and no current is released from the wiring GBL[2] in the circuit RC[2], and no current is supplied to the wiring GBL[3] and no current is released from the wiring GBL[3] in the circuit RC[3]. Similarly, the circuit RCB[1] to the circuit RCB[3] can have a circuit configuration similar to that of the circuit RC[1]; however, in this operation example, no current is supplied to the wiring GBLB[1] and no current is released from the wiring GBLB[1] in the circuit RCB[1], no current is supplied to the wiring GBLB[2] and no current is released from the wiring GBLB[2] in the circuit RCB[2], and no current is supplied to the wiring GBLB[3] and no current is released from the wiring GBLB[3] in the circuit RCB[3].

The circuit RCR[1] to the circuit RCR[3] can have a circuit configuration similar to those of the circuits RCRB[1] to RCRB[3], for example; however, in this operation example, no current is supplied to the wiring GBL[1] and no current is released from the wiring GBL[1] in the circuit RCR[1], no current is supplied to the wiring GBL[2] and no current is released from the wiring GBL[2] in the circuit RCR[2], and no current is supplied to the wiring GBL[3] and no current is released from the wiring GBL[3] in the circuit RCR[3].

Figure 9:
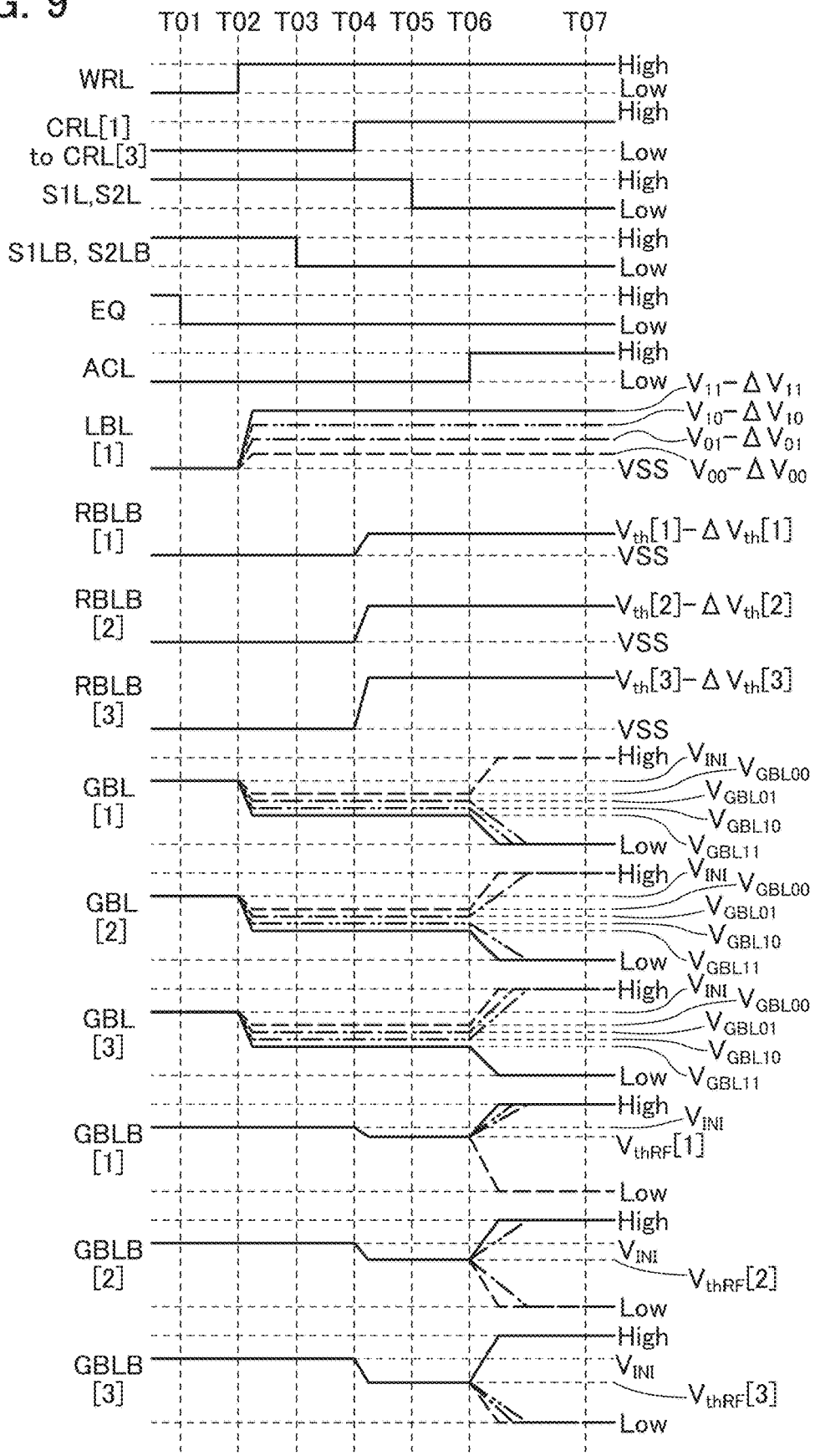
FIG. 9 is a timing chart showing an operation example of a semiconductor device.

FIG. 9 is a timing chart showing the operation example of the memory device 100A. The timing chart in FIG. 9 shows changes in the potentials of the wiring WRL, the wiring CRL[1] to the wiring CRL[3], the wiring S1L, the wiring S2L, the wiring S1LB, the wiring S2LB, the wiring EQ, the wiring ACL, the wiring LBL[1], the wiring RBLB[1], the wiring RBLB[2], the wiring RBLB[3], the wiring GBL[1], the wiring GBL[2], the wiring GBL[3], the wiring GBLB[1], the wiring GBLB[2], and the wiring GBLB[3] from Time T01 to Time T07 and around the period. Note that "high" shown in FIG. 9 denotes a high-level potential and "low" denotes a low-level potential. The potentials of the wiring CRL[1] to the wiring CRL[3] change at the same timing in the same manner in this operation example, and thus the wirings are collectively shown in the timing chart in FIG. 9. Similarly, a set of the wiring S1L and the wiring S2L and a set of the wiring S1LB and the wiring S2LB are each collectively shown.

In this operation example, the constant voltages supplied by the wiring CVL, the wiring IP[1], the wiring IPRB[1] to the wiring IPRB[3], and the wiring VER[1] to the wiring VER[3] are each VSS. The constant voltage supplied by the wiring VRL[1] is the first threshold voltage $V_{th}[1]$, the constant voltage supplied by the wiring VRL[2] is the second threshold voltage $V_{th}[2]$, and the constant voltage supplied by the wiring VRL[3] is the third threshold voltage $V_{th}[3]$. The constant voltages supplied by the wiring SL[1] and the wiring SRLB[1] to the wiring SRLB[3] are each VSS.

At time before Time T01, any one of the potentials $V_{00}$, $V_{01}$, $V_{10}$, and $V_{11}$ is stored as four-level data in the circuit MC in advance. Thus, a low-level potential is input to the wiring WRL, the transistor M1 is in an off state, and any one of the potentials $V_{00}$, $V_{01}$, $V_{10}$, and $V_{11}$ is retained in the first terminal of the capacitor C1 of the circuit MC.

At time before Time T01, $V_{th}[1]$ to $V_{th}[3]$ are retained respectively in the reference cell VC[1] to the reference cell VC[3] in advance. Specifically, in the reference cell portion RFC[1], a high-level potential is input to the wiring CWL[1] to bring the transistor M9 into an on state, so that $V_{th}[1]$ is supplied from the wiring VRL[1] to the first terminal of the capacitor C2. Similarly, in the reference cell portion RFC[2], a high-level potential is input to the wiring CWL[2] to bring the transistor M9 into an on state, so that $V_{th}[2]$ is supplied from the wiring VRL[2] to the first terminal of the capacitor C2. In the reference cell portion RFC[3], a high-level potential is input to the wiring CWL[3] to bring the transistor M9 into an on state, so that $V_{th}[3]$ is supplied from the wiring VRL[3] to the first terminal of the capacitor C2. After $V_{th}[1]$ to $V_{th}[3]$ are written respectively to the reference cell VC[1] to the reference cell VC[3], low-level potentials are input to the wiring CWL[1] to the wiring CWL[3] to bring the transistors M9 in the reference cell VC[1] to the reference cell VC[3] into an off state, so that $V_{th}[1]$ to $V_{th}[3]$ can be retained in the first terminals of the capacitors C2 of the reference cell VC[1] to the reference cell VC[3].

At time before Time T01, the wiring LBL[1] and the wiring RBLB[1] to the wiring RBLB[3] are precharged with VSS that is an initialization potential. Specifically, the switch IS[1] is brought into an on state so that VSS is supplied from the wiring IP[1] to the wiring LBL[1], and the switch ISRB[1] to the switch ISRB[3] are each brought into an on state so that VSS is supplied from the wiring IPRB[1] to the wiring IPRB[3] respectively to the wiring RBLB[1] to the wiring RBLB[3]. After VSS is supplied to the wiring LBL[1] and the wiring RBLB[1] to the wiring RBLB[3], the switch IS[1] and the switch ISRB[1] to the switch ISRB[3] are each brought into an off state to bring the wiring LBL[1] and the wiring RBLB[1] to the wiring RBLB[3] into an electrically floating state.

In addition, the wiring LBL[1] and the wiring RBLB[1] to the wiring RBLB[3] are precharged with VSS, and accordingly the transistor M10[1] and the transistor M11B[1] to the transistor M11B[3] are brought into an off state.

At time before Time T01, a high-level potential is input to the wiring S1L, the wiring S2L, the wiring S1LB, and the wiring S2LB. Thus, the switch SW[1], the switch SW[2], the switch SWB[1], and the switch SWB[2] are each brought into an on state. Accordingly, the potentials of the wiring GBL[1] to the wiring GBL[3] become equal to each other, and potentials of the wiring GBLB[1] to the wiring GBLB[3] also become equal to each other.

Furthermore, at time before Time T01, a high-level potential is input to the wiring EQ and a low-level potential is input to the wiring ACL. Thus, the sense amplifier SA[1] to the sense amplifier SA[3] are inactivated, and the sense amplifier SA[1] to the sense amplifier SA[3] perform equalization. Specifically, the sense amplifier SA[1] to the sense amplifier SA[3] perform equalization on a set of the wiring GBL[1] and the wiring GBLB[1], a set of the wiring GBL[2] and the wiring GBLB[2], and a set of the wiring GBL[3] and the wiring GBLB[3] so that the potentials of the wiring GBL[1] to the wiring GBL[3] and the wiring GBLB[1] to the wiring GBLB[3] are set to $V_{INI}$. Note that $V_{INI}$ is a potential higher than VSS.

From Time T01 to Time T02, the potential of the wiring EQ changes from a high-level potential to a low-level potential. Accordingly, the sense amplifier SA[1] to the sense amplifier SA[3] stop equalization. Thus, supply of the potential $V_{INI}$ from the sense amplifier SA[1] to the wiring GBL[1] and the wiring GBLB[1] stops, supply of the potential Vm1 from the sense amplifier SA[2] to the wiring GBL[2] and the wiring GBLB[2] stops, and supply of the potential $V_{INI}$ from the sense amplifier SA[3] to the wiring GBL[3] and the wiring GBLB[3] stops.

From Time T02 to Time T03, a high-level potential is input to the wiring WRL. Accordingly, electrical continuity is established between the first terminal of the capacitor C1 of the circuit MC and the wiring LBL[1], so that a read signal corresponding to the potential retained in the circuit MC is output from the circuit MC to the wiring LBL[1]. Specifically, the potential of the first terminal of the capacitor C1 of the circuit MC and the potential of the wiring LBL[1] change. The amount of change in the potential varies depending on the potential $V_{00}$, $V_{01}$, $V_{10}$, or $V_{11}$ retained in the first terminal of the capacitor C1 of the circuit MC. When the potential retained in the first terminal of the capacitor C1 of the circuit MC is any one of $V_{00}$, $V_{01}$, $V_{10}$, and $V_{11}$, the potential of the first terminal of the capacitor C1 of the circuit MC after being changed and the potential of the wiring LBL[1] after being changed are each denoted by $V_{00}-\Delta V_{00}$, $V_{01}-\Delta V_{01}$, $V_{10}-\Delta V_{10}$, or $V_{11}-\Delta V_{11}$. FIG. 9 shows changes in the potentials of the wiring LBL[1] for the case where the potentials retained in the first terminal of the capacitor C1 of the circuit MC are $V_{00}$, $V_{01}$, $V_{10}$, and $V_{11}$. Specifically, as for the wiring LBL[1] in the timing chart in FIG. 9, the change in the potential of the wiring LBL[1] when the potential retained in the first terminal of the capacitor C1 of the circuit MC is $V_{11}$ is indicated by a thick solid line; the change in the potential of the wiring LBL[1] when the potential retained in the first terminal of the capacitor C1 of the circuit MC is $V_{10}$ is indicated by a thick dashed double-dotted line; the change in the potential of the wiring LBL[1] when the potential retained in the first terminal of the capacitor C1 of the circuit MC is $V_{01}$ is indicated by a thick dashed-dotted line; and the change in the potential of the wiring LBL[1] when the potential retained in the first terminal of the capacitor C1 of the circuit MC is $V_{00}$ is indicated by a thick dashed line. Note that each of $\Delta V_{00}$, $\Delta V_{01}$, $\Delta V_{10}$, and $\Delta V_{11}$ denotes the amount of change in the potential that is determined in accordance with parasitic resistance, parasitic capacitance, or the like around the wiring LBL[1].

At this time, the potentials $V_{INI}$ of the wiring GBL[1] to the wiring GBL[3] each decrease to a potential corresponding to the potential VSS of the wiring SL[1] and the gate potential of the transistor M10[1] (the potential of the wiring LBL[1]). When the potential of the wiring LBL[1] is any one of $V_{00}-\Delta V_{00}$, $V_{01}-\Delta V_{01}$, $V_{10}-\Delta V_{10}$, and $V_{11}-\Delta V_{11}$, the potentials of the wiring GBL[1] to the wiring GBL[3] are each $V_{GBL00}$, $V_{GBL01}$, $V_{GBL10}$, or $V_{GBL11}$. As for the potential level of $V_{GBL00}$, $V_{GBL01}$, $V_{GBL10}$, and $V_{GBL11}$, $V_{GBL11}$ is the lowest, $V_{GBL10}$ is the second lowest, $V_{GBL01}$ is the second highest, and $V_{GBL00}$ is the highest. The timing chart in FIG. 9 shows changes in the potentials of the wiring GBL[1] to the wiring GBL[3] for the case where the potentials of the wiring LBL[1] are $V_{00}-\Delta V_{00}$, $V_{01}-\Delta V_{01}$, $V_{10}-\Delta V_{10}$, and $V_{11}-\Delta V_{11}$. Specifically, as for the wiring GBL[1] to the wiring GBL[3] in the timing chart in FIG. 9, the changes in the potentials of the wiring GBL[1] to the wiring GBL[3] when the potential of the wiring LBL[1] is $V_{11}-\Delta V_{11}$ are indicated by thick solid lines; the changes in the potentials of the wiring GBL[1] to the wiring GBL[3] when the potential of the wiring LBL[1] is $V_{10}-\Delta V_{10}$ are indicated by thick dashed double-dotted lines; the changes in the potentials of the wiring GBL[1] to the wiring GBL[3] when the potential of the wiring LBL[1] is $V_{01}-\Delta V_{01}$ are indicated by thick dashed-dotted lines; and the changes in the potential of the wiring GBL[1] to the wiring GBL[3] when the potential of the wiring LBL[1] is $V_{00}-\Delta V_{00}$ are indicated by thick dashed lines.

From Time T03 to Time T04, a low-level potential is input to the wiring S1LB and the wiring S2LB. Accordingly, the switch SWB[1] and the switch SWB[2] are brought into an off state, and electrical continuity between the wiring GBLB[1] and the wiring GBLB[2] and between the wiring GBLB[2] and the wiring GBLB[3] is broken.

From Time T04 to Time T05, a high-level potential is input to the wiring CRL[1] to the wiring CRL[3]. Accordingly, electrical continuity is established between the first terminal of the capacitor C2 of the reference cell VC[1] and the wiring RBLB[1], electrical continuity is established between the first terminal of the capacitor C2 of the reference cell VC[2] and the wiring RBLB[2], and electrical continuity is established between the first terminal of the capacitor C2 of the reference cell VC[3] and the wiring RBLB[3]. Thus, a signal corresponding to $V_{th}[1]$ is output from the reference cell VC[1] to the wiring RBLB[1], a signal corresponding to $V_{th}[2]$ is output from the reference cell VC[2] to the wiring RBLB[2], and a signal corresponding to $V_{th}[3]$ is output from the reference cell VC[3] to the wiring RBLB[3]. Specifically, the potential of the first terminal of the capacitor C2 of the reference cell VC[1] and the potential of the wiring RBLB[1] change, the potential of the first terminal of the capacitor C2 of the reference cell VC[2] and the potential of the wiring RBLB[2] change, and the potential of the first terminal of the capacitor C2 of the reference cell VC[3] and the potential of the wiring RBLB[3] change. At this time, the potential of the first terminal of the capacitor C2 of the reference cell VC[1] changes from $V_{th}[1]$ to $V_{th}[1]-\Delta V_{th}[1]$, the potential of the first terminal of the capacitor C2 of the reference cell VC[2] changes from $V_{th}[2]$ to $V_{th}[2]-\Delta V_{th}[2]$, and the potential of the first terminal of the capacitor C2 of the reference cell VC[3] changes from $V_{th}[3]$ to $V_{th}[3]-\Delta V_{th}[3]$. Thus, the potential of the wiring RBLB[1] changes from VSS to $V_{th}[1]-\Delta V_{th}[1]$, the potential of the wiring RBLB[2] changes from VSS to $V_{th}[2]-\Delta V_{th}[2]$, and the potential of the wiring RBLB[3] changes from VSS to $V_{th}[3]-\Delta V_{th}[3]$. Note that $\Delta V_{th}[1]$ to $\Delta V_{th}[3]$ denote the amount of change in the potentials that are determined in accordance with parasitic resistance, parasitic capacitance, or the like around the wiring RBLB[1] to the wiring RBLB[3].

At this time, the potentials $V_{INI}$ of the wiring GBLB[1] to the wiring GBLB[3] decrease to potentials corresponding to the potentials VSS of the wiring SRLB[1] to the wiring SRLB[3] and the potentials of the wiring RBLB[1] to the wiring RBLB[3]. Here, the potentials of the wiring GBLB[1] to the wiring GBLB[3] change to $V_{thRF}[1]$, $V_{thRF}[2]$, and $V_{thRF}[3]$, respectively. That is, $V_{thRF}[1]$ is a potential corresponding to $V_{th}[1]$-$\Delta V_{th}[1]$ that is the gate potential of the transistor M11B[1], $V_{thRF}[2]$ is a potential corresponding to $V_{th}[2]$-$\Delta V_{th}[2]$ that is the gate potential of the transistor M11B[2], and $V_{thRF}[3]$ is a potential corresponding to $V_{th}[3]$-$\Delta V_{th}[3]$ that is the gate potential of the transistor M11B[3]. In other words, $V_{thRF}[1]$ is a potential corresponding to the first threshold voltage $V_{th}[1]$, $V_{thRF}[2]$ is a potential corresponding to the second threshold voltage $V_{th}[2]$, and $V_{thRF}[3]$ is a potential corresponding to the third threshold voltage $V_{th}[3]$.

Here, $V_{thRF}[1]$ is a potential lower than $V_{GBL00}$ and higher than $V_{GBL01}$. In addition, $V_{thRF}[2]$ is a potential lower than $V_{GBL01}$ and higher than $V_{GBL10}$. Moreover, $V_{thRF}[3]$ is a potential lower than $V_{GBL10}$ and higher than $V_{GBL11}$.

From Time T05 to Time T06, a low-level potential is input to the wiring S1L and the wiring S2L. Accordingly, the switch SW[1] and the switch SW[2] are brought into an off state, so that electrical continuity between the wiring GBL[1] and the wiring GBL[2] and between the wiring GBL[2] and the wiring GBL[3] is broken.

From Time T06 to Time T07, the potential of the wiring ACL changes from a low-level potential to a high-level potential. Thus, the sense amplifier SA[1] to the sense amplifier SA[3] are activated. When the sense amplifier SA[1] is activated, one of the potential of the wiring GBL[1] and the potential of the wiring GBLB[1] changes to a high-level potential, and the other of the potential of the wiring GBL[1] and the potential of the wiring GBLB[1] changes to a low-level potential. Similarly, when the sense amplifier SA[2] is driven, one of the potential of the wiring GBL[2] and the potential of the wiring GBLB[2] changes to a high-level potential, and the other of the potential of the wiring GBL[2] and the potential of the wiring GBLB[2] changes to a low-level potential. Similarly, when the sense amplifier SA[3] is driven, one of the potential of the wiring GBL[3] and the potential of the wiring GBLB[3] changes to a high-level potential, and the other of the potential of the wiring GBL[3] and the potential of the wiring GBLB[3] changes to a low-level potential.

Here, the changes in the potential of the wiring GBL[1] and the potential of the wiring GBLB[1] are described. The potential of the wiring GBLB[1] is $V_{thRF}[1]$ corresponding to the first threshold voltage. In the case where the potential of the wiring GBL[1] is higher than $V_{thRF}[1]$, the potential of the wiring GBL[1] changes to a high-level potential and the potential $V_{thRF}[1]$ of the wiring GBL[1] changes to a low-level potential. In the case where the potential of the wiring GBL[1] is lower than $V_{thRF}[1]$, the potential of the wiring GBL[1] changes to a low-level potential and the potential $V_{thRF}[1]$ of the wiring GBL[1] changes to a high-level potential. That is, the potential of the wiring GBL[1] changes to a high-level potential when the potential of the wiring GBL[1] is $V_{GBL00}$, and the potential of the wiring GBL[1] changes to a low-level potential when the potential of the wiring GBL[1] is any one of $V_{GBL01}$, $V_{GBL10}$, and $V_{GBL11}$.

Next, the changes in the potential of the wiring GBL[2] and the potential of the wiring GBLB[2] are described. The potential of the wiring GBLB[2] is $V_{thRF}[2]$ corresponding to the second threshold voltage. In the case where the potential of the wiring GBL[2] is higher than $V_{thRF}[2]$, the potential of the wiring GBL[2] changes to a high-level potential and the potential $V_{thRF}[2]$ of the wiring GBL[2] changes to a low-level potential. In the case where the potential of the wiring GBL[2] is lower than $V_{thRF}[2]$, the potential of the wiring GBL[2] changes to a low-level potential and the potential $V_{thRF}[2]$ of the wiring GBL[2] changes to a high-level potential. That is, the potential of the wiring GBL[2] changes to a high-level potential when the potential of the wiring GBL[2] is $V_{GBL00}$ or $V_{GBL01}$, and the potential of the wiring GBL[2] changes to a low-level potential when the potential of the wiring GBL[2] is $V_{GBL10}$ or $V_{GBL11}$.

Next, the changes in the potential of the wiring GBL[3] and the potential of the wiring GBLB[3] are described. The potential of the wiring GBLB[3] is $V_{thRF}[3]$ corresponding to the third threshold voltage. In the case where the potential of the wiring GBL[3] is higher than $V_{thRF}[3]$, the potential of the wiring GBL[3] changes to a high-level potential and the potential $V_{thRF}[3]$ of the wiring GBL[3] changes to a low-level potential. In the case where the potential of the wiring GBL[3] is lower than $V_{thRF}[3]$, the potential of the wiring GBL[3] changes to a low-level potential and the potential $V_{thRF}[3]$ of the wiring GBL[3] changes to a high-level potential. That is, the potential of the wiring GBL[3] changes to a high-level potential when the potential of the wiring GBL[3] is any one of $V_{GBL00}$, $V_{GBL01}$, and $V_{GBL10}$, and the potential of the wiring GBL[3] changes to a low-level potential when the potential of the wiring GBL[3] is $V_{GBL11}$.

As for the wiring GBLB[1] in the timing chart in FIG. 9, the change in the potential of the wiring GBLB[1] when the potential of the wiring GBL[1] is $V_{GBL11}$ is indicated by a thick solid line; the change in the potential of the wiring GBLB[1] when the potential of the wiring GBL[1] is $V_{GBL10}$ is indicated by a thick dashed double-dotted line; the change in the potential of the wiring GBLB[1] when the potential of the wiring GBL[1] is $V_{GBL01}$ is indicated by a thick dashed-dotted line; and the change in the potential of the wiring GBLB[1] when the potential of the wiring GBL[1] is $V_{GBL00}$ is indicated by a thick dashed line. Similarly, as for the wiring GBLB[2] (the wiring GBLB[3]) in the timing chart in FIG. 9, the change in the potential of the wiring GBL[2] (the wiring GBL[3]) when the potential of the wiring GBLB[2] (the wiring GBLB[3]) is $V_{GBL11}$ is indicated by a thick solid line; the change in the potential of the wiring GBL[2] (the wiring GBL[3]) when the potential of the wiring GBLB[2] (the wiring GBLB[3]) is $V_{GBL10}$ is indicated by a thick dashed double-dotted line; the change in the potential of the wiring GBL[2] (the wiring GBL[3]) when the potential of the wiring GBLB[2] (the wiring GBLB[3]) is $V_{GBL01}$ is indicated by a thick dashed-dotted line; and the change in the potential of the wiring GBL[2] (the wiring GBL[3]) when the potential of the wiring GBLB[2] (the wiring GBLB[3]) is $V_{GBL00}$ is indicated by a thick dashed line.

From Time T06 to Time T07 in the timing chart in FIG. 9, for example, the change in the potential of the wiring GBL[1] caused by the sense amplifier SA[1] is shown such that the potentials $V_{GBL11}$, $V_{GBL10}$, $V_{GBL01}$, and $V_{GBL00}$ have different rising speed and falling speed to clearly show the changes of the potentials $V_{GBL11}$, $V_{GBL10}$, $V_{GBL01}$, and $V_{GBL00}$ to a high-level potential or a low-level potential. Therefore, in an actual operation, the speed of rise and fall of the potential of the wiring GBL[1] due to the sense amplifier SA[1] does not necessarily depend on the potentials $V_{GBL11}$, $V_{GBL10}$, $V_{GBL01}$, and $V_{GBL00}$.

Data retained in the circuit MC of the memory device 100A can be read through the above-described operation in which the potentials of the wiring GBL[1] to the wiring GBL[3] and/or the potentials of the wiring GBLB[1] to the wiring GBLB[3] from Time T06 to Time T07 are obtained. In the case where any one of the potentials $V_{00}$, $V_{01}$, $V_{10}$, and $V_{11}$ is retained in the circuit MC as four-level data, potentials read from the wiring GBL[1] to the wiring GBL[3], which are obtained through the above operation example, are as in the following table.

TABLE 1

| Potential retained in circuit MC | Potential of wiring GBL[1] | Potential of wiring GBL[2] | Potential of wiring GBL[3] |
|---|---|---|---|
| $V_{00}$ | High | High | High |
| $V_{01}$ | Low | High | High |
| $V_{10}$ | Low | Low | High |
| $V_{11}$ | Low | Low | Low |

| Potential retained in circuit MC | Potential of wiring GBLB[1] | Potential of wiring GBLB[2] | Potential of wiring GBLB[3] |
|---|---|---|---|
| $V_{00}$ | Low | Low | Low |
| $V_{01}$ | High | Low | Low |
| $V_{10}$ | High | High | Low |
| $V_{11}$ | High | High | High |

In the case of configuring a memory device that reads four-level potential, as in the memory device 100 in FIG. 1 and the memory device 100A in FIG. 8, the same number of sense amplifiers as the number of the threshold voltages for reading the four-level potential (in this case, three threshold voltages $V_{th}[1]$ to $V_{th}[3]$) are provided, and a potential read from a memory cell (e.g., the circuit MC) and potentials corresponding to $V_{th}[1]$ to $V_{th}[3]$ are compared, so that the potential retained in the memory cell can be read.

Note that the operation method of the configuration example of the semiconductor device described in this embodiment is not limited to the operation from Time T01 to Time T07 and around the period shown in the timing chart shown in FIG. 9. Specifically, in the timing chart described in this specification and the like, a wiring whose potential changes, an operation of changing a potential, a timing when a potential changes, or the like can be changed according to circumstances. For example, From Time T01 to Time T02 in the timing chart in FIG. 9, the potential of the wiring EQ is changed from a high-level potential to a low-level potential, and then the potentials of the wiring S1LB and the wiring S2LB are changed from a high level to a low-level potential, whereby signals corresponding to $V_{th}[1]$ to $V_{th}[3]$ can be output from the reference cell portion RFC[1] to the reference cell portion RFC[3] to the gates of the transistor M11B[1] to the transistor M11B[3] from Time T02 to Time T03. That is, in the operation method of the configuration example of the semiconductor device described in this embodiment, data reading from the circuit MC can be performed concurrently with reading of $V_{th}[1]$ to $V_{th}[3]$ respectively from the reference cell portion RFC[1] to the reference cell portion RFC[3].

In this embodiment, the configuration examples of the memory device that can write and read a four-level potential as data, which is a semiconductor device of one embodiment of the present invention, and the operation example of the memory device are described. Note that one embodiment of the present invention is not limited to the memory device 100 illustrated in FIG. 1 and the memory device 100A illustrated in FIG. 8, and one embodiment of the present invention may have a circuit configuration changed from those of the memory devices according to circumstances.

Figure 10A:
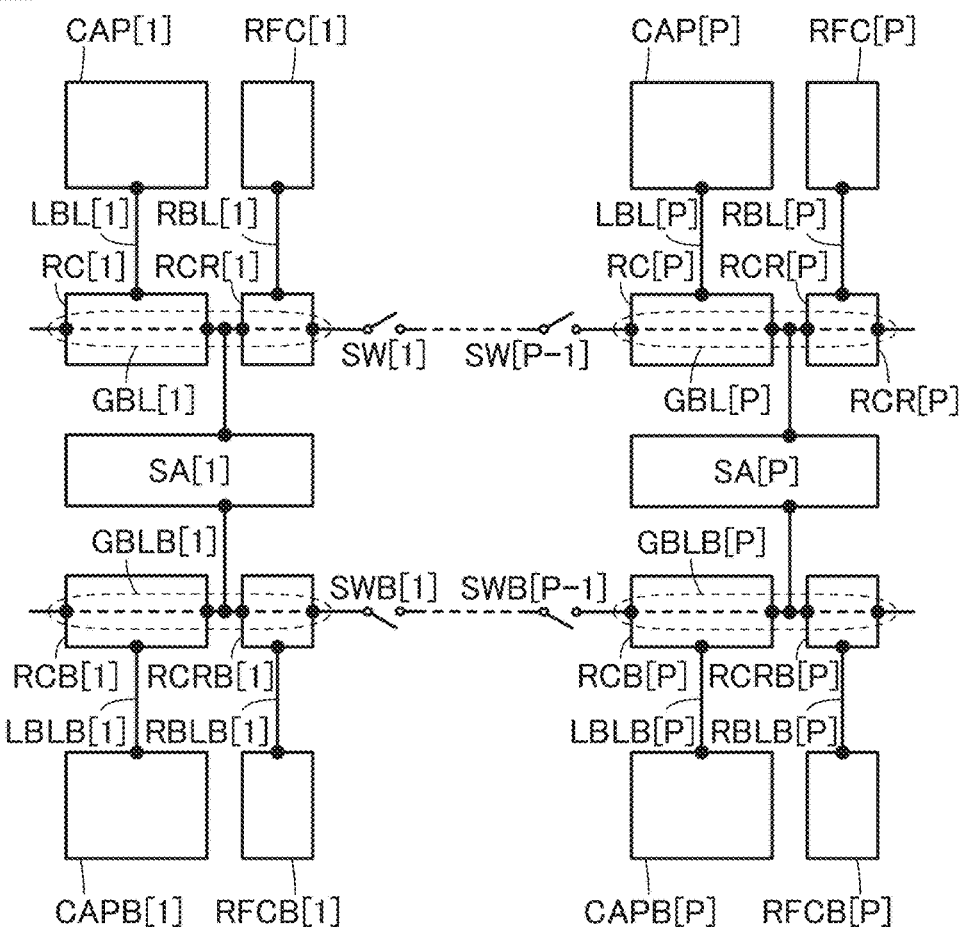
FIG. 10A is a block diagram illustrating a configuration example of a semiconductor device.

For example, in the case where a memory device that can write and read a (P+1)-level potential (P is an integer of 1 or more), the circuit configuration of the memory device 100 illustrated in FIG. 1 can be changed to that of a memory device 100B illustrated in FIG. 10A. The memory device 100B includes P sense amplifiers to read a (P+1)-level potential.

Specifically, the memory device 100B in FIG. 10A includes, for example, the cell array portion CAP[1] to a cell array portion CAP[P], the cell array portion CAPB[1] to a cell array portion CAPB[P], the reference cell portion RFC[1] to a reference cell portion RFC[P], the reference cell portion RFCB[1] to a reference cell portion RFCB[P], the circuit RC[1] to a circuit RC[P], the circuit RCB[1] to a circuit RCB[P], the circuit RCR[1] to a circuit RCR[P], the circuit RCRB[1] to a circuit RCRB[P], the switch SW[1] to a switch SW[P−1], and the switch SWB[1] to a switch SWB[P−1]. For the electrical connection relation of these circuits and circuit elements, the description of the memory device 100 in FIG. 1 is referred to.

FIG. 10A only illustrates the cell array portion CAP[1], the cell array portion CAP[P], the cell array portion CAPB[1], the cell array portion CAPB[P], the reference cell portion RFC[1], the reference cell portion RFC[P], the reference cell portion RFCB[1], the reference cell portion RFCB[P], the circuit RC[1], the circuit RC[P], the circuit RCB[1], the circuit RCB[P], the circuit RCR[1], the circuit RCR[P], the circuit RCRB[1], the circuit RCRB[P], the switch SW[1], the switch SW[P−1], the switch SWB[1], the switch SWB[P−1], the wiring LBL[1], the wiring LBL[P], the wiring LBLB[1], the wiring LBLB[P], the wiring RBL[1], the wiring RBL[P], the wiring RBLB[1], the wiring RBLB[P], the wiring GBL[1], the wiring GBL[P], the wiring GBLB[1], and the wiring GBLB[P].

For the memory device 100B that reads a (P+1)-level potential, P threshold voltages need to be set. The P threshold voltages of the memory device 100B are defined as the first threshold voltage $V_{th}[1]$ to the P-th threshold voltage $V_{th}[P]$, for example.

Figure 10B:
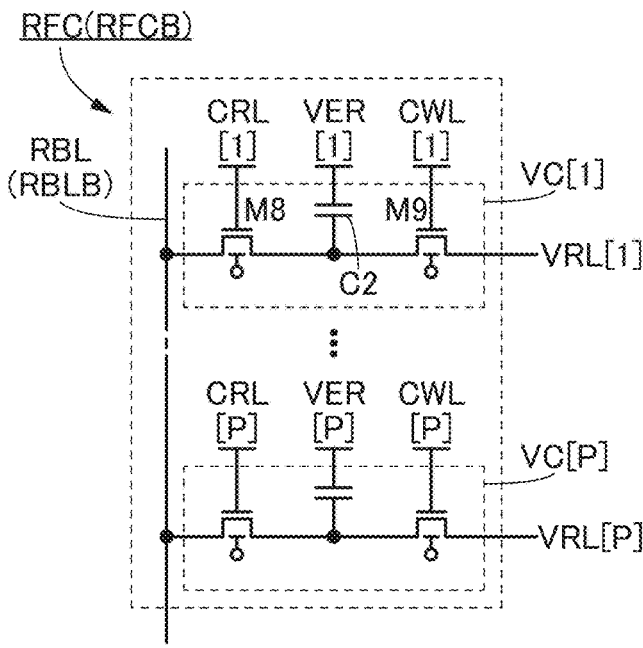
FIG. 10B and FIG. 10C are circuit diagrams each illustrating a configuration example of a circuit included in the semiconductor device.

Thus, the reference cell portion RFC[1] to the reference cell portion RFC[P] and the reference cell portion RFCB[1] to the reference cell portion RFCB[P] included in the memory device 100B preferably have a circuit configuration of the reference cell portion RFC (the reference cell portion RFCB) illustrated in FIG. 10B. The reference cell portion RFC (the reference cell portion RFCB) includes the reference cell VC[1] to a reference cell VC[P]. The reference cell VC[1] to the reference cell VC[P] have circuit configurations similar to those of the reference cell VC[1] to the reference cell VC[3] included in a reference cell portion FRC (the reference cell portion RFCB) in FIG. 4A. Here, voltages supplied by the wiring VRL[1] to a wiring VRL[P] are the first to the P-th threshold voltages or voltages corresponding to the threshold voltages. That is, in the reference cell portion RFC (the reference cell portion RFCB), by changing potentials supplied by the wiring CWL[P] and the wiring CRL[P] while a predetermined potential is applied to the wiring VER[P], the potential of the wiring RBL (the wiring RBLB) can be changed to a potential corresponding to any one of $V_{th}[1]$ to $V_{th}[P]$.

When P=2, for example, the memory device 100B is a memory device that can read and write a ternary potential as data. As another example, when P=4, the memory device 100B is a memory device that can write and read a five-level potential as data.

Figure 10C:
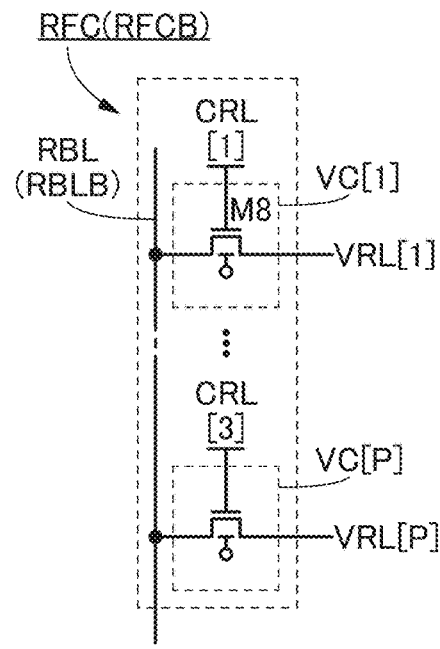

Like the reference cell portion RFC (the reference cell portion RFCB) in FIG. 10C, the reference cell portion RFC and the reference cell portion RFCB of the memory device 100B in FIG. 10A may each be a circuit in which the reference cell portion RFC (the reference cell portion RFCB) in FIG. 4B and the reference cell portion RFC (the reference cell portion RFCB) in FIG. 10B are combined.

Note that this embodiment can be combined with any of the other embodiments in this specification as appropriate.

(Embodiment 2)

In this embodiment, structure examples of the memory device described in the above embodiment and structure examples of a transistor that can be used in the memory device are described.

Figure 11:
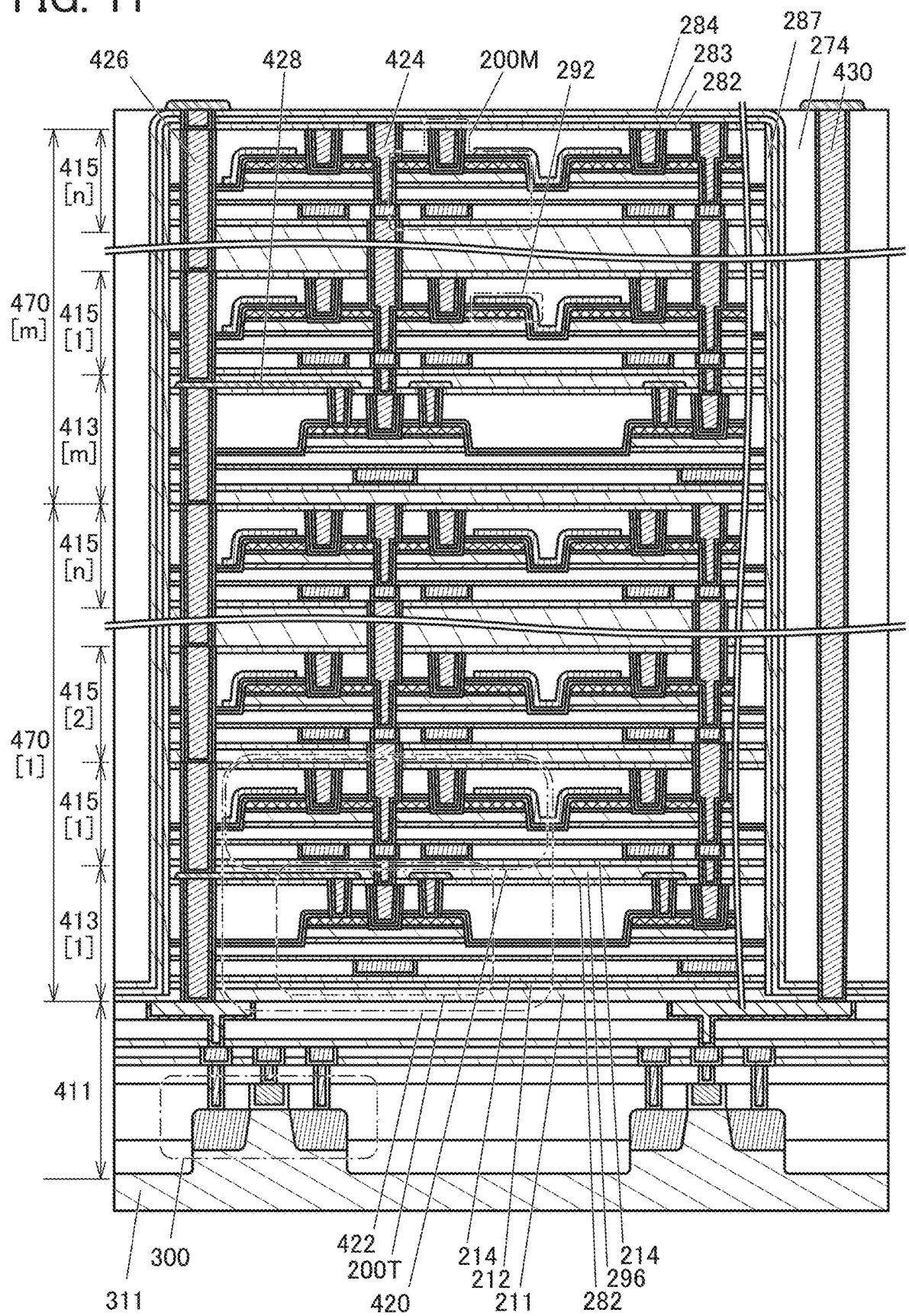
FIG. 11 is a schematic cross-sectional view illustrating a structure example of a semiconductor device.

FIG. 11 is a diagram illustrating an example of a semiconductor device in which memory units 470 (a memory unit 470[1] to a memory unit 470[m] (m is a natural number greater than or equal to 2)) are stacked over an element layer 411 including a circuit provided on a semiconductor substrate 311. FIG. 11 illustrates an example where the element layer 411 and a plurality of memory units 470 over the element layer 411 are stacked; the plurality of memory units 470 are each provided with a corresponding transistor layer 413 (a transistor layer 413[1] to a transistor layer 413[m]) and a plurality of memory device layers 415 (a memory device layer 415[1] to a memory device layer 415[n] (n is a natural number greater than or equal to 2)) over each transistor layer 413. Although the example where the memory device layers 415 are provided over the transistor layer 413 in each of the memory units 470 is illustrated, this embodiment is not limited thereto. The transistor layer 413 may be provided over the plurality of memory device layers 415, or the memory device layers 415 may be provided over and below the transistor layer 413.

The element layer 411 includes a transistor 300 provided on the semiconductor substrate 311 and can function as a circuit (referred to as a peripheral circuit in some cases) of the semiconductor device. Examples of the circuit include the sense amplifier SA[1] to the sense amplifier SA[3], the circuit RC[1] to the circuit RC[3], the circuit RCR[1] to the circuit RCR[3], the circuit RCB[1] to the circuit RCB[3], and the circuit RCRB[1] to the circuit RCRB[3], which can be used in the memory device 100 in FIG. 1 described in the above embodiment. Other examples of the circuit are a column driver, a row driver, a column decoder, a row decoder, a sense amplifier, a precharge circuit, an amplifier circuit, a word line driver circuit, an output circuit, and a control logic circuit.

The transistor layer 413 includes a transistor 200T and can function as a circuit for controlling each memory unit 470. The transistor 200T can be, for example, the transistor M10, the transistor M11, the transistor M10B, or the transistor M11B included in the circuit RC, the circuit RCR, the circuit RCB, or the circuit RCRB that is illustrated in FIG. 5A and FIG. 5B and can be used in the memory device 100 in FIG. 1 described in the above embodiment. The memory device layer 415 includes a memory device 420. The memory device 420 shown in this embodiment includes a transistor 200M and a capacitor 292. In particular, the memory device 420 can be, for example, the pair cell [1,1] to the pair cell [m,1] included in the cell array portion CAP (the cell array portion CAPB) in FIG. 2A, which can be used in the memory device 100 in FIG. 1 described in the above embodiment. When the circuit MC (the circuit MCr) included in the pair cell [1,1] to the pair cell [m,1] has a configuration illustrated in FIG. 3A, the transistor 200M illustrated in FIG. 11 can be the transistor M1 in FIG. 3A and the capacitor 292 illustrated in FIG. 11 can be the capacitor C1 in FIG. 3A.

Figure 12:
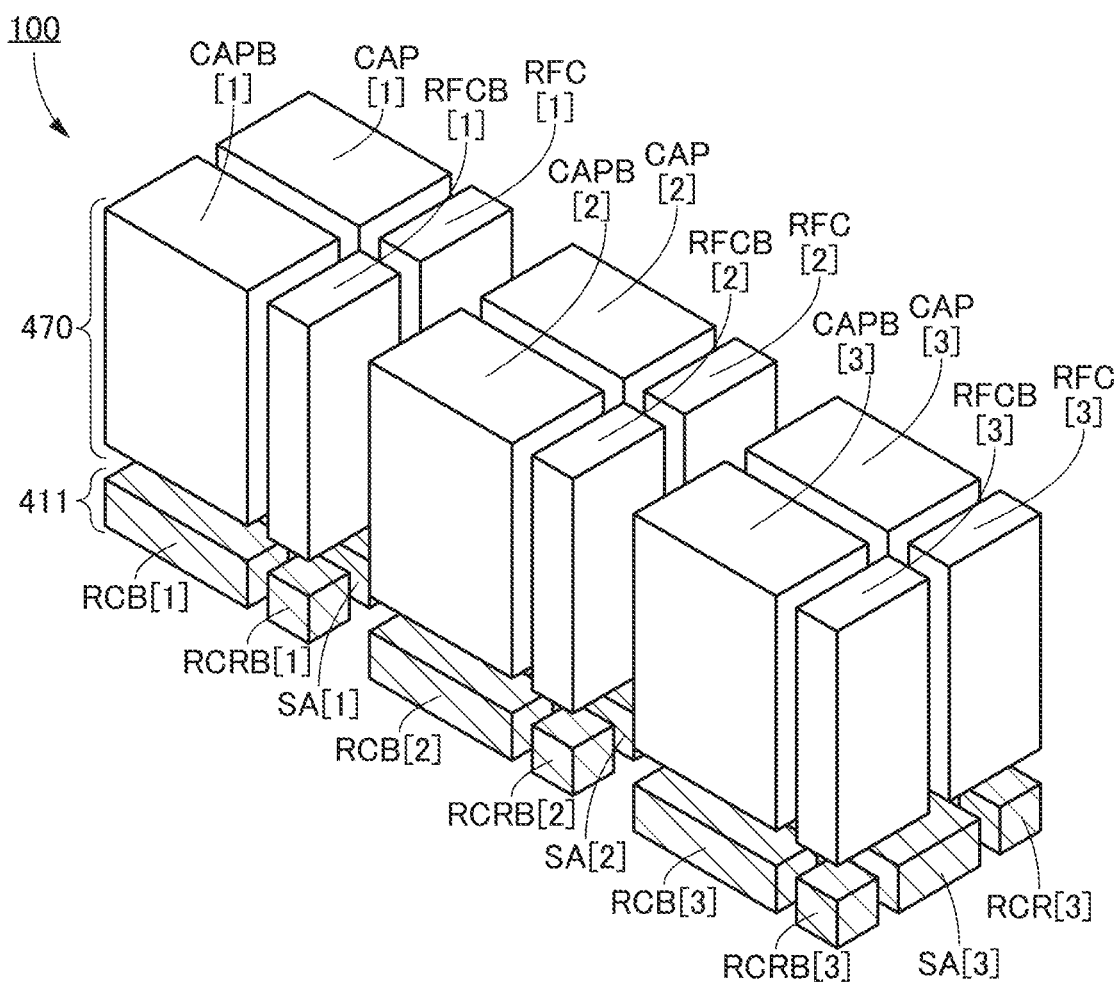
FIG. 12 is a perspective view illustrating a structure example of a semiconductor device.

That is, as illustrated in FIG. 12, the element layer 411 can include the sense amplifier SA[1] to the sense amplifier SA[3], the circuit RC[1] to the circuit RC[3], the circuit RCR[1] to the circuit RCR[3], the circuit RCB[1] to the circuit RCB[3], and the circuit RCRB[1] to the circuit RCRB[3], and the memory unit 470 can include the cell array portion CAP[1] to the cell array portion CAP[3], the cell array portion CAPB[1] to the cell array portion CAP[3], the reference cell portion RFC[1] to the reference cell portion RFC[3], and the reference cell portion RFCB[1] to the reference cell portion RFCB[3].

Figure 13:
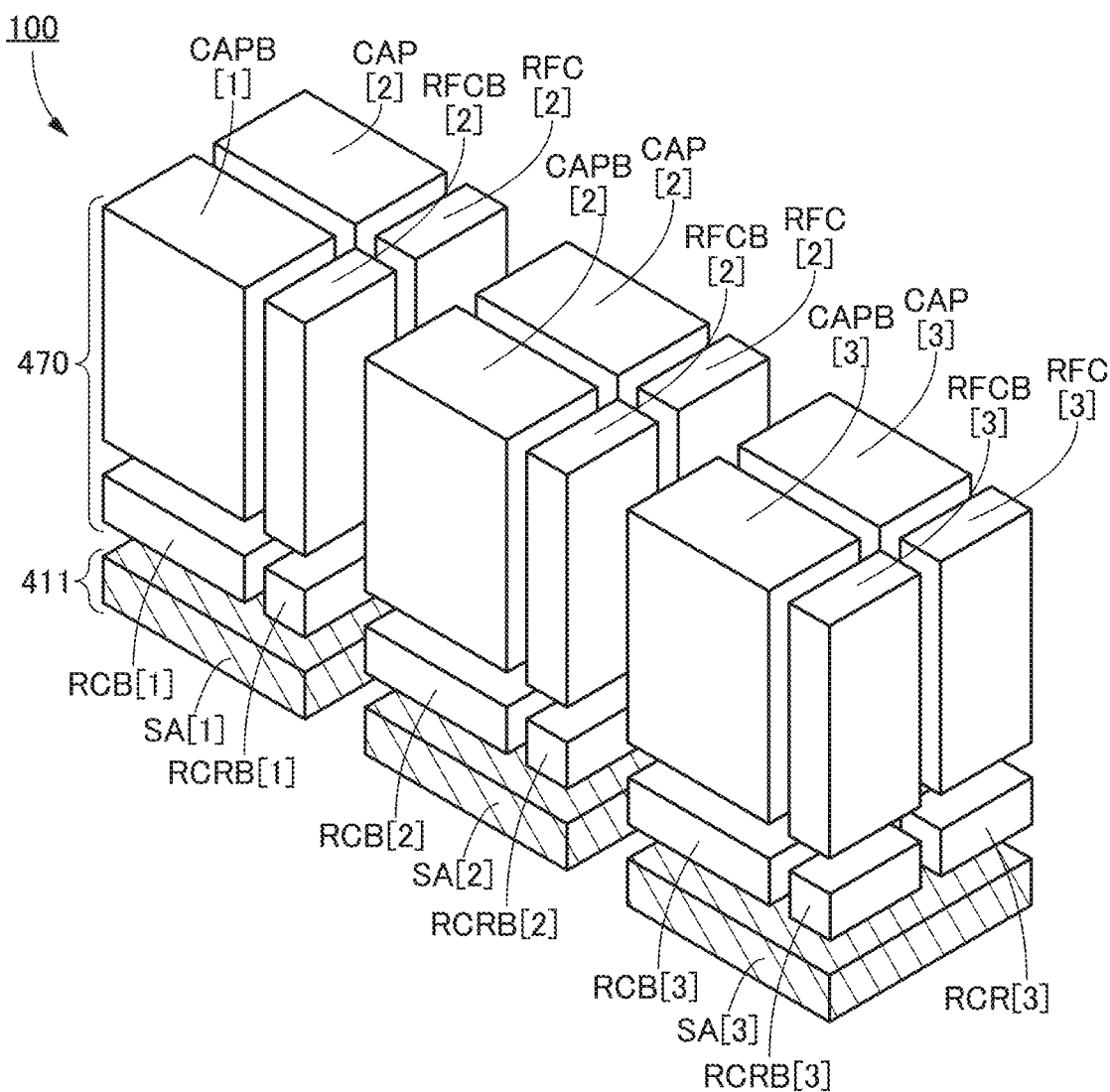
FIG. 13 is a perspective view illustrating a structure example of a semiconductor device.

FIG. 12 illustrates a structure where the circuit RC[1] to the circuit RC[3], the circuit RCR[1] to the circuit RCR[3], the circuit RCB[1] to the circuit RCB[3], and the circuit RCRB[1] to the circuit RCRB[3] are included in the element layer 411; however, as a modification example of FIG. 12, a structure illustrated in FIG. 13 may be employed in which the circuit RC[1] to the circuit RC[3], the circuit RCR[1] to the circuit RCR[3], the circuit RCB[1] to the circuit RCB[3], and the circuit RCRB[1] to the circuit RCRB[3] are included not in the element layer 411 but in the memory unit 470. That is, transistors included in the circuit RC[1] to the circuit RC[3], the circuit RCR[1] to the circuit RCR[3], the circuit RCB[1] to the circuit RCB[3], and the circuit RCRB[1] to the circuit RCRB[3] can each be the transistor 200T in FIG. 11, for example.

The switch SW[1], the switch SW[2], the switch SWB[1], and the switch SWB[2] illustrated in FIG. 1 may be included in the element layer 411 or may be included in the memory unit 470.

Although not particularly limited, m is greater than or equal to 2 and less than or equal to 100, preferably greater than or equal to 2 and less than or equal to 50, further preferably greater than or equal to 2 and less than or equal to 10. Although not particularly limited, n is greater than or equal to 2 and less than or equal to 100, preferably greater than or equal to 2 and less than or equal to 50, further preferably greater than or equal to 2 and less than or equal to 10. In addition, the product of m and n is greater than or equal to 4 and less than or equal to 256, preferably greater than or equal to 4 and less than or equal to 128, further preferably greater than or equal to 4 and less than or equal to 64.

FIG. 11 illustrates a cross-sectional view of the transistors 200T and the transistors 200M in the channel length direction, which are included in the memory units.

As illustrated in FIG. 11, the transistor 300 is provided on the semiconductor substrate 311, and the transistor layers 413 and the memory device layers 415 included in the memory units 470 are provided over the transistor 300. In one memory unit 470, the transistor 200T included in the transistor layer 413 and the memory devices 420 included in the memory device layers 415 are electrically connected to each other through a plurality of conductors 424, and the transistor 300 and the transistor 200T included in the transistor layer 413 in each memory unit 470 are electrically connected to each other through a conductor 426. In addition, the conductor 426 is preferably electrically connected to the transistor 200T through a conductor 428 which is electrically connected to any one of a source, a drain, and a gate of the transistor 200T. The conductors 424 are preferably provided in each of the memory device layers 415. Furthermore, the conductor 426 is preferably provided in each of the transistor layers 413 and the memory device layers 415.

Although the details are described later, an insulator that inhibits passage of impurities such as water or hydrogen or oxygen is preferably provided on a side surface of the conductor 424 and a side surface of the conductor 426. For the insulator, for example, silicon nitride, aluminum oxide, or silicon nitride oxide may be used.

The transistor 200M included in the memory device 420 can have a structure similar to that of the transistor 200T included in the transistor layer 413. The transistor 200T and the transistor 200M are collectively referred to as a transistor 200.

The transistor 200 preferably uses a metal oxide functioning as an oxide semiconductor (hereinafter also referred to as an oxide semiconductor) in a semiconductor including a region where a channel is formed (hereinafter also referred to as a channel formation region).

As an oxide semiconductor, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, indium oxide, an In-M oxide, an In—Zn oxide, or an M-Zn oxide may be used. Note that when an oxide semiconductor having a high proportion of indium is used, the on-state current, the field-effect mobility, or the like of the transistor can be increased.

The transistor 200 using an oxide semiconductor in the channel formation region has an extremely low leakage current in a non-conduction state; hence, a semiconductor device with low power consumption can be provided. An oxide semiconductor can be deposited by a sputtering method or the like, and thus can be used in the transistor 200 included in a highly integrated semiconductor device.

In contrast, a transistor using an oxide semiconductor is likely to have normally-on characteristics (the characteristics are that a channel exists without voltage application to a gate electrode and a current flows through the transistor) owing to an impurity and an oxygen vacancy (also referred to as Vo) in the oxide semiconductor that change the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Therefore, the concentration of impurities in the oxide semiconductor is preferably reduced as much as possible. Examples of the impurities in the oxide semiconductor include hydrogen, nitrogen, an alkali metal, an alkaline earth metal, iron, nickel, and silicon.

In particular, hydrogen as an impurity contained in the oxide semiconductor might form an oxygen vacancy in the oxide semiconductor. In some cases, a defect that is an oxygen vacancy into which hydrogen enters (hereinafter referred to as VoH in some cases) generates an electron serving as a carrier. In other cases, reaction of part of hydrogen with oxygen bonded to a metal atom generates an electron serving as a carrier.

Thus, a transistor using an oxide semiconductor which contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might decrease the reliability of the transistor.

Therefore, it is preferable to use a highly purified intrinsic oxide semiconductor in which oxygen vacancies and impurities such as hydrogen are reduced as the oxide semiconductor used in the transistor 200.

<Sealing Structure>

In view of the above, the transistor 200 is preferably sealed using a material that inhibits diffusion of impurities (hereinafter also referred to as a barrier material against impurities) in order to inhibit entry of impurities from the outside.

A barrier property in this specification means a function of inhibiting diffusion of a particular substance (also referred to as low transmission capability). Alternatively, a barrier property in this specification means a function of capturing and fixing (also referred to as gettering) a particular substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material that has a function of capturing and fixing hydrogen include metal oxides such as aluminum oxide, hafnium oxide, gallium oxide, and indium gallium zinc oxide.

As barrier layers between the transistor 300 and the transistor 200, an insulator 211, an insulator 212, and an insulator 214 are preferably provided. When a material that inhibits diffusion or passage of impurities such as hydrogen is used in at least one of the insulator 211, the insulator 212, and the insulator 214, diffusion of impurities such as hydrogen or water contained in the semiconductor substrate 311, the transistor 300, or the like into the transistor 200 can be inhibited. When a material that inhibits passage of oxygen is used in at least one of the insulator 211, the insulator 212, and the insulator 214, diffusion of oxygen contained in the channel formation region of the transistor 200 or the transistor layer 413 into the element layer 411 can be inhibited. For example, it is preferable to use a material that inhibits passage of impurities such as hydrogen or water as the insulator 211 and the insulator 212 and use a material that inhibits passage of oxygen as the insulator 214. It is further preferable to use a material having a property of absorbing or occluding hydrogen as the insulator 214. As the insulator 211 and the insulator 212, a nitride such as silicon nitride or silicon nitride oxide can be used, for example. As the insulator 214, a metal oxide such as aluminum oxide, hafnium oxide, gallium oxide, or indium gallium zinc oxide can be used, for example. In particular, aluminum oxide is preferably used as the insulator 214.

Furthermore, an insulator 287 is preferably provided on side surfaces of the transistor layers 413 and side surfaces of the memory device layers 415, that is, side surfaces of the memory units 470, and an insulator 282 is preferably provided on a top surface of the memory unit 470. In this case, the insulator 282 is preferably in contact with the insulator 287, and the insulator 287 is preferably in contact with at least one of the insulator 211, the insulator 212, and the insulator 214. As the insulator 287 and the insulator 282, a material that can be used for the insulator 214 is preferably used.

An insulator 283 and an insulator 284 are preferably provided to cover the insulator 282 and the insulator 287, and the insulator 283 is preferably in contact with at least one of the insulator 211, the insulator 212, and the insulator 214. Although FIG. 11 illustrates an example where the insulator 287 is in contact with a side surface of the insulator 214, a side surface of the insulator 212, and a top surface and a side surface of the insulator 211, and the insulator 283 is in contact with a top surface and a side surface of the insulator 287 and the top surface of the insulator 211, this embodiment is not limited thereto. The insulator 287 may be in contact with the side surface of the insulator 214 and a top surface and the side surface of the insulator 212, and the insulator 283 may be in contact with the top surface and the side surface of the insulator 287 and the top surface of the insulator 212. For the insulator 282 and the insulator 287, a material that can be used for the insulator 211 and the insulator 212 is preferably used.

In the above-described structure, a material that inhibits passage of oxygen is preferably used for the insulator 287 and the insulator 282. A material having a property of capturing and fixing hydrogen is further preferably used for the insulator 287 and the insulator 282. When the material having a property of capturing and fixing hydrogen is used on the side close to the transistor 200, hydrogen in the transistor 200 or the memory units 470 is captured and fixed by the insulator 214, the insulator 287, and the insulator 282, so that the hydrogen concentration in the transistor 200 can be reduced. Furthermore, a material that inhibits passage of impurities such as hydrogen or water (a material having a barrier property against impurities such as hydrogen or water) is preferably used for the insulator 283 and the insulator 284.

By employing the above-described structure, the memory units 470 are surrounded by the insulator 211, the insulator 212, the insulator 214, the insulator 287, the insulator 282, the insulator 283, and the insulator 284. Specifically, the memory units 470 are surrounded by the insulator 214, the insulator 287, and the insulator 282 (referred to as a first structure body in some cases); and the memory units 470 and the first structure body are surrounded by the insulator 211, the insulator 212, the insulator 283, and the insulator 284 (referred to as a second structure body in some cases). The structure in which the memory units 470 are surrounded by two or more layers of structure bodies in that manner is referred to as a nesting structure in some cases. Here, the memory units 470 being surrounded by the plurality of structure bodies is also described as the memory units 470 being sealed by the plurality of insulators.

The second structure body seals the transistor 200 with the first structure body therebetween. Thus, the second structure body inhibits hydrogen present outside the second structure body, from diffusing to a portion inside the second structure body (to the transistor 200 side). That is, the first structure body can efficiently capture and fix hydrogen present in an inside structure of the second structure body.

In the above structure, specifically, a metal oxide such as aluminum oxide can be used for the first structure body and a nitride such as silicon nitride can be used for the second structure body. More specifically, an aluminum oxide film is preferably placed between the transistor 200 and a silicon nitride film.

Furthermore, by appropriately setting deposition conditions for the materials used for the structure bodies, the hydrogen concentrations in the film can be reduced.

In general, a film formed by a CVD method has more favorable coverage than a film formed by a sputtering method. On the other hand, many compound gases used for a CVD method contain hydrogen and a film formed by a CVD method has higher hydrogen content than a film formed by a sputtering method.

Accordingly, it is preferable to use a film with a reduced hydrogen concentration (specifically, a film formed by a sputtering method) as a film which is close to the transistor 200, for example. Meanwhile, in the case where a film that has favorable coverage as well as a relatively high hydrogen concentration (specifically, a film formed by a CVD method) is used as a film that inhibits impurity diffusion, it is preferable that a film having a function of capturing and fixing hydrogen and a reduced hydrogen concentration be placed between the transistor 200 and the film that has a relatively high hydrogen concentration as well as favorable coverage.

In other words, a film with a relatively low hydrogen concentration is preferably used as the film which is placed close to the transistor 200. In contrast, a film with a relatively high hydrogen concentration is preferably placed apart from the transistor 200.

Specifically, when the transistor 200 is sealed with a silicon nitride film formed by a CVD method in the above-described structure, an aluminum oxide film formed by a sputtering method is preferably placed between the transistor 200 and the silicon nitride film formed by a CVD method. It is further preferable that a silicon nitride film formed by a sputtering method be placed between the silicon nitride film formed by a CVD method and the aluminum oxide film formed by a sputtering method.

Note that in the case where a CVD method is employed for film formation, a compound gas containing no hydrogen atom or having a low hydrogen atom content may be used for the film formation to reduce the concentration of hydrogen contained in the formed film.

It is also preferable to provide the insulator 282 and the insulator 214 between the transistor layer 413 and the memory device layers 415 or between the memory device layers 415. Furthermore, it is preferable to provide an insulator 296 between the insulator 282 and the insulator 214. The insulator 296 can be formed using a material similar to those for the insulator 283 and the insulator 284. Alternatively, silicon oxide or silicon oxynitride can be used. Alternatively, a known insulating material may be used. Here, the insulator 282, the insulator 296, and the insulator 214 may be elements that form the transistor 200. It is preferable that the insulator 282, the insulator 296, and the insulator 214 also serve as components of the transistor 200 in order to reduce the number of steps for manufacturing the semiconductor device.

Each side surface of the insulator 282, the insulator 296, and the insulator 214 provided between the transistor layer 413 and the memory device layers 415 or between the memory device layers 415 is preferably in contact with the insulator 287. With such a structure, the transistor layers 413 and the memory device layers 415 are surrounded by and sealed with the insulator 282, the insulator 296, the insulator 214, the insulator 287, the insulator 283, and the insulator 284.

An insulator 274 may be provided around the insulator 284. A conductor 430 may be provided so as to be embedded in the insulator 274, the insulator 284, the insulator 283, and the insulator 211. The conductor 430 is electrically connected to the transistor 300, that is, the circuit included in the element layer 411.

Furthermore, since the capacitor 292 is formed in the same layer as the transistor 200M in the memory device layers 415, the height of the memory device 420 can be approximately equal to that of the transistor 200M; thus, the height of each memory device layer 415 can be prevented from being excessively increased. Accordingly, the number of memory device layers 415 can be increased relatively easily. For example, approximately 100 units each including the transistor layer 413 and the memory device layers 415 may be stacked.

<Transistor 200>

The transistor 200 that can be used as the transistor 200T included in the transistor layer 413 and the transistor 200M included in the memory device 420 is described with reference to FIG. 14A.

Figure 14A:
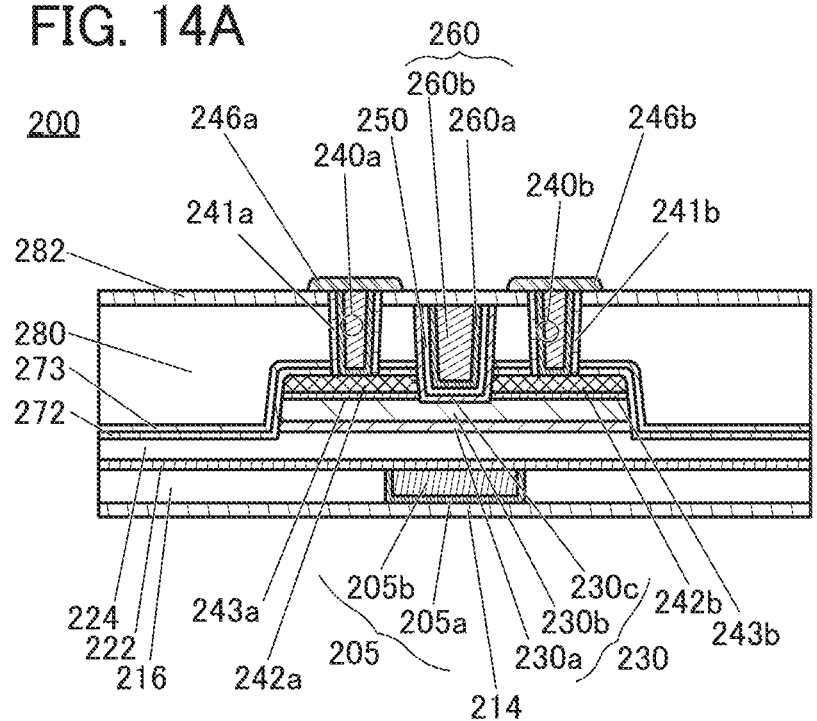
FIG. 14A and FIG. 14B are schematic cross-sectional views each illustrating a structure example of a semiconductor device.

As illustrated in FIG. 14A, the transistor 200 includes an insulator 216, a conductor 205 (a conductor 205a and a conductor 205b), an insulator 222, an insulator 224, an oxide 230 (an oxide 230a, an oxide 230b, and an oxide 230c), a conductor 242 (a conductor 242a and a conductor 242b), an oxide 243 (an oxide 243a and an oxide 243b), an insulator 272, an insulator 273, an insulator 250, and a conductor 260 (a conductor 260a and a conductor 260b).

Furthermore, the insulator 216 and the conductor 205 are provided over the insulator 214, and an insulator 280 and the insulator 282 are provided over the insulator 273. The insulator 214, the insulator 280, and the insulator 282 can be regarded as part of the transistor 200.

The insulator 280 preferably includes an excess-oxygen region and preferably releases oxygen by heating. When the heated insulator 280 releases oxygen, the oxygen can be efficiently supplied to the oxide 230a and the oxide 230b through the oxide 230c. For example, the insulator 280 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a step after formation of the insulator 280 in some cases. The concentration of impurities such as water or hydrogen in the insulator 280 is preferably reduced.

The semiconductor device of one embodiment of the present invention also includes a conductor 240 (a conductor 240a and a conductor 240b) that is electrically connected to the transistor 200 and functions as a plug. Note that an insulator 241 (an insulator 241a and an insulator 241b) may be provided in contact with a side surface of the conductor 240 functioning as a plug. A conductor 246 (a conductor 246a and a conductor 246b) that is electrically connected to the conductor 240 and functions as a wiring is provided over the insulator 282 and the conductor 240.

For the conductor 240a and the conductor 240b, a conductive material containing tungsten, copper, or aluminum as its main component is preferably used, for example. The conductor 240a and the conductor 240b may each have a stacked-layer structure.

In the case where the conductor 240 has a stacked-layer structure, a conductive material having a function of inhibiting passage of oxygen and impurities such as water or hydrogen is preferably used for the conductor 240. For example, tantalum, tantalum nitride, titanium, titanium nitride, ruthenium, ruthenium oxide, or the like is preferably used. A single layer or a stacked layer of the conductive material having a function of inhibiting passage of oxygen and impurities such as water or hydrogen may be used. With the use of the conductive material, entry of impurities diffused from the insulator 280 and the like, such as water or hydrogen, into the oxide 230 through the conductor 240a and the conductor 240b can be further reduced. In addition, oxygen added to the insulator 280 can be prevented from being absorbed by the conductor 240a and the conductor 240b.

For the insulator 241 provided in contact with the side surface of the conductor 240, for example, silicon nitride, aluminum oxide, silicon nitride oxide, or the like can be used. Since the insulator 241 is provided in contact with the insulator 272, the insulator 273, the insulator 280, and the insulator 282, impurities such as water or hydrogen can be inhibited from being mixed into the oxide 230 through the conductor 240a and the conductor 240b from the insulator 280 or the like. In particular, silicon nitride is suitable because of its high barrier property against hydrogen. In addition, oxygen contained in the insulator 280 can be prevented from being absorbed by the conductor 240a and the conductor 240b.

As the conductor 246, a conductive material containing tungsten, copper, or aluminum as its main component is preferably used. Furthermore, the conductor may have a stacked-layer structure and may be a stack of titanium or titanium nitride and the above-described conductive material, for example. Note that the conductor may be formed to be embedded in an opening provided in an insulator.

In the transistor 200, the conductor 260 functions as a first gate of the transistor, and the conductor 205 functions as a second gate of the transistor. The conductor 242a and the conductor 242b function as a source electrode and a drain electrode.

The oxide 230 functions as a semiconductor including a channel formation region.

The insulator 250 functions as a first gate insulator, and the insulator 222 and the insulator 224 function as a second gate insulator.

Here, in the transistor 200 illustrated in FIG. 14A, the conductor 260 is formed in a self-aligned manner in an opening portion provided in the insulator 280, the insulator 273, the insulator 272, the conductor 242, and the like, with the oxide 230c and the insulator 250 therebetween.

In other words, the conductor 260 is formed to fill the opening provided in the insulator 280 and the like with the oxide 230c and the insulator 250 therebetween; therefore, positional alignment of the conductor 260 in the region between the conductor 242a and the conductor 242b is not needed.

Here, the oxide 230c is preferably provided in the opening that is provided in the insulator 280 and the like. Thus, the insulator 250 and the conductor 260 include a region that overlaps with a stacked-layer structure of the oxide 230b and the oxide 230a with the oxide 230c therebetween. With this structure, the oxide 230c and the insulator 250 can be sequentially formed and thus, the interface between the oxide 230 and the insulator 250 can be kept clean. Thus, the influence of interface scattering on carrier conduction is small, and the transistor 200 can have a high on-state current and excellent frequency characteristics.

In the transistor 200 illustrated in FIG. 14A, a bottom surface and a side surface of the conductor 260 are in contact with the insulator 250. In addition, a bottom surface and a side surface of the insulator 250 are in contact with the oxide 230c.

As illustrated in FIG. 14A, the transistor 200 has a structure in which the insulator 282 and the oxide 230c are in direct contact with each other. Owing to this structure, diffusion of oxygen contained in the insulator 280 into the conductor 260 can be inhibited.

Therefore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor 200 can be improved.

The detailed structure of the semiconductor device including the transistor 200 of one embodiment of the present invention is described below.

In the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used.

For example, a metal oxide having an energy gap of 2 eV or more, preferably 2.5 eV or more is preferably used as the metal oxide functioning as an oxide semiconductor. With the use of a metal oxide having such a wide energy gap, the leakage current in an off state (off-state current) of the transistor 200 can be extremely low. With the use of such a transistor, a semiconductor device with low power consumption can be provided.

Specifically, as in the description of the transistor 200 in FIG. 11, a metal oxide such as an In-M-Zn oxide is preferably used as the oxide 230. In particular, aluminum, gallium, yttrium, or tin is preferably used as the element M. Furthermore, as in the description of the transistor 200 in FIG. 11, an In-M oxide, an In—Zn oxide, or an M-Zn oxide may be used as the oxide 230.

As illustrated in FIG. 14A, the oxide 230 preferably includes the oxide 230a over the insulator 224, the oxide 230b over the oxide 230a, and the oxide 230c that is placed over the oxide 230b and is at least partly in contact with a top surface of the oxide 230b. Here, a side surface of the oxide 230c is preferably provided in contact with the oxide 243a, the oxide 243b, the conductor 242a, the conductor 242b, the insulator 272, the insulator 273, and the insulator 280.

That is, the oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the transistor 200 has a structure in which three layers of the oxide 230a, the oxide 230b, and the oxide 230c are stacked in the channel formation region and the vicinity thereof, however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. For example, a four-layer structure including the oxide 230c with a two-layer structure may be provided.

In addition, the oxide 230 preferably has a stacked-layer structure of a plurality of oxide layers that differ in the atomic ratio of metal atoms. Specifically, the atomic proportion of the element M in the constituent elements in the metal oxide used as the oxide 230a is preferably greater than the atomic proportion of the element M in the constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Specifically, as the oxide 230a, a metal oxide having a composition of In:Ga:Zn=1:3:4 [atomic ratio] or the vicinity thereof or a composition of 1:1:0.5 [atomic ratio] or the vicinity thereof is preferably used.

As the oxide 230b, a metal oxide having a composition of In:Ga:Zn=4:2:3 [atomic ratio] or the neighborhood thereof or a composition of 1:1:1 [atomic ratio] or the neighborhood thereof is used. As the oxide 230b, a metal oxide having a composition of In:Ga:Zn=5:1:3 [atomic ratio] or the neighborhood thereof or a composition of In:Ga:Zn=10:1:3 [atomic ratio] or the neighborhood thereof may be used as well. As the oxide 230b, an In—Zn oxide (e.g., a composition of In:Zn=2:1 [atomic ratio] or the neighborhood thereof, a composition of In:Zn=5:1 [atomic ratio] or the neighborhood thereof, or a composition of In:Zn=10:1 [atomic ratio] or the neighborhood thereof) may be used as well. An In oxide may be used as the oxide 230b.

Furthermore, as the oxide 230c, a metal oxide having In:Ga:Zn=1:3:4 [atomic ratio or the composition in the neighborhood thereof], a composition of Ga:Zn=2:1 [atomic ratio] or the neighborhood thereof, or a composition of Ga:Zn=2:5 [atomic ratio] or the neighborhood thereof is preferably used. As the oxide 230c, a single layer or a stacked layer may be provided using a material that can be used for the oxide 230b. For example, in the case where the oxide 230c has a stacked-layer structure, the oxide 230c can specifically have a stacked-layer structure of a composition of In:Ga:Zn=4:2:3 [atomic ratio] or the neighborhood thereof and a composition of In:Ga:Zn=1:3:4 [atomic ratio] or the neighborhood thereof, a stacked-layer structure of a composition of Ga:Zn=2:1 [atomic ratio] or the neighborhood thereof and a composition of In:Ga:Zn=4:2:3 [atomic ratio] or the neighborhood thereof, a stacked-layer structure of a composition of Ga:Zn=2:5 [atomic ratio] or the neighborhood thereof and a composition of In:Ga:Zn=4:2:3 [atomic ratio] or the neighborhood thereof, a stacked-layer structure of gallium oxide and a composition of In:Ga:Zn=4:2:3 [atomic ratio] or the neighborhood thereof, or the like.

When the transistor included in the circuit MC (the circuit MCr) illustrated in FIG. 3A to FIG. 3H, the transistors included in the reference cell portion RFC (the reference cell portion RFCB) illustrated in FIG. 4A to FIG. 4C, and the transistors included in the circuit RC, the circuit RCB, the circuit RCR, and the circuit RCRB illustrated in FIG. 5A and FIG. 5C, for example, which are described in the above embodiment, are OS transistors, the OS transistors may have different structures.

For example, as the oxide 230c included in the OS transistor included in the circuit MC (the circuit MCr) and the reference cell portion RFC (the reference cell portion (RFCB), a metal oxide having a composition of In:Ga:Zn=4:2:3 [atomic ratio] or the neighborhood thereof may be used, and as the oxide 230c included in the OS transistor included in the circuit RC, the circuit RCB, the circuit RCR, and the circuit RCRB, a metal oxide having a composition of In:Ga:Zn=5:1:3 [atomic ratio] or the neighborhood thereof, a composition of In:Ga:Zn=10:1:3 [atomic ratio] or the neighborhood thereof, a composition of In:Zn=10:1 [atomic ratio] or the neighborhood thereof, a composition of In:Zn=5:1 [atomic ratio] or the neighborhood thereof, or a composition of In:Zn=2:1 [atomic ratio] or the neighborhood thereof may be used.

In the oxide 230b and the oxide 230c, increasing the proportion of indium in the films enables higher on-state current, higher field-effect mobility, or the like of the transistor. Moreover, the above-described composition in the neighborhood includes ±30% of the intended atomic ratio.

The oxide 230b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. In addition, the amount of oxygen extracted from the oxide 230b can be reduced even when heat treatment is performed; thus, the transistor 200 is stable at high temperatures (what is called thermal budget) in a manufacturing process.

The conductor 205 is placed to overlap with the oxide 230 and the conductor 260. Furthermore, the conductor 205 is preferably provided to be embedded in the insulator 216.

When the conductor 205 functions as a gate electrode, by changing a potential applied to the conductor 205 not in conjunction with but independently of a potential applied to the conductor 260, the threshold voltage of the transistor 200 can be adjusted. In particular, by applying a negative potential to the conductor 205, the threshold voltage of the transistor 200 can be further increased, and the off-state current can be reduced. Thus, a drain current when the potential applied to the conductor 260 is 0 V can be lower in the case where a negative potential is applied to the conductor 205 than in the case where the negative potential is not applied to the conductor 205.

As illustrated in FIG. 14A, the conductor 205 is preferably provided to be larger than a region of the oxide 230 that does not overlap with the conductor 242a or the conductor 242b. Although not illustrated, the conductor 205 preferably extends to a region outside the oxide 230a and the oxide 230b in the channel width direction of the oxide 230. That is, the conductor 205 and the conductor 260 preferably overlap with each other with the insulators therebetween on the outside of a side surface of the oxide 230 in the channel width direction. Providing the conductor 205 with a large area can reduce local charging (charge up) in treatment using plasma of a manufacturing step after forming the conductor 205 in some cases. Note that one embodiment of the present invention is not limited thereto. The conductor 205 overlaps with at least the oxide 230 positioned between the conductor 242a and the conductor 242b.

When a bottom surface of the insulator 224 is used as a reference, a bottom surface of the conductor 260 in a region where the oxide 230a and the oxide 230b do not overlap with the conductor 260 is preferably positioned at a lower level than a bottom surface of the oxide 230b is.

Although not illustrated, when the conductor 260 functioning as a gate covers, in the channel width direction, a side surface and the top surface of the oxide 230b serving as the channel formation region with the oxide 230c and the insulator 250 therebetween, electric fields generated from the conductor 260 are likely to affect the entire channel formation region formed in the oxide 230b. Thus, the on-state current of the transistor 200 can be increased and the frequency characteristics can be improved. In this specification, a transistor structure in which a channel formation region is electrically surrounded by electric fields of the conductor 260 and the conductor 205 is referred to as a surrounded channel (S-channel) structure.

The conductor 205a is preferably a conductor that inhibits passage of oxygen and impurities such as water or hydrogen. For example, titanium, titanium nitride, tantalum, or tantalum nitride can be used. Moreover, for the conductor 205b, a conductive material containing tungsten, copper, or aluminum as its main component is preferably used. Although the conductor 205 is illustrated as having two layers, a multilayer structure having three or more layers may be employed.

Here, it is preferable that an oxide semiconductor, an insulator or a conductor positioned in a layer below the oxide semiconductor, and an insulator or a conductor positioned in a layer above the oxide semiconductor be successively formed using different kinds of films without being exposed to the air, in which case a substantially highly purified intrinsic oxide semiconductor film where the concentration of impurities (in particular, hydrogen and water) is reduced can be formed.

At least one of the insulator 222, the insulator 272, and the insulator 273 preferably functions as a barrier insulating film that inhibits entry of impurities such as water or hydrogen into the transistor 200 from the substrate side or from above. Thus, at least one of the insulator 222, the insulator 272, and the insulator 273 is preferably formed using an insulating material which has a function of inhibiting diffusion of impurities (through which the impurities do not easily pass) such as a hydrogen atom, a hydrogen molecule, a water molecule, a nitrogen atom, a nitrogen molecule, a nitrogen oxide molecule (e.g., $N_2O$, $NO$, or $NO_2$), or a copper atom. Alternatively, it is preferable to use an insulating material which has a function of inhibiting diffusion of oxygen (e.g., at least one of an oxygen atom, an oxygen molecule, and the like) (through which the oxygen does not easily pass).

For example, it is preferable that the insulator 273 be formed using silicon nitride, silicon nitride oxide, or the like, and the insulator 222 and the insulator 272 be formed using aluminum oxide, hafnium oxide, or the like.

Accordingly, impurities such as water or hydrogen can be inhibited from being diffused to the transistor 200 side through the insulator 222. Alternatively, oxygen contained in the insulator 224 or the like can be inhibited from being diffused to the substrate side through the insulator 222.

Impurities such as water or hydrogen can be inhibited from being diffused into the oxide 230 and the like of the transistor 200 from the insulator 280 and the like, which are positioned above the insulator 272 and the insulator 273. In this manner, the transistor 200 is preferably surrounded by the insulator 272 and the insulator 273 having a function of inhibiting diffusion of oxygen and impurities such as water or hydrogen.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material that releases part of oxygen by heating is preferably used. An oxide that releases oxygen by heating is an oxide film in which the number of released oxygen molecules is greater than or equal to $1.0 \times 10^{18}$ molecules/cm$^{-3}$, preferably greater than or equal to $1.0 \times 10^{19}$ molecules/cm$^{-3}$, further preferably greater than or equal to $2.0 \times 10^{19}$ molecules/cm$^{-3}$ or greater than or equal to $3.0 \times 10^{20}$ molecules/cm$^{-3}$ in thermal desorption spectroscopy analysis (TDS analysis). Note that the temperature of the film surface in the TDS analysis is preferably within the range of higher than or equal to 100° C. and lower than or equal to 700° C., or higher than or equal to 100° C. and lower than or equal to 400° C.

The insulator 222 preferably functions as a barrier insulating film that inhibits entry of impurities such as water or hydrogen into the transistor 200 from the substrate side. For example, the insulator 222 preferably has lower hydrogen permeability than the insulator 224. Surrounding the insulator 224, the oxide 230, and the like by the insulator 222 and the insulator 283 can inhibit entry of impurities such as water or hydrogen into the transistor 200 from the outside.

Furthermore, it is preferable that the insulator 222 have a function of inhibiting diffusion of oxygen (e.g., at least one of an oxygen atom, an oxygen molecule, and the like) (through which the oxygen does not easily pass). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer below the insulator 222 can be reduced. Moreover, the conductor 205 can be inhibited from reacting with oxygen contained in the insulator 224 or the oxide 230.

As the insulator 222, an insulator containing an oxide of one or both of aluminum and hafnium, which is an insulating material, is preferably used. For the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen into the oxide 230 from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. In the case where the insulator 222 has stacked layers, three layers of zirconium oxide, aluminum oxide, and zirconium oxide stacked in this order, or four layers of zirconium oxide, aluminum oxide, zirconium oxide, and aluminum oxide stacked in this order can be employed, for example. As the insulator 222, a compound containing hafnium and zirconium may be employed, for example. When the semiconductor device is miniaturized and highly integrated, a dielectric used for a gate insulator and a capacitor become thin, which might cause a problem of a leakage current from a transistor and the capacitor. When a high-k material is used for an insulator functioning as a dielectric used for a gate insulator and a capacitor, a gate potential during operation of the transistor can be lowered and the capacitance of the capacitor can be assured while the physical thickness is maintained.

Note that the insulator 222 and the insulator 224 may each have a stacked-layer structure of two or more layers. In such cases, without limitation to a stacked-layer structure formed of the same material, a stacked-layer structure formed of different materials may be employed.

The oxide 243 (the oxide 243a and the oxide 243b) may be placed between the oxide 230b and the conductor 242 (the conductor 242a and the conductor 242b) which functions as the source electrode and the drain electrode. This structure in which the conductor 242 and the oxide 230b are not in contact with each other can prevent the conductor 242 from absorbing oxygen in the oxide 230b. That is, preventing oxidation of the conductor 242 can inhibit a decrease in conductivity of the conductor 242. Thus, the oxide 243 preferably has a function of inhibiting oxidation of the conductor 242.

It is preferable to place the oxide 243 having a function of inhibiting passage of oxygen between the oxide 230b and the conductor 242, which functions as the source electrode and the drain electrode, in which case the electrical resistance between the conductor 242 and the oxide 230b is reduced. Such a structure can improve the electrical characteristics of the transistor 200 and the reliability of the transistor 200.

As the oxide 243, a metal oxide containing an element M, which is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like, is preferably used. In particular, aluminum, gallium, yttrium, or tin is preferably used as the element M. The concentration of the element M is preferably higher in the oxide 243 than in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably greater than or equal to 0.5 nm and less than or equal to 5 nm, further preferably greater than or equal to 1 nm and less than or equal to 3 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can be inhibited in some cases.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly possible that oxidation of the conductor 242 lowers the conductivity of the conductor 242. Note that diffusion of oxygen in the oxide 230 into the conductor 242 can be rephrased as absorption of oxygen in the oxide 230 by the conductor 242.

When oxygen in the oxide 230 diffuses into the conductor 242 (the conductor 242a and the conductor 242b), another layer is sometimes formed between the conductor 242a and the oxide 230b, and between the conductor 242b and the oxide 230b. The layer contains more oxygen than the conductor 242 and thus the layer presumably has an insulating property. In this case, a three-layer structure of the conductor 242, the layer, and the oxide 230b can be regarded as a three-layer structure of metal-insulator-semiconductor and is sometimes referred to as an MIS (Metal-Insulator-Semiconductor) structure or a diode junction structure having an MIS structure as its main part.

The above-described layer is not necessarily formed between the conductor 242 and the oxide 230b, and the layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above-described metal element; an alloy containing a combination of the above-described metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 272 is provided in contact with a top surface of the conductor 242 and preferably functions as a barrier layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 preferably has a function of inhibiting diffusion of oxygen. For example, the insulator 272 preferably has a function of inhibiting diffusion of oxygen more than the insulator 280 does. An insulator containing an oxide of one or both of aluminum and hafnium is preferably formed as the insulator 272, for example. An insulator containing aluminum nitride may be used as the insulator 272, for example.

As illustrated in FIG. 14A, the insulator 272 is in contact with part of a top surface of the conductor 242a, a side surface of the conductor 242a, part of a top surface of the conductor 242b, and a side surface of the conductor 242b. The insulator 273 is placed over the insulator 272. With such a structure, oxygen added to the insulator 280 can be inhibited from being absorbed by the conductor 242.

The insulator 250 functions as a gate insulator. The insulator 250 is preferably placed in contact with a top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be effectively supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above-described metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

The conductor 260 is illustrated to have a two-layer structure in FIG. 14A, but may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of the above-described conductive material and titanium or titanium nitride.

<Transistor 300>

The transistor 300 is described with reference to FIG. 14B. The transistor 300 is provided on the semiconductor substrate 311 and includes a conductor 316 functioning as a gate, an insulator 315 functioning as a gate insulator, a semiconductor region 313 formed of a part of the semiconductor substrate 311, and a low-resistance region 314a and a low-resistance region 314b functioning as the source region and the drain region. The transistor 300 may be a p-channel transistor or an n-channel transistor.

As the semiconductor substrate 311, a single crystal substrate or a silicon substrate is preferably used, for example.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 14B:
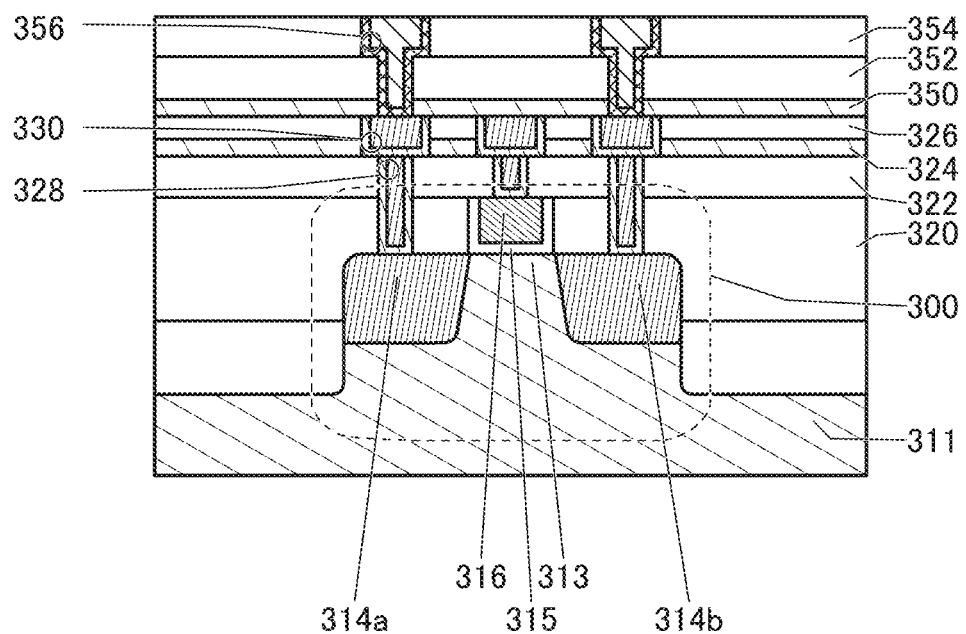

Here, in the transistor 300 illustrated in FIG. 14B, the semiconductor region 313 (part of the semiconductor substrate 311) where a channel is formed has a projecting shape. In addition, the conductor 316 is provided to cover a side surface and a top surface of the semiconductor region 313 with the insulator 315 therebetween. Note that a material adjusting the work function may be used for the conductor 316. The transistor 300 having such a structure is also referred to as a FIN transistor because the projecting portion of the semiconductor substrate 311 is utilized. Note that an insulator functioning as a mask for forming the projecting portion may be included in contact with an upper portion of the projecting portion. Although the case where the projecting portion is formed by processing part of the semiconductor substrate 311 is described here, a semiconductor film having a projecting shape may be formed by processing an SOI substrate.

Note that the transistor 300 illustrated in FIG. 11 and FIG. 14B is an example and the structure is not limited thereto; an appropriate transistor is used in accordance with a circuit configuration or a driving method. For example, in the case where the semiconductor device is a single-polarity circuit using only OS transistors (which represents a circuit with transistors having the same polarity, e.g., only n-channel transistors), the transistor 300 has a structure similar to the structure of the transistor 200T using an oxide semiconductor, for example. In this case, another substrate may be used instead of the semiconductor substrate 311 that employs a single crystal substrate, a silicon substrate, or the like.

Specific examples of the substrate include an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. The examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, paper, and the like.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

The insulator 324 is preferably formed using a film having a barrier property that prevents diffusion of hydrogen and impurities from the semiconductor substrate 311, the transistor 300, or the like into a region where the transistor 200T, the transistor 200M, or the like is provided.

For the film having a barrier property against hydrogen, silicon nitride deposited by a CVD method can be used, for example. Here, diffusion of hydrogen into a semiconductor element including an oxide semiconductor, such as the transistor 200T, the transistor 200M, or the like, degrades the characteristics of the semiconductor element in some cases. Therefore, it is preferable to provide a film that inhibits diffusion of hydrogen between the transistor 300 and the transistor 200T, the transistor 200M, or the like. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for the interlayer film, the parasitic capacitance generated between wirings can be reduced.

In addition, a conductor 328, a conductor 330, and the like that are sometimes connected to the transistor 200T, the transistor 200M, or the like are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce the wiring resistance.

A wiring layer may be provided over the insulator 326 and the conductor 330. For example, in FIG. 14B, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably includes a conductor having a barrier property against hydrogen. In particular, the conductor having a barrier property against hydrogen is formed in an opening portion of the insulator 350 having a barrier property against hydrogen. In such a structure, the transistor 300 can be separated from the transistor 200T, the transistor 200M, and the like by a barrier layer, so that the diffusion of hydrogen from the transistor 300 into the transistor 200T, the transistor 200M, or the like can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of the wiring is maintained. In that case, a structure is preferable in which a tantalum nitride layer having a barrier property against hydrogen is in contact with the insulator 350 having a barrier property against hydrogen.

<Memory Device 420>

Figure 15A:
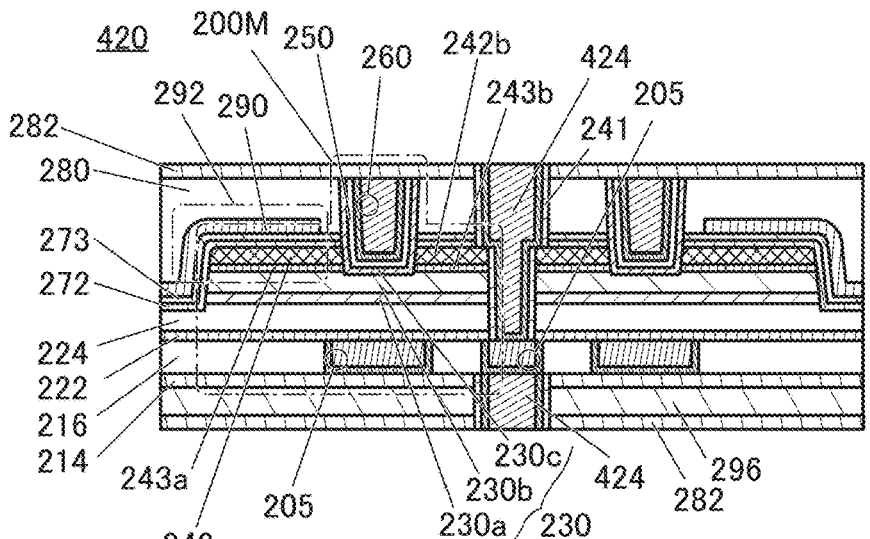
FIG. 15A to FIG. 15C are schematic cross-sectional views each illustrating a structure example of a semiconductor device.

Next, the memory device 420 illustrated in FIG. 11 is described with reference to FIG. 15A. As for the transistor 200M included in the memory device 420, the description overlapping with that of the transistor 200 is omitted.

In the memory device 420, the conductor 242a of the transistor 200M functions as one electrode of the capacitor 292, and the insulator 272 and the insulator 273 function as a dielectric. A conductor 290 is provided to overlap with part of the conductor 242a with the insulator 272 and the insulator 273 sandwiched therebetween and functions as the other electrode of the capacitor 292. The conductor 290 may be used as the other electrode of the capacitor 292 included in an adjacent memory device 420. Alternatively, the conductor 290 may be electrically connected to the conductor 290 included in an adjacent memory device 420.

The conductor 290 is provided on not only the top surface of the conductor 242a but also the side surface of the conductor 242a with the insulator 272 and the insulator 273 sandwiched therebetween. This is preferable because the capacitor 292 can have a larger capacitance than the capacitance obtained depending on the area where the conductor 242a and the conductor 290 overlap with each other.

The conductor 424 is electrically connected to the conductor 242b and is electrically connected to the conductor 424 positioned in a lower layer through the conductor 205.

As a dielectric of the capacitor 292, silicon nitride, silicon nitride oxide, aluminum oxide, hafnium oxide, or the like can be used. Furthermore, these materials can be stacked. In the case where the dielectric of the capacitor 292 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide, or aluminum oxide may be stacked over silicon nitride.

As the dielectric of the capacitor 292, zirconium oxide having a higher permittivity than the above-described materials may be used. As the dielectric of the capacitor 292, a single layer of zirconium oxide may be used, or zirconium oxide may be used in part of stacked layers. For example, stacked layers of zirconium oxide and aluminum oxide can be used. Furthermore, the dielectric of the capacitor 292 may be three stacked layers; zirconium oxide may be used as the first layer and the third layer and aluminum oxide may be used as the second layer between the first layer and the third layer.

When zirconium oxide having a high permittivity is used as the dielectric of the capacitor 292, the area occupied by the capacitor 292 in the memory device 420 can be reduced. Thus, the area necessary for the memory device 420 can be reduced, and the bit cost can be improved, which is preferable.

For the conductor 290, any of the materials that can be used for the conductor 205, the conductor 242, the conductor 260, the conductors 424, and the like can be used.

This embodiment shows an example where the transistors 200M and the capacitors 292 are each symmetrically placed with the conductor 424 sandwiched therebetween. When a pair of transistors 200M and a pair of capacitors 292 are placed in this manner, the number of conductors 424 electrically connected to the transistors 200M can be reduced. This is preferable because the area necessary for the memory device 420 can be reduced and the bit cost can be improved.

In the case where the insulator 241 is provided on the side surface of the conductor 424, the conductor 424 is connected to at least part of the top surface of the conductor 242*b*.

With the use of the conductors 424 and the conductor 205, the transistor 200T and the memory device 420 in the memory unit 470 can be electrically connected to each other.

Modification Example 1 of Memory Device 420

Figure 15B:
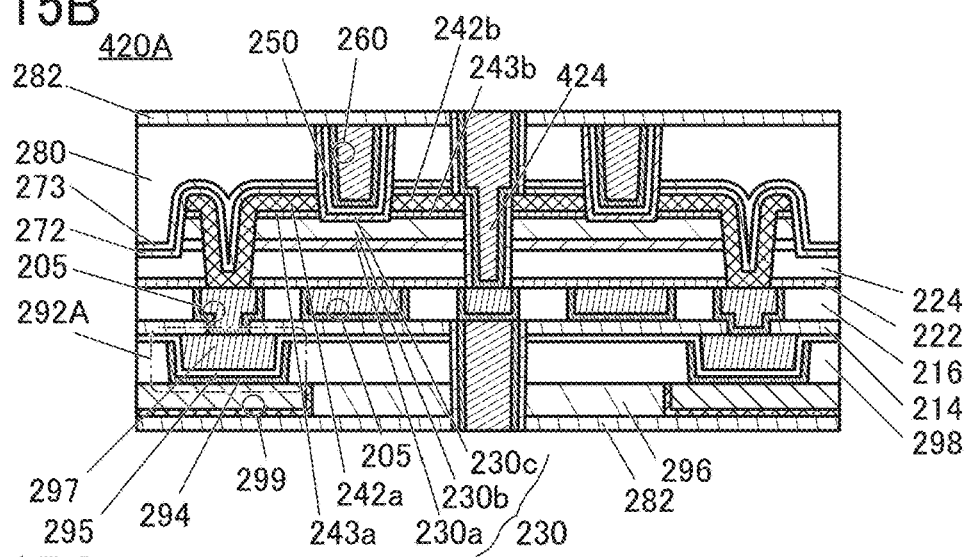

Next, with reference to FIG. 15B, a memory device 420A is described as a modification example of the memory device 420. The memory device 420A includes the transistor 200M and a capacitor 292A electrically connected to the transistor 200M. The capacitor 292A is provided below the transistor 200M.

In the memory device 420A, the conductor 242*a* is placed in an opening that is provided in the oxide 243*a*, the oxide 230*b*, the oxide 230*a*, the insulator 224, and the insulator 222 and is electrically connected to the conductor 205 at a bottom portion of the opening. The conductor 205 is electrically connected to the capacitor 292A.

The capacitor 292A includes a conductor 294 functioning as one of electrodes, an insulator 295 functioning as a dielectric, and a conductor 297 functioning as the other of the electrodes. The conductor 297 overlaps with the conductor 294 with the insulator 295 sandwiched therebetween. Furthermore, the conductor 297 is electrically connected to the conductor 205.

The conductor 294 is provided in a bottom portion and on a side surface of an opening formed in an insulator 298 provided over the insulator 296, and the insulator 295 is provided so as to cover the insulator 298 and the conductor 294. Furthermore, the conductor 297 is provided so as to be embedded in a depression portion that the insulator 295 has.

Furthermore, a conductor 299 is provided so as to be embedded in the insulator 296, and the conductor 299 is electrically connected to the conductor 294. The conductor 299 may be electrically connected to the conductor 294 of an adjacent memory device 420A.

The conductor 297 is also provided on not only a top surface of the conductor 294 but also a side surface of the conductor 294 with the insulator 295 sandwiched therebetween. This is preferable because the capacitor 292A can have a larger capacitance than the capacitance obtained depending on the area where the conductor 294 and the conductor 297 overlap with each other.

As the insulator 295 functioning as a dielectric of the capacitor 292A, silicon nitride, silicon nitride oxide, aluminum oxide, hafnium oxide, or the like can be used. Furthermore, these materials can be stacked. In the case where the insulator 295 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide, or aluminum oxide may be stacked over silicon nitride.

As the insulator 295, zirconium oxide having a higher permittivity than the above-described materials may be used. As the insulator 295, a single layer of zirconium oxide may be used, or zirconium oxide may be used in part of stacked layers. For example, stacked layers of zirconium oxide and aluminum oxide can be used. Furthermore, the insulator 295 may be three stacked layers; zirconium oxide may be used as the first layer and the third layer and aluminum oxide may be used as the second layer between the first layer and the third layer.

When zirconium oxide having a high permittivity is used for the insulator 295, the area occupied by the capacitor 292A in the memory device 420A can be reduced. Thus, the area necessary for the memory device 420A can be reduced, and the bit cost can be improved, which is preferable.

For the conductor 297, the conductor 294, and the conductor 299, any of the materials that can be used for the conductor 205, the conductor 242, the conductor 260, the conductors 424, and the like can be used.

Furthermore, as the insulator 298, any of the materials that can be used for the insulator 214, the insulator 216, the insulator 224, the insulator 280, and the like can be used.

Modification Example 2 of Memory Device 420

Figure 15C:
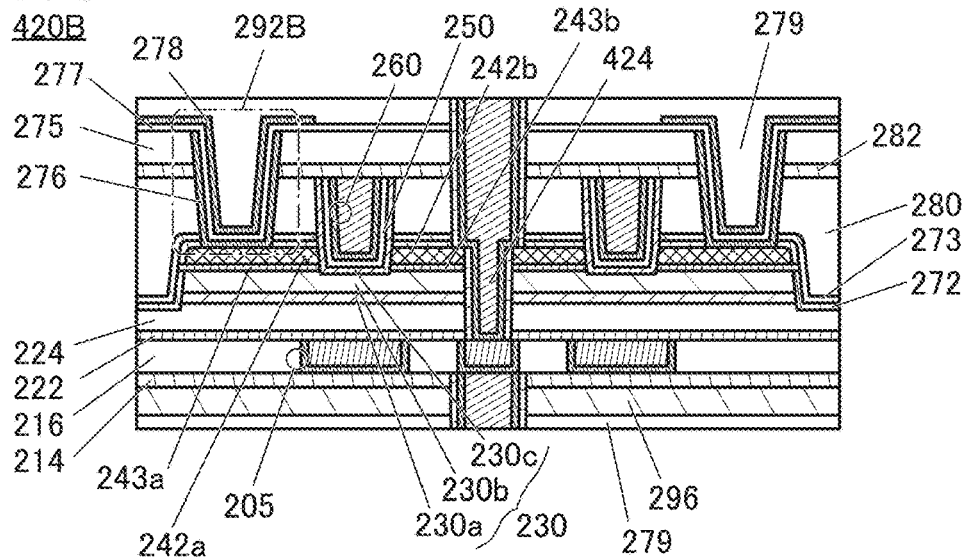

Next, with reference to FIG. 15C, a memory device 420B is described as a modification example of the memory device 420. The memory device 420B includes the transistor 200M and a capacitor 292B electrically connected to the transistor 200M. The capacitor 292B is provided above the transistor 200M.

The capacitor 292B includes a conductor 276 functioning as one of electrodes, an insulator 277 functioning as a dielectric, and a conductor 278 functioning as the other of the electrodes. The conductor 278 overlaps with the conductor 276 with the insulator 277 sandwiched therebetween.

An insulator 275 is provided over the insulator 282, and the conductor 276 is provided in a bottom portion and on a side surface of an opening formed in the insulator 275, the insulator 282, the insulator 280, the insulator 273, and the insulator 272. The insulator 277 is provided so as to cover the insulator 282 and the conductor 276. Furthermore, the conductor 278 is provided so as to overlap with the conductor 276 in a depression portion that the insulator 277 has, and at least part of the conductor 278 is provided over the insulator 275 with the insulator 277 therebetween. The conductor 278 may be used as the other of the electrodes of the capacitor 292B included in an adjacent memory device 420B. Alternatively, the conductor 278 may be electrically connected to the conductor 278 included in an adjacent memory device 420B.

The conductor 278 is provided on not only a top surface of the conductor 276 but also a side surface of the conductor 276 with the insulator 277 sandwiched therebetween. This is preferable because the capacitor 292B can have a larger capacitance than the capacitance obtained depending on the area where the conductor 276 and the conductor 278 overlap with each other.

An insulator 279 may be provided so as to fill the depression portion that the conductor 278 has.

As the insulator 277 functioning as a dielectric of the capacitor 292B, silicon nitride, silicon nitride oxide, aluminum oxide, hafnium oxide, or the like can be used. Furthermore, these materials can be stacked. In the case where the insulator 277 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide, or aluminum oxide may be stacked over silicon nitride.

As the insulator 277, zirconium oxide having a higher permittivity than the above-described materials may be used. As the insulator 277, a single layer of zirconium oxide may be used, or zirconium oxide may be used in part of stacked layers. For example, stacked layers of zirconium oxide and aluminum oxide can be used. Furthermore, the insulator 277 may be three stacked layers; zirconium oxide may be used as the first layer and the third layer and aluminum oxide may be used as the second layer between the first layer and the third layer.

When zirconium oxide having a high permittivity is used for the insulator 277, the area occupied by the capacitor 292B in the memory device 420B can be reduced. Thus, the area necessary for the memory device 420B can be reduced, and the bit cost can be improved, which is preferable.

For the conductor 276 and the conductor 278, any of the materials that can be used for the conductor 205, the conductor 242, the conductor 260, the conductors 424, and the like can be used.

Furthermore, for the insulator 275 and the insulator 279, any of the materials that can be used for the insulator 214, the insulator 216, the insulator 224, the insulator 280, and the like can be used.

Modification Example 3 of Memory Device

Figure 16:
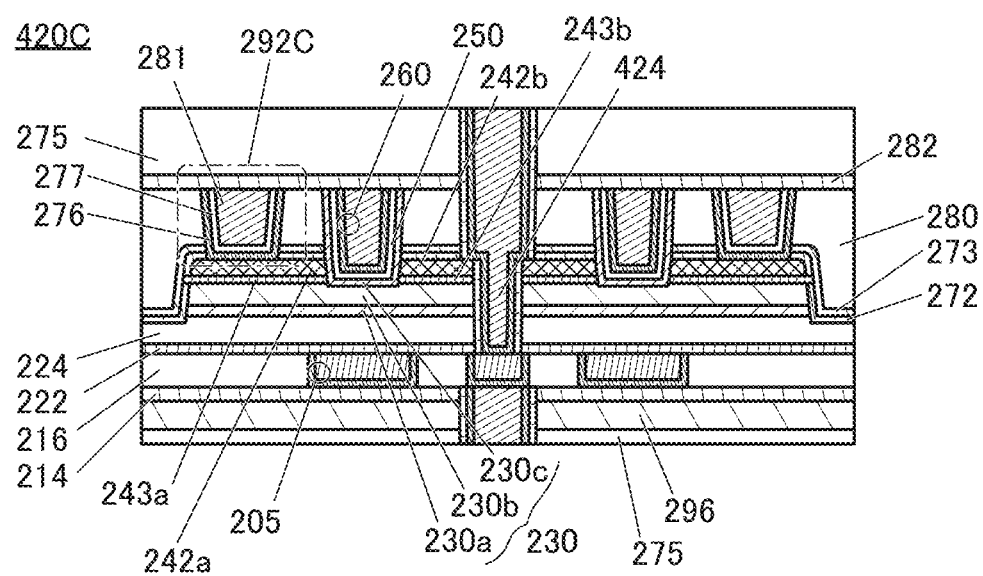
FIG. 16 is a schematic cross-sectional view illustrating a structure example of a semiconductor device.

Next, with reference to FIG. 16, a memory device 420C is described as a modification example of the memory device 420. The memory device 420C includes the transistor 200M and a capacitor 292C electrically connected to the transistor 200M. The capacitor 292C is provided above the transistor 200M.

The capacitor 292C includes the conductor 276 functioning as one of electrodes, the insulator 277 functioning as a dielectric, and a conductor 281 functioning as the other of the electrodes. The conductor 281 overlaps with the conductor 276 with the insulator 277 sandwiched therebetween.

The insulator 275 is provided over the insulator 282. The conductor 276 is provided in a bottom portion and on a side surface of an opening formed in the insulator 280, the insulator 273, and the insulator 272. The insulator 277 is provided to cover the conductor 276. Furthermore, the conductor 281 is provided to overlap with the conductor 276 in a depression portion of the insulator 277. The conductor 281 may be electrically connected to the conductor 281 included in an adjacent memory device 420B (not illustrated in FIG. 16).

Note that the opening in which the insulator 280, the insulator 273, and the insulator 272 are provided may be formed concurrently with the opening in which the conductor 260, the insulator 250, and the oxide 230c are provided. This can shorten the manufacturing process of the memory device 420C in some cases.

The insulator 277 functioning as the dielectric of the capacitor 292C can be formed using a material that can be used for the insulator 277 functioning as the dielectric of the capacitor 292B, for example.

For the conductor 276 and the conductor 281, any of the materials that can be used for the conductor 205, the conductor 242, the conductor 260, the conductors 424, and the like can be used.

Furthermore, for the insulator 275, any of the materials that can be used for the insulator 214, the insulator 216, the insulator 224, the insulator 280, and the like can be used.

5<Connection between memory device 420 and transistor 200T>

In a region 422 surrounded by a dashed-dotted line in FIG. 11, the memory device 420 is electrically connected to the gate of the transistor 200T through the conductor 424 and the conductor 205; however, this embodiment is not limited thereto.

Figure 17:
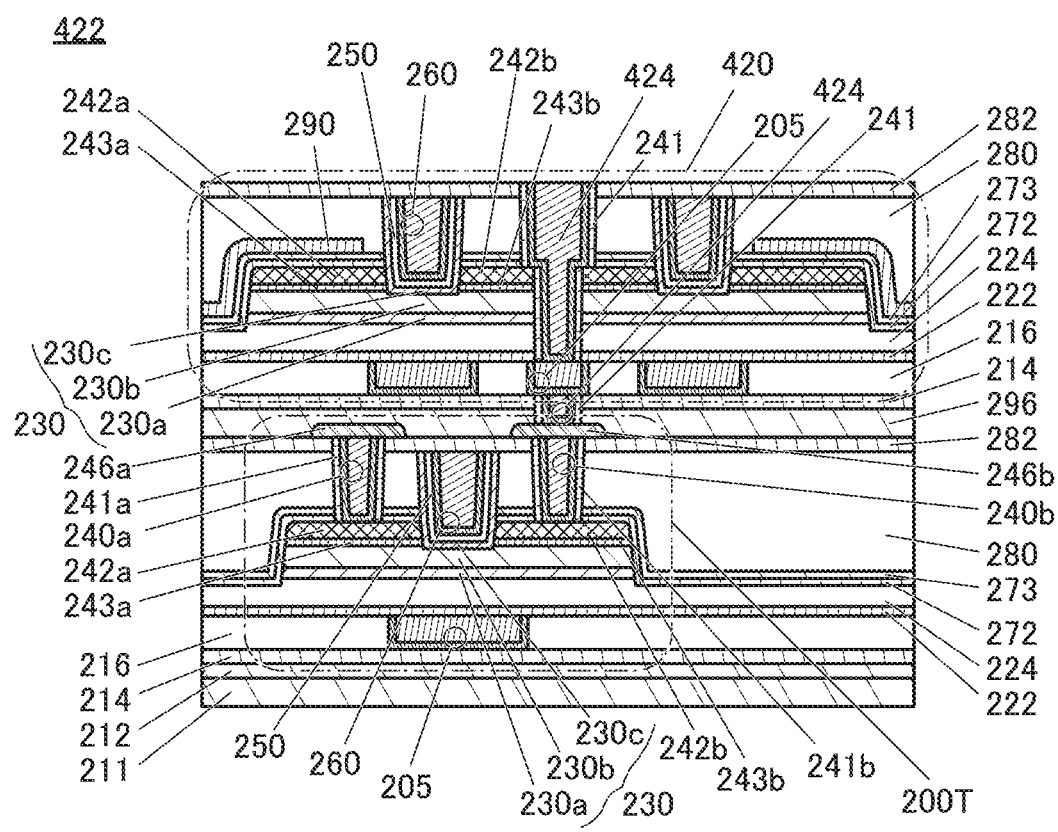
FIG. 17 is a schematic cross-sectional view illustrating a structure example of a semiconductor device.

FIG. 17 illustrates an example where the memory device 420 is electrically connected to the conductor 242b functioning as one of the source and the drain of the transistor 200T through the conductor 424, the conductor 205, the conductor 246b, and the conductor 240b. Since FIG. 17 illustrates a structure in which a plurality of transistors are stacked, the components of the transistors are denoted by the same reference numerals in some cases.

Thus, the method for connecting the memory device 420 and the transistor 200T can be determined in accordance with the function of the circuit included in the transistor layer 413.

Figure 18:
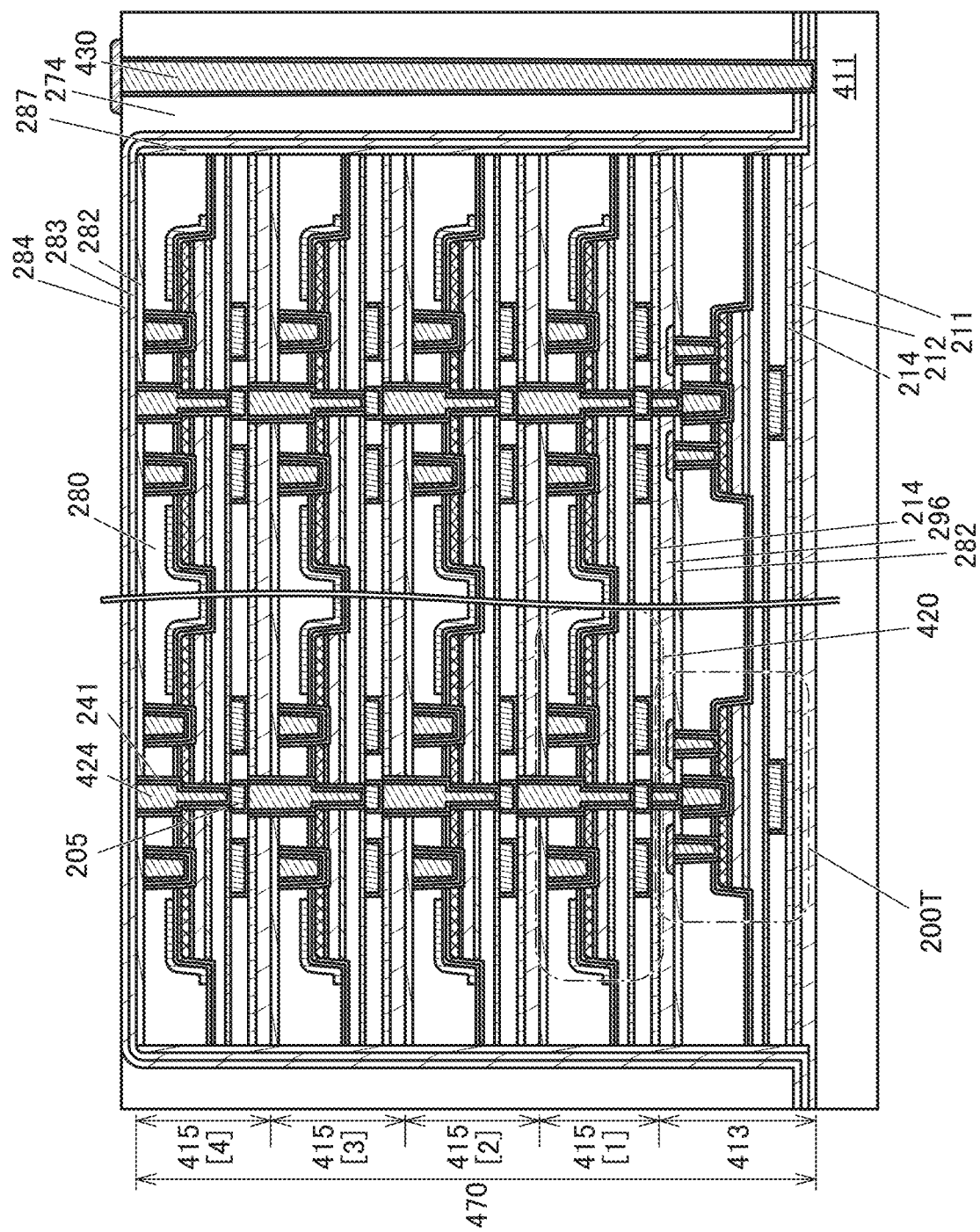
FIG. 18 is a schematic cross-sectional view illustrating a structure example of a semiconductor device.

FIG. 18 illustrates an example where the memory unit 470 includes the transistor layer 413 including the transistor 200T and four memory device layers 415 (the memory device layer 415[1] to the memory device layer 415[4]).

The memory device layer 415[1] to the memory device layer 415[4] each include a plurality of memory devices 420.

The memory device 420 is electrically connected to the memory devices 420 included in different memory device layers 415 and the transistor 200T included in the transistor layer 413 through the conductors 424 and the conductors 205.

The memory unit 470 is sealed by the insulator 211, the insulator 212, the insulator 214, the insulator 287, the insulator 282, the insulator 283, and the insulator 284. The insulator 274 is provided in the periphery of the insulator 284. Furthermore, the conductor 430 is provided in the insulator 274, the insulator 284, the insulator 283, and the insulator 211 and is electrically connected to the element layer 411.

The insulator 280 is provided in the sealing structure. As in the description of the transistor 200, the insulator 280 preferably has a function of releasing oxygen by heating. In addition, the insulator 280 preferably includes an excess-oxygen region.

As in the description of the sealing structure, the insulator 211, the insulator 283, and the insulator 284 are suitably a material having a high barrier property against hydrogen. Specifically, silicon nitride, silicon nitride oxide, or the like can be used for the insulator 211, the insulator 283, and the insulator 284, for example. The insulator 214, the insulator 282, and the insulator 287 are suitably a material having a function of capturing or fixing hydrogen. Specifically, aluminum oxide, hafnium oxide, an oxide containing aluminum and hafnium (hafnium aluminate), gallium oxide, indium gallium zinc oxide, or the like can be used for the insulator 214, the insulator 282, and the insulator 287.

Note that materials for the insulator 211, the insulator 212, the insulator 214, the insulator 287, the insulator 282, the insulator 283, and the insulator 284 may have an amorphous or crystalline structure, although the crystal structure of the materials is not particularly limited. For example, an amorphous aluminum oxide film is suitably used as the material having a function of capturing or fixing hydrogen. Amorphous aluminum oxide may capture or fix hydrogen more than aluminum oxide having high crystallinity.

Here, as the model of excess oxygen in the insulator 280 with respect to diffusion of hydrogen from an oxide semiconductor in contact with the insulator 280, the following model can be given.

Hydrogen existing in the oxide semiconductor diffuses into another structure body through the insulator 280 in contact with the oxide semiconductor. The hydrogen diffuses in such a manner that excess oxygen in the insulator 280 reacts with the hydrogen in the oxide semiconductor to form an OH bond, which diffuses through the insulator 280. The hydrogen atom having the OH bond reacts with the oxygen atom bonded to an atom (e.g., a metal atom or the like) in the insulator 282 when reaching a material having a function of capturing or fixing hydrogen (typically the insulator 282), and is captured or fixed in the insulator 282. The oxygen atom which had the OH bond of the excess oxygen is assumed to remain as excess oxygen in the insulator 280. In short, the excess oxygen in the insulator 280 probably serves a bridge linking role in diffusing the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment time is one hour or more, preferably four hours or more, further preferably eight hours or more.

The heat treatment enables diffusion of hydrogen from the oxide semiconductor to the outside through the insulator 280, the insulator 282, and the insulator 287. This can reduce the absolute amount of hydrogen in and in the vicinity of the oxide semiconductor.

The insulator 283 and the insulator 284 are formed after the heat treatment. Since the insulator 283 and the insulator 284 are materials having a high barrier property against hydrogen, the insulator 283 and the insulator 284 can inhibit hydrogen diffused to the outside or external hydrogen from entering the inside, specifically, the oxide semiconductor or the insulator 280 side.

Although the structure in which the heat treatment is performed after the insulator 282 is formed is described as an example, one embodiment of the present invention is not limited thereto. For example, the above-described heat treatment may be performed after formation of the transistor layer 413 or after formation of the memory device layer 415[1] to the memory device layer 415[3]. When hydrogen is diffused to the outside by the above-described heat treatment, hydrogen is diffused to above the transistor layer 413 or in the lateral direction. Similarly, in the case where the heat treatment is performed after the formation of the memory device layer 415[1] to the memory device layer 415[3], hydrogen is diffused to above or in the lateral direction.

The insulator 211 and the insulator 283 are bonded through the above manufacturing process, whereby the above-described sealing structure are formed.

The above-described structure and manufacturing process enable a semiconductor device using an oxide semiconductor with reduced hydrogen concentration to be provided. Accordingly, a highly reliable semiconductor device can be provided. With one embodiment of the present invention, a semiconductor device having favorable electrical characteristics can be provided.

Figure 19A:
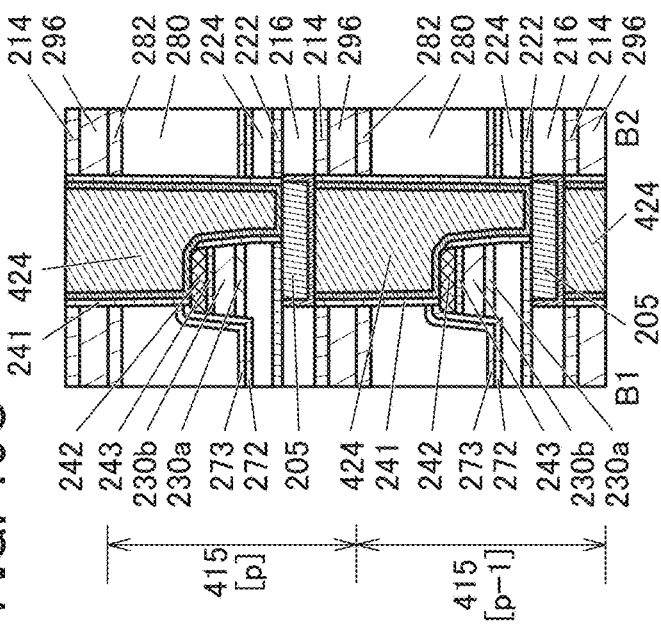
FIG. 19A is a schematic top view illustrating a structure example of a semiconductor device.
Figure 19B:
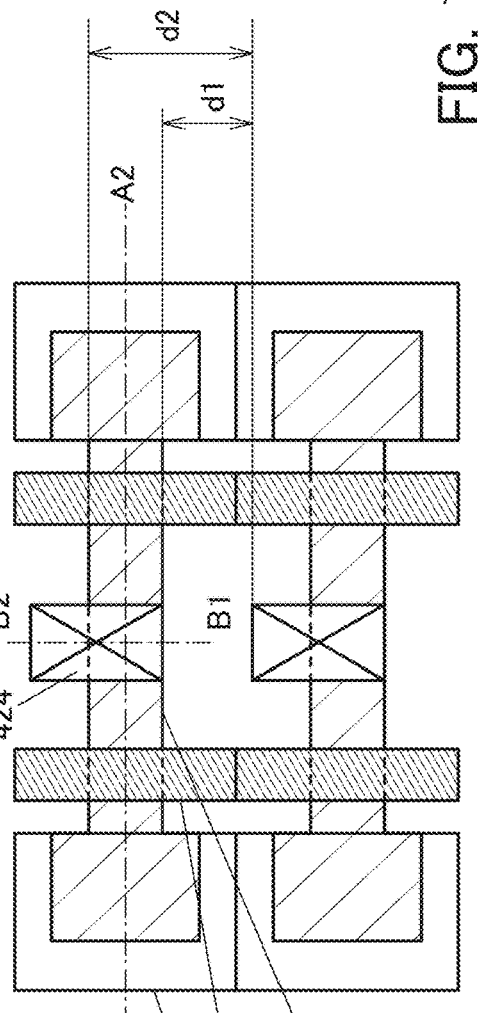
FIG. 19B and FIG. 19C are schematic cross-sectional views illustrating the structure example of the semiconductor device.
Figure 19C:
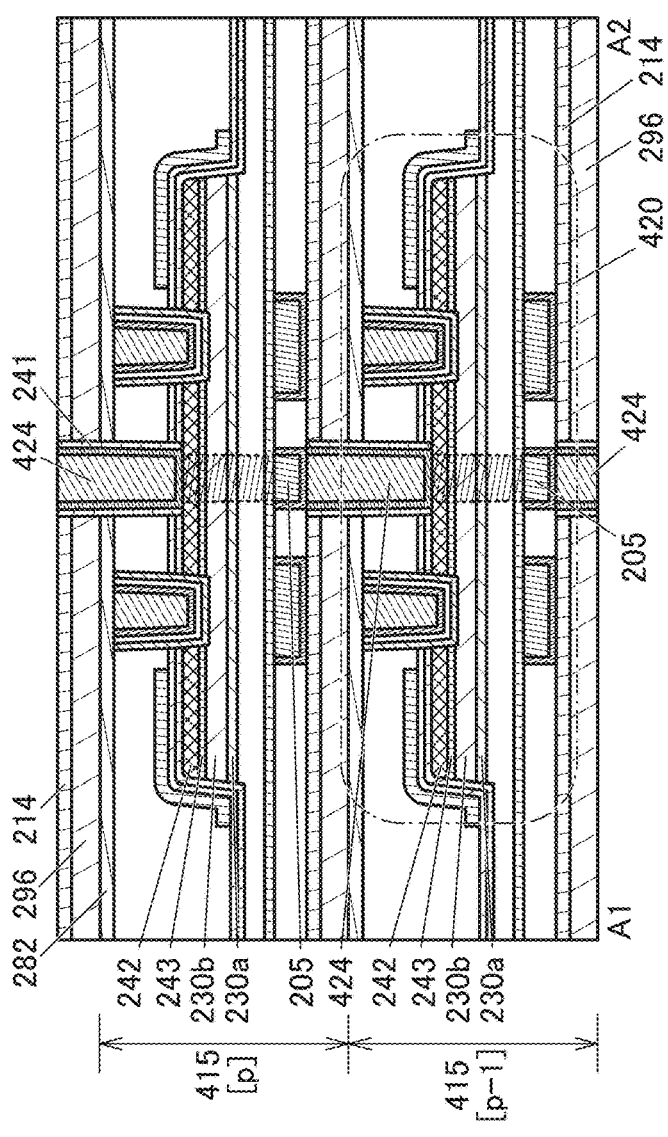

FIG. 19A to FIG. 19C are diagrams illustrating an example that is different in the arrangement of the conductors 424. FIG. 19A illustrates a top view of the memory device 420, FIG. 19B is a cross-sectional view of a portion indicated by a dashed-dotted line A1-A2 in FIG. 19A, and FIG. 19C is a cross-sectional view of a portion indicated by a dashed-dotted line B1-B2 in FIG. 19A. In FIG. 19A, the conductor 205 is not illustrated to facilitate understanding of the drawing. In the case where the conductor 205 is provided, the conductor 205 includes a region overlapping with the conductor 260 and the conductor 424.

As illustrated in FIG. 19A, an opening where the conductor 424 is provided, i.e., the conductor 424, is provided not only in a region overlapping with the oxide 230a and the oxide 230b but also outside the oxide 230a and the oxide 230b. FIG. 19A illustrates an example where the conductor 424 is provided in a region not overlapping with the oxide 230a and the oxide 230b on the B2 side; however, this embodiment is not limited thereto. The conductor 424 may be provided in a region not overlapping with the oxide 230a and the oxide 230b on the B1 side, or may be provided in regions not overlapping with the oxide 230a and the oxide 230b on both the B1 side and the B2 side.

FIG. 19B and FIG. 19C illustrate an example where the memory device layer 415[p] is stacked over the memory device layer 415[p−1] (p is a natural number greater than or equal to 2 and less than or equal to n). The memory device 420 included in the memory device layer 415[p−1] is electrically connected to the memory device 420 included in the memory device layer 415[p] through the conductor 424 and the conductor 205.

FIG. 19B illustrates an example where in the memory device layer 415[p−1], the conductor 424 is connected to the conductor 242 of the memory device layer 415[p−1] and the conductor 205 of the memory device layer 415[p]. Here, the conductor 424 is also connected to the conductor 205 of the memory device layer 415[p−1] at the outside on the B2 side of the conductor 242, the oxide 243, the oxide 230b, and the oxide 230a.

As illustrated in FIG. 19C, the conductor 424 is formed along the side surfaces on the B2 side of the conductor 242, the oxide 243, the oxide 230b, and the oxide 230a, and is electrically connected to the conductor 205 through an opening formed in the insulator 280, the insulator 273, the insulator 272, the insulator 224, and the insulator 222. Here, an example where the conductor 424 is provided along the side surfaces on the B2 side of the conductor 242, the oxide 243, the oxide 230b, and the oxide 230a is indicated by a dotted line in FIG. 19B. Furthermore, the insulator 241 is formed between the conductor 424 and the side surfaces on the B2 side of the conductor 242, the oxide 243, the oxide 230b, the oxide 230a, the insulator 224, and the insulator 222, in some cases.

Provision of the conductor 424 in a region not overlapping with the conductor 242 or the like allows the memory device 420 to be electrically connected to the memory device 420 provided in another memory device layer 415. In addition, the memory device 420 can also be electrically connected to the transistor 200T provided in the transistor layer 413.

Furthermore, when the conductor 424 serves as a bit line, provision of the conductor 424 in a region not overlapping with the conductor 242 or the like can increase the distance between bit lines of the memory devices 420 that are adjacent to each other in the B1-B2 direction. As illustrated in FIG. 19, the distance between the conductors 424 over the conductors 242 is d1; the distance between the conductors 424 positioned below the oxide 230a, that is, in an opening formed in the insulator 224 and the insulator 222 is d2; and d2 is larger than d1. The parasitic capacitance of the conductors 424 can be reduced when the distance is partly d2 compared with the case where the distance between the conductors 424 that are adjacent to each other in the B1-B2 direction is d1. The reduction of the parasitic capacitance of the conductors 424 is preferable to reduce the capacitance necessary for the capacitor 292.

In the memory device 420, the conductor 424 functioning as a common bit line for two memory cells is provided. The cell size of each memory cell can be reduced by appropriately adjusting the permittivity of the dielectric used in the capacitor or the parasitic capacitance between bit lines. Here, the estimation of the cell size, the bit density, and the bit cost of the memory cell when the channel length is 30 nm (also referred to as 30 nm node) is described. In FIG. 20A to FIG. 20D described below, the conductor 205 is not illustrated to facilitate understanding of the drawings. In the case where the conductor 205 is provided, the conductor 205 includes a region overlapping with the conductor 260 and the conductor 424. FIG. 20A illustrates an example where hafnium oxide with a thickness of 10 nm and 1-nm silicon oxide thereover are stacked as the dielectric of the capacitor; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 432 obtained in this manner is referred to as a cell A.

The cell size of the cell A is 45.25F$^2$.

FIG. 20B illustrates an example where a first zirconium oxide, an aluminum oxide thereover, and a second zirconium oxide thereover are stacked as the dielectric of the capacitor; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 433 obtained in this manner is referred to as a cell B.

The dielectric used for the capacitor of the cell B has a higher permittivity than that for the cell A; thus, the area of the capacitor can be reduced in the cell B. Therefore, the cell size of the cell B can be reduced compared with that of the cell A. The cell size of the cell B is 25.53F$^2$.

The cell A and the cell B correspond to the memory cells included in the memory device 420, the memory device 420A, or the memory device 420B illustrated in FIG. 11, FIG. 15A to FIG. 15C, and FIG. 17.

FIG. 20C illustrates an example where a first zirconium oxide, an aluminum oxide thereover, and a second zirconium oxide thereover are stacked as the dielectric of the capacitor; the conductor 242, the oxide 243, the oxide 230a, and the oxide 230b included in the memory device 420 are shared by the memory cells; and the conductor 424 functioning as the bit line is provided so as to overlap with a portion overlapping with the conductor 242 and a portion outside the conductor 242. A memory cell 434 obtained in this manner is referred to as a cell C.

The distance between the conductors 424 in the cell C is longer below the oxide 230a than above the conductor 242. Therefore, the parasitic capacitance of the conductors 424 can be reduced and the area of the capacitors can be reduced. Furthermore, the conductor 242, the oxide 243, the oxide 230a, and the oxide 230b are not provided with a slit. Thus, the cell size can be reduced in the cell C compared with the cell A and the cell B. The cell size of the cell C is 17.20F$^2$.

FIG. 20D illustrates an example where the conductor 205 and the insulator 216 are not provided in the cell C. Such a memory cell 435 is referred to as a cell D.

Since the conductor 205 and the insulator 216 are not provided in the cell D, the memory device 420 can be thinned. Therefore, the memory device layer 415 including the memory device 420 can be thinned, so that the height of the memory unit 470 in which the memory device layers 415 are stacked can be reduced. When the conductors 424 and the conductors 205 are regarded as a bit line, the bit line can be shortened in the memory unit 470. The shortened bit line can reduce the parasitic load in the bit line and further reduce the parasitic capacitance of the conductors 424; accordingly, the area of the capacitor can be reduced. In addition, the conductor 242, the oxide 243, the oxide 230a, and the oxide 230b are not provided with a slit. Thus, the cell size of the cell D can be reduced compared with the cell A, the cell B, and the cell C. The cell size of the cell D is 15.12F$^2$.

The cell C and the cell D correspond to the memory cell included in the memory device 420 illustrated in FIG. 19A to FIG. 19C.

Here, the bit density and the bit cost $C_b$ of the cell A to the cell D and a cell E, which is the cell D capable of multilevel storage, were estimated. Moreover, the estimated bit density and bit cost were compared with expected values of bit density and bit cost of currently commercially available DRAMs.

The bit cost $C_b$ in the semiconductor device of one embodiment of the present invention was estimated using the following formula.

[Formula 1]

$$C_b = \frac{(P_C + n \times P_S)}{n} \times \frac{D_d}{D_{3d}} \times \frac{1}{P_d} \quad (1)$$

Here, n is the number of stacked memory device layers, $P_c$ is the number of patterning times mainly for the element layer 411 as a common portion, $P_s$ is the number of patterning times per memory device layer 415 and transistor layer 413, $D_d$ is the bit density of a DRAM, $D_{3d}$ is the bit density of one memory device layer 415, and $P_d$ is the number of patterning times for a DRAM. Note that $P_d$ includes the number of times increased by scaling.

Table 2 shows expected values of bit density of commercially available DRAMs and estimated bit density of semiconductor devices of one embodiment of the present invention. Note that two types of commercially available DRAMs with process nodes of 18 nm and 1X nm were used. As for the semiconductor devices of one embodiment of the present invention, the process node was 30 nm and the number of stacked memory device layers in the cell A to the cell E was ten layers, twenty layers, and forty layers; thus, the estimation was performed.

TABLE 2

| | DRAM | | Memory device of one embodiment of the present invention | | |
|---|---|---|---|---|---|
| Manufacturer | Company A | Company B | — | | |
| Process node | 18 nm | 1X nm | 30 nm | | |
| Number of layers stacked | — | — | 10 | 20 | 40 |
| Bit density [Gb/mm$^2$] | 0.19 (*) | 0.14 (*) | Cell A  0.05
Cell B  0.09
Cell C  0.13
Cell D  0.15
Cell E  0.30 | 0.10
0.17
0.23
0.29
0.59 | 0.20
0.35
0.52
0.59
1.18 |

(*) represents an unexpected value

Table 3 shows the results of estimation of the relative bit cost of the semiconductor devices of one embodiment of the present invention from the bit cost of the commercially available DRAM. For comparison of the bit cost, the DRAM with a process node of 1X nm was used. As for the semiconductor devices of one embodiment of the present invention, the process node was 30 nm and the number of stacked memory device layers in the cell A to the cell D was ten layers, twenty layers, and forty layers; thus, estimation was performed.

TABLE 3

| | DRAM | | Memory device of one embodiment of the present invention | | |
|---|---|---|---|---|---|
| Manufacturer | Company A | Company B | — | | |
| Process node | 18 nm | 1X nm | 30 nm | | |
| Number of layers stacked | — | — | 10 | 20 | 40 |
| Relative bit cost when the bit cost of Company B is assumed to be 1 | — | 1 | Cell A  1.7
Cell B  0.9
Cell C  0.6
Cell D  0.5 | 1.3
0.7
0.5
0.4 | 1.2
0.7
0.4
0.3 |

Note that this embodiment can be combined with any of the other embodiments described in this specification as appropriate.

(Embodiment 3)

Described in this embodiment is a metal oxide (hereinafter also referred to as an oxide semiconductor) that can be used in an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 21A. FIG. 21A is a diagram showing the classification of crystal structures of an oxide semiconductor, typically IGZO (a metal oxide containing In, Ga, and Zn).

As shown in FIG. 21A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that single crystal, poly crystal, and completely amorphous are excluded from the category of "Crystalline". The term "Crystal" includes single crystal and poly crystal.

Note that the structures in the thick frame in FIG. 21A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 21B shows an XRD spectrum, which is obtained by GIXD (Grazing-Incidence XRD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 21B and obtained by GIXD measurement is hereinafter simply referred to as an XRD spectrum. The CAAC-IGZO film in FIG. 21B has a composition in the neighborhood of In:Ga:Zn=4:2:3 [atomic ratio]. The CAAC-IGZO film in FIG. 21B has a thickness of 500 nm.

As shown in FIG. 21B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 21B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 21C shows a diffraction pattern of the CAAC-IGZO film. FIG. 21C shows a diffraction pattern obtained by the NBED method in which an electron beam is incident in the direction parallel to the substrate. The composition of the CAAC- IGZO film in FIG. 21C is In:Ga:Zn=4:2:3 [atomic ratio] or the neighborhood thereof. In the nanobeam electron diffraction method, electron diffraction is performed with a probe diameter of 1 nm.

As shown in FIG. 21C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 21A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor, which means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic proportions of In, Ga, and Zn in the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above-described oxide semiconductor is used for a transistor is described.

When the above-described oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges captured by the trap states in an oxide semiconductor take a long time to be released and may behave like fixed electric charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration obtained by secondary ion mass spectrometry (SIMS)) is lower than or equal to $2\times10^{18}$ atoms/cm$^{-3}$, preferably lower than or equal to $2\times10^{17}$ atoms/cm$^{-3}$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^{-3}$, preferably lower than or equal to $2\times10^{16}$ atoms/cm$^{-3}$.

An oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for a channel formation region in a transistor, the transistor can have stable electrical characteristics.

Note that this embodiment can be combined with any of the other embodiments in this specification as appropriate.

(Embodiment 4)

In this embodiment, a control logic circuit 561, a row driver circuit 562, a column driver circuit 563, and an output circuit 564 which can be provided in the memory device 100 of the above embodiment are described.

Figure 22:
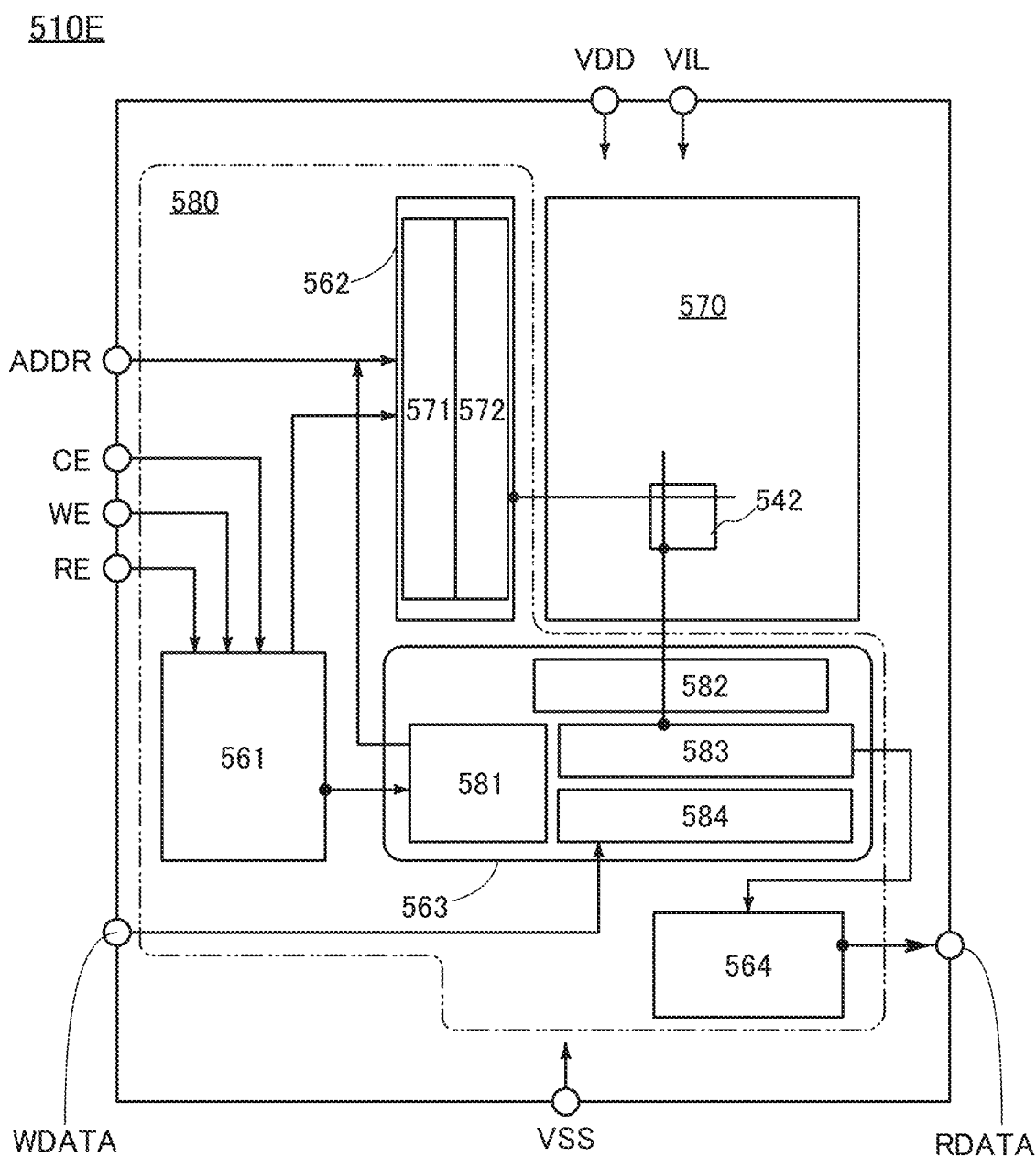
FIG. 22 is a block diagram illustrating a structure example of a semiconductor device.

FIG. 22 is a block diagram illustrating a structure example of a semiconductor device functioning as a memory device. A semiconductor device 510E includes a peripheral circuit 580 and a memory cell array 570. The peripheral circuit 580 includes the control logic circuit 561, the row driver circuit 562, the column driver circuit 563, and the output circuit 564.

The memory cell array 570 includes a plurality of memory cells 542. The row driver circuit 562 includes a row decoder 571 and a word line driver circuit 572. The column driver circuit 563 includes a column decoder 581, a precharge circuit 582, an amplifier circuit 583, and a write circuit 584. The precharge circuit 582 has a function of precharging the wiring GBL, the wiring LBL, or the like described in Embodiment 1, for example. The amplifier circuit 583 has a function of amplifying a data signal read from the wiring GBL, the wiring LBL, or the like, for example. The amplified data signal is output to the outside of the semiconductor device 510E as a digital data signal RDATA through the output circuit 564.

As power supply voltages from the outside, a low power supply voltage (VSS), a high power supply voltage (VDD) for the peripheral circuit 580, and a high power supply voltage (VIL) for the memory cell array 570 are supplied to the semiconductor device 510E.

Control signals (CE, WE, RE), an address signal ADDR, and a data signal WDATA are input to the semiconductor device 510E from the outside. The address signal ADDR is input to the row decoder 571 and the column decoder 581, and WDATA is input to the write circuit 584.

The control logic circuit 561 processes the signals (CE, WE, RE) input from the outside, and generates control signals for the row decoder 571 and the column decoder 581. CE is a chip enable signal, WE is a write enable signal, and RE is a read enable signal. The signals processed by the control logic circuit 561 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as needed.

Figure 23:
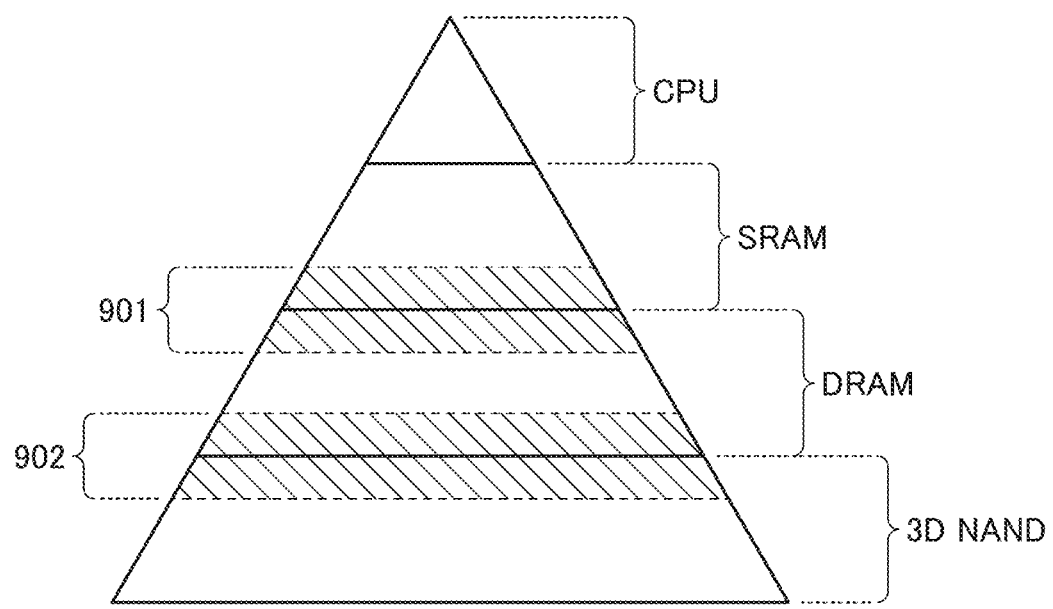
FIG. 23 is a conceptual view showing structure examples of a semiconductor device.

In general, a variety of memory devices (memories) are used in semiconductor devices such as computers in accordance with the intended use. FIG. 23 shows a hierarchy of memory devices. The memory devices at upper levels require higher access speed and those at lower levels require larger memory capacity and higher recording density. In FIG. 23, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, high operation speed is required rather than memory capacity. In addition, the register also has a function of retaining information on settings of the arithmetic processing device, for example.

An SRAM is used for a cache, for example. A cache has a function of duplicating and retaining part of information retained in a main memory. When the frequently used data is duplicated and retained in the cache, the access speed to the data can be increased.

A DRAM is used for a main memory, for example. A main memory has a function of retaining a program or data read from a storage. A DRAM has a recording density of approximately 0.1 to 0.3 Gbit/mm$^2$.

A 3D NAND memory is used for a storage, for example. A storage has a function of retaining data that needs to be retained for a long time or a variety of programs used in an arithmetic processing device, for example. Therefore, a storage needs to have high memory capacity and a high recording density rather than operation speed. A memory device used for a storage has a recording density of approximately 0.6 to 6.0 Gbit/mm$^2$.

The semiconductor device functioning as the memory device of one embodiment of the present invention has a high operation speed and can retain data for a long time. The semiconductor device of one embodiment of the present invention can be suitably used as a semiconductor device in a boundary region 901 that includes both the level to which a cache belongs and the level to which a main memory belongs. The semiconductor device of one embodiment of the present invention can also be suitably used as a semiconductor device in a boundary region 902 that includes both the level to which the main memory belongs and the level to which a storage belongs.

(Embodiment 5)

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 24A.

Figure 24A:
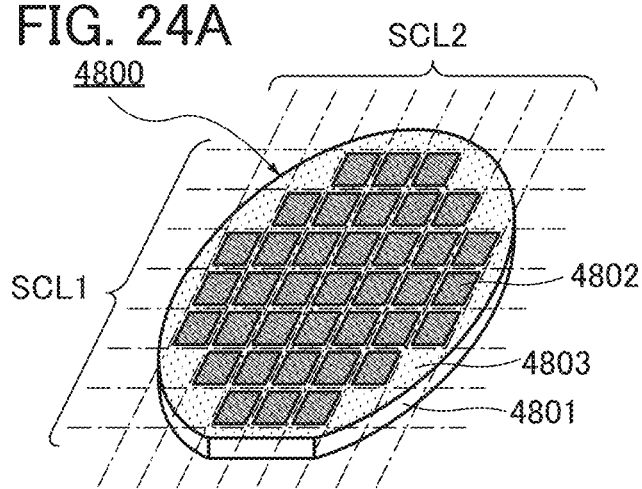
FIG. 24A is a perspective view illustrating an example of a semiconductor wafer.

A semiconductor wafer 4800 illustrated in FIG. 24A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 24B:
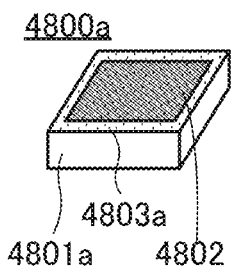
FIG. 24B is a perspective view illustrating an example of a chip.

With the dicing step, a chip 4800a as illustrated in FIG. 24B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 24A. The element substrate may be a rectangular semiconductor wafer, for example. The shape of the element substrate can be changed as appropriate, depending on a manufacturing process of an element and an apparatus for manufacturing the element.

<Electronic Component>

Figure 24C:
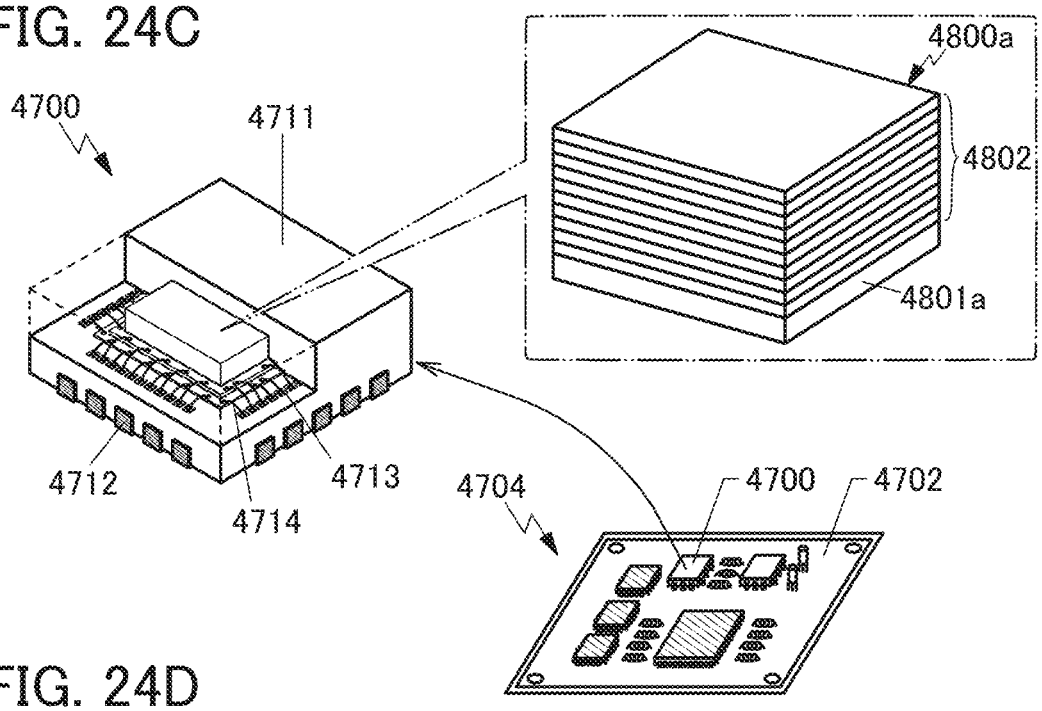
FIG. 24C and FIG. 24D are perspective views illustrating examples of electronic components.

FIG. 24C is a perspective view of an electronic component 4700 and a substrate (a mounting board 4704) on which the electronic component 4700 is mounted. The electronic component 4700 illustrated in FIG. 24C includes the chip 4800a in a mold 4711. Note that the chip 4800a illustrated in FIG. 24C is shown to have a structure in which the circuit portions 4802 are stacked. That is, the semiconductor device described in the above embodiment can be used for the circuit portion 4802. To illustrate the inside of the electronic component 4700, some portions are omitted in FIG. 24C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 24D:
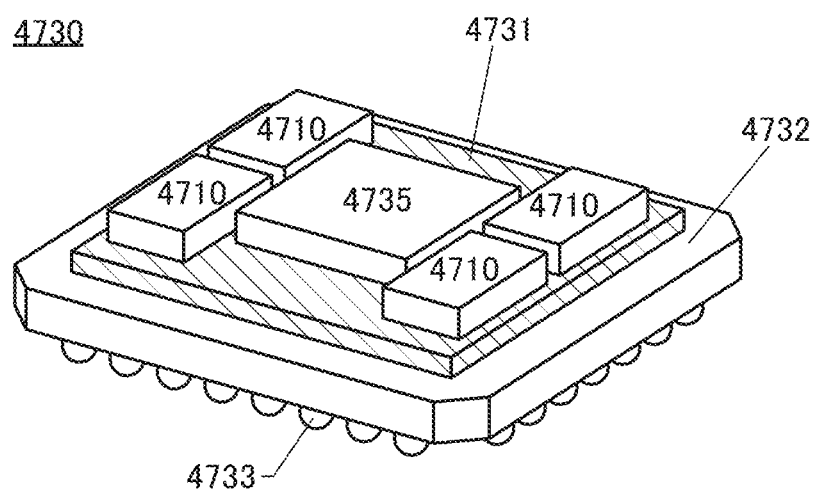

FIG. 24D shows a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Moreover, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 24D illustrates an example where the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments described in this specification as appropriate.

(Embodiment 6)

This embodiment will show examples of electronic devices including the semiconductor device described in the above embodiment. FIG. 25A to FIG. 25J and FIG. 26A to FIG. 26E illustrate electronic devices each of which includes the electronic component 4700 including the semiconductor device.

[Mobile Phone]

Figure 25A:
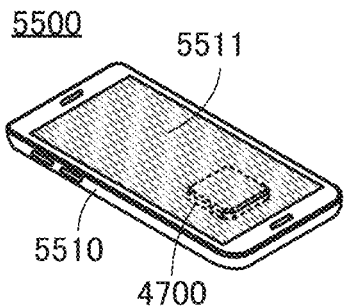
FIG. 25A to FIG. 25J are each a perspective view or a schematic view illustrating an example of a product.

An information terminal 5500 illustrated in FIG. 25A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the semiconductor device described in the above embodiment, the information terminal 5500 can retain a temporary file generated at the time of executing an application (e.g., a web browser's cache).

[Wearable Terminal]

Figure 25B:
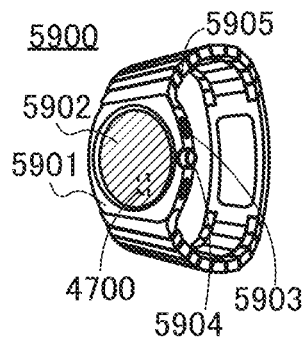

FIG. 25B illustrates an information terminal 5900 as an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the semiconductor device described in the above embodiment.

[Information Terminal]

Figure 25C:
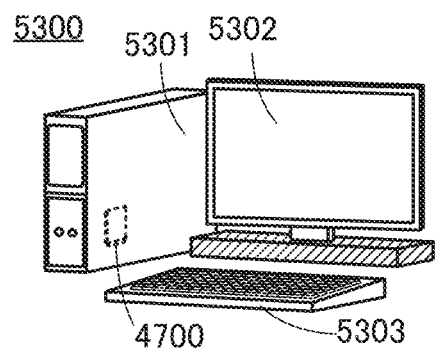

FIG. 25C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the semiconductor device described in the above embodiment.

Note that although the smartphone, the wearable terminal, and the desktop information terminal are respectively illustrated in FIG. 25A and FIG. 25C as examples of the electronic device, one embodiment of the present invention can be applied to an information terminal other than a smartphone, a wearable information terminal, and a desktop information terminal. Examples of an information terminal other than a smartphone, a wearable terminal, and a desktop information terminal include a PDA (Personal Digital Assistant), a laptop information terminal, and a workstation.

[Household Appliance]

Figure 25D:
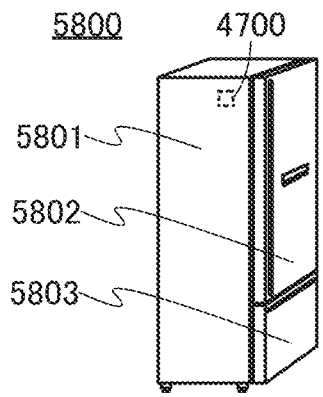

FIG. 25D illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiments is used in the electric refrigerator-freezer 5800, the electric refrigerator-freezer 5800 can be used for IoT (Internet of Things), for example. When used for IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the semiconductor device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 25E:
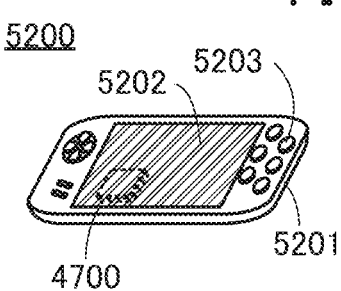

FIG. 25E illustrates a portable game machine 5200 that is an example of a game machine. The portable game machine 5200 includes a housing 5201, a display portion 5202, a button 5203, and the like.

Figure 25F:
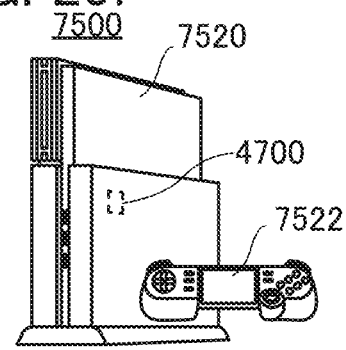

FIG. 25F illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 25F, the controller 7522 can include a display portion that displays a game image, and an input interface besides a button, such as a touch panel, a stick, a rotating knob, and a sliding knob, for example. The shape of the controller 7522 is not limited to that illustrated in FIG. 25F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Moreover, with the use of the semiconductor device described in the above embodiment, the portable game machine 5200 can retain a temporary file necessary for arithmetic operation that occurs during game play.

Although FIG. 25E and FIG. 25F illustrate the portable game machines as examples of game machines, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

Figure 25G:
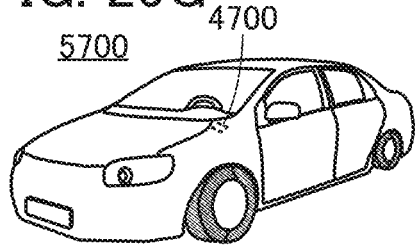

FIG. 25G illustrates an automobile 5700 that is an example of a moving vehicle.

An instrument panel that provides various kinds of information by displaying a speedometer, a tachometer, a mileage, a fuel meter, a gearshift state, and air-conditioning settings is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided on the exterior of the automobile 5700, which improves safety.

The semiconductor device described in the above embodiment can temporarily retain data, and thus the computer can be used to retain temporary data necessary in an automatic driving system for the automobile 5700 and a system for navigation and risk prediction, for example. The display device may be configured to display temporary information regarding navigation, risk prediction, or the like. Moreover, the semiconductor device may be configured to retain a video taken by a driving recorder provided in the automobile 5700.

Although an automobile is described above as an example of a moving vehicle, a moving vehicle is not limited to an automobile. Examples of moving vehicles include a train, a monorail train, a ship, and a flying object (a helicopter, an unmanned aircraft (a drone), an airplane, and a rocket).

[Camera]

The semiconductor device described in the above embodiment can be used in a camera.

Figure 25H:
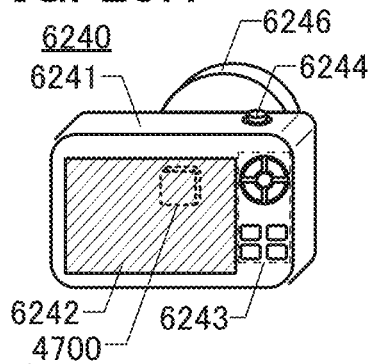

FIG. 25H illustrates a digital camera 6240 that is an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The semiconductor device described in the above embodiment can be used in a video camera.

Figure 25I:
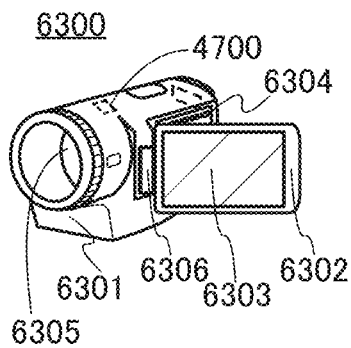

FIG. 25I illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be used in an implantable cardioverter-defibrillator (ICD).

Figure 25J:
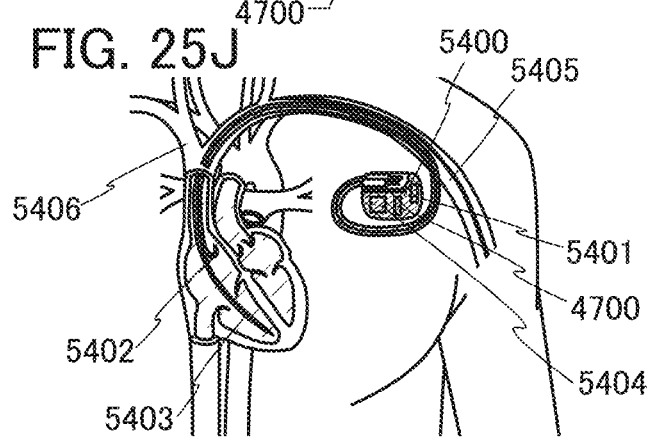

FIG. 25J is a schematic cross-sectional view illustrating an example of an ICD. An ICD main unit 5400 includes at least a battery 5401, an electric component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving electric power, an antenna that can transmit physiological signals may be included to construct, for example, a system that monitors the cardiac activity by checking physiological signals such as a pulse, a respiratory rate, a heart rate, and body temperature with an external monitoring device.

[Expansion Device for PC]

The semiconductor device described in the above embodiment can be used in a calculator such as a PC (Personal Computer) and an extension device for an information terminal.

Figure 26A:
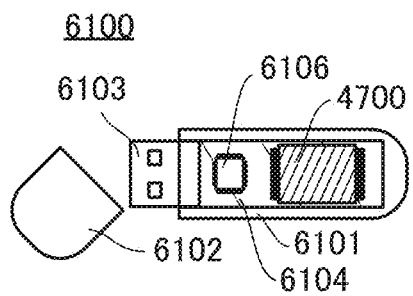
FIG. 26A to FIG. 26E are each a perspective view or a schematic view illustrating an example of a product.

FIG. 26A illustrates, as an example of the extension device, a portable extension device 6100 that includes a chip capable of retaining data and is externally provided on a PC. The extension device 6100 can retain data using the chip when connected to a PC with a USB (Universal Serial Bus), for example. FIG. 26A illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be used in an SD card that can be attached to an electronic device such as an information terminal or a digital camera.

Figure 26B:
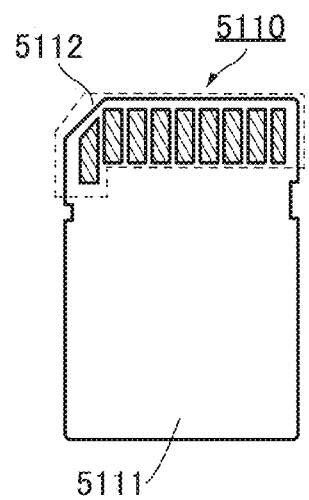
Figure 26C:
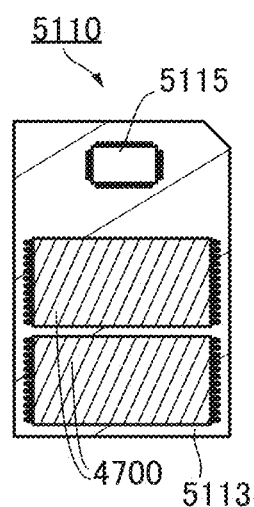

FIG. 26B is a schematic external view of an SD card, and FIG. 26C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, electronic components 4700 and a controller chip 5115 are attached to the substrate 5113. Note that the circuit configurations of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from/to the electronic components 4700.

[SSD]

The semiconductor device described in the above embodiment can be used in a solid state drive (SSD) that can be attached to an electronic device such as an information terminal.

Figure 26D:
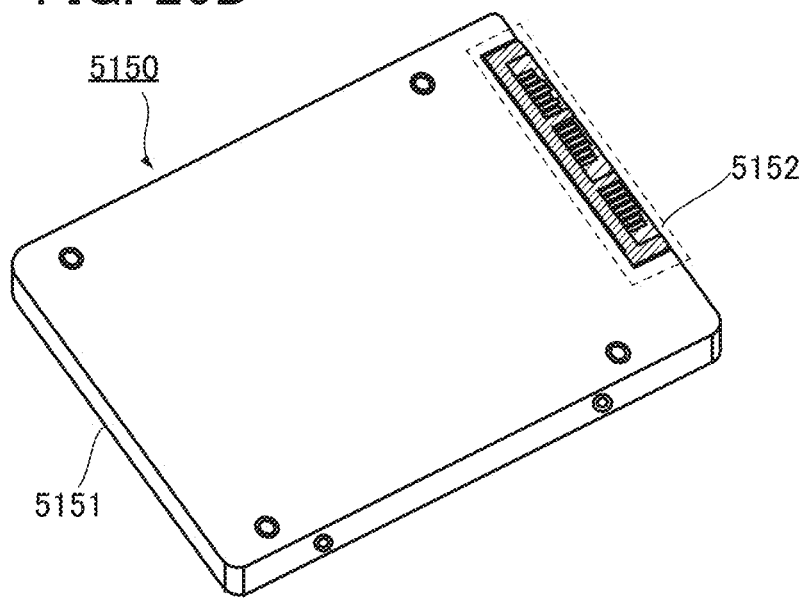
Figure 26E:
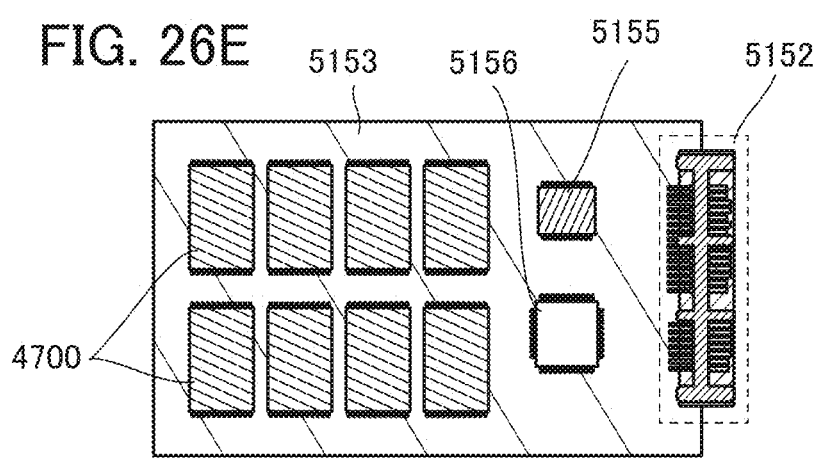

FIG. 26D is a schematic external view of an SSD, and FIG. 26E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the electronic components 4700, the memory chip 5155, and the controller chip 5115 are not limited to those described above, and can be changed as appropriate according to circumstances. For example, a memory functioning as a work memory can also be provided in the controller chip 5156.

Note that this embodiment can be combined with any of the other embodiments in this specification as appropriate.

REFERENCE NUMERALS

CAP: cell array portion, CAP[1]: cell array portion, CAP[2]: cell array portion, CAP[3]: cell array portion, CAP[P]: cell array portion, CAPB: cell array portion, CAPB[1]: cell array portion, CAPB[2]: cell array portion, CAPB[3]: cell array portion, CAPB[P]: cell array portion, RFC: reference cell portion, RFC[1]: reference cell portion, RFC[2]: reference cell portion, RFC[3]: reference cell portion, RFC[i]: reference cell portion, RFC[P]: reference cell portion, RFCB: reference cell portion, RFCB[1]: reference cell portion, RFCB[2]: reference cell portion, RFCB[3]: reference cell portion, RFCB[i]: reference cell portion, RFCB[P]: reference cell portion, RC[1]: circuit, RC[2]: circuit, RC[3]: circuit, RCB[1]: circuit, RCB[2]: circuit, RCB[3]: circuit, RCR[1]: circuit, RCR[2]: circuit, RCR[3]: circuit, RCRB[1]: circuit, RCRB[2]: circuit, RCRB[3]: circuit, SA: sense amplifier, SA[1]: sense amplifier, SA[2]: sense amplifier, SA[3]: sense amplifier, PC[1,1]: pair cell, PC[m,1]: pair cell, PC[1,n]: pair cell, PC[m,n]: pair cell, MC: circuit, MC[1,1]: circuit, MC[m,1]: circuit, MC[1,n]: circuit, MC[m,n]: circuit, MCr: circuit, MCr[1,1]: circuit, MCr[m,1]: circuit, MCr[1,n]: circuit, MCr[m,n]: circuit, VC[1]: reference cell, VC[2]: reference cell, VC[3]: reference cell, VC[P]: reference cell, SW[1]: switch, SW[2]: switch, SW[P−1]: switch, SWB[1]: switch, SWB[2]: switch, SWB[P−1]: switch, IS: switch, IS[1]: switch, ISR: switch, ISB: switch, ISRB: switch, ISRB[1]: switch, ISRB[2]: switch, ISRB[3]: switch, SWA1: switch, SWA2: switch, M1: transistor, M2: transistor, M3: transistor, M4: transistor, M8: transistor, M9: transistor, M10: transistor, M10[1]: transistor, M10B: transistor, M11: transistor, M11B: transistor, M11B[1]: transistor, M11B[2]: transistor, M11B[3]: transistor, M12: transistor, M13: transistor, M14: transistor, TR1: transistor, TR2: transistor, TR3: transistor, CT: capacitor, C2: capacitor, C3: capacitor, C5: capacitor, VR: variable resistor, MR: circuit, PCM1: circuit, LE: load, LEB: load, INV1: inverter circuit, INV2: inverter circuit, GBL: wiring, GBL[1]: wiring, GBL

[2]: wiring, GBL[3]: wiring, GBLB: wiring, GBLB[1]: wiring, GBLB[2]: wiring, GBLB[3]: wiring, LBL[1]: wiring, LBL[2]: wiring, LBL[3]: wiring, LBL[P]: wiring, LBLB[1]: wiring, LBLB[2]: wiring, LBLB[3]: wiring, LBLB[P]: wiring, RBL[1]: wiring, RBL[2]: wiring, RBL[3]: wiring, RBL[i]: wiring, RBL[P]: wiring, RBLB[1]: wiring, RBLB[2]: wiring, RBLB[3]: wiring, RBLB[i]: wiring, RBLB[P]: wiring, CRL[1]: wiring, CRL[2]: wiring, CRL[3]: wiring, CRL[i]: wiring, CRL[P]: wiring, VER[1]: wiring, VER[2]: wiring, VER[3]: wiring, VER[i]: wiring, VER[P]: wiring, CWL[1]: wiring, CWL[2]: wiring, CWL[3]: wiring, CWL[i]: wiring, CWL[P]: wiring, VRL[1]: wiring, VRL[2]: wiring, VRL[3]: wiring, VRL[i]: wiring, VRL[P]: wiring, IP: wiring, IP[1]: wiring, IPR: wiring, IPB: wiring, IPRB: wiring, IPRB[1]: wiring, IPRB[2]: wiring, IPRB[3]: wiring, SL: wiring, SRL: wiring, SLB: wiring, SRLB: wiring, RE: wiring, WE: wiring, MUX: wiring, EQ: wiring, ACL: wiring, VQL: wiring, VHE: wiring, VLE: wiring, S1L: wiring, S2L: wiring, S1LB: wiring, S2LB: wiring, CVL: wiring, WRL: wiring, RWL: wiring, WWL: wiring, WBL: wiring, 100: memory device, 100A: memory device, 100B: memory device, 200: transistor, 200M: transistor, 200T: transistor, 205: conductor, 205*a*: conductor, 205*b*: conductor, 211: insulator, 212: insulator, 214: insulator, 222: insulator, 224: insulator, 230: oxide, 230*a*: oxide, 230*b*: oxide, 230*c*: oxide, 240: conductor, 240*a*: conductor, 240*b*: conductor, 241: insulator, 241*a*: insulator, 241*b*: insulator, 242: conductor, 242*a*: conductor, 242*b*: conductor, 243: oxide, 243*a*: oxide, 243*b*: oxide, 246: conductor, 246*a*: conductor, 246*b*: conductor, 250: insulator, 260: conductor, 260*a*: conductor, 260*b*: conductor, 272: insulator, 273: insulator, 274: insulator, 275: insulator, 276: conductor, 277: insulator, 278: conductor, 279: insulator, 280: insulator, 281: conductor, 282: insulator, 283: insulator, 284: insulator, 287: insulator, 290: conductor, 292: capacitor, 292A: capacitor, 292B: capacitor, 292C: capacitor, 294: conductor, 295: insulator, 296: insulator, 297: conductor, 298: insulator, 299: conductor, 300: transistor, 311: semiconductor substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 411: element layer, 413: transistor layer, 413[1]: transistor layer, **413[*m*]: transistor layer, 415: memory device layer, 415[1]: memory device layer, 415[2]: memory device layer, 415[3]: memory device layer, 415[4]: memory device layer, 415[*p*−1]: memory device layer, 415[*p*]: memory device layer, 415[*n*]: memory device layer, 420: memory device, 420A: memory device, 420B: memory device, 420C: memory device, 422: region, 424: conductor, 426: conductor, 428: conductor, 430: conductor, 432: memory cell, 433: memory cell, 434: memory cell, 435: memory cell, 470: memory unit, 470[1]: memory unit, 470[*m*]: memory unit, 510E: semiconductor device, 542: memory cell, 561: control logic circuit, 562: row driver circuit, 563: column driver circuit, 564: output circuit, 570: memory cell array, 571: row decoder, 572: word line driver circuit, 580: peripheral circuit, 581: column decoder, 582: precharge circuit, 583: amplifier circuit, 584: circuit, 901: boundary region, 902: boundary region, 4700: electrical component, 4702: printed circuit board, 4704: circuit board, 4710: semiconductor device, 4714: wire, 4730: electrical component, 4731: interposer, 4732: package substrate, 4733: electrode, 4735: semiconductor device, 4800: semiconductor wafer, 4800***a*: chip, 4801: wafer, 4801*a*: wafer, 4802: circuit portion, 4803: spacing, 4803*a*: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display, 5303: keyboard, 5400: ICD main body, 5401: battery, 5402: wire, 5403: wire, 5404: antenna, 5405: subclavian vein, 5406: superior vena cava, 5500: information terminal, 5510: housing, 5511: display portion, 5700: car, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: extension device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: control key, 6305: lens, 6306: joint, 7520: main body, 7522: controller

The invention claimed is:
1. A semiconductor device comprising:
a memory cell, a first reference cell, a second reference cell, a first sense amplifier, a second sense amplifier, a first circuit, a second circuit, a third circuit, a first switch, a second switch, a first wiring, a second wiring, a third wiring, and a fourth wiring,
wherein the first circuit comprises a first transistor,
wherein the second circuit comprises a second transistor,
wherein the third circuit comprises a third transistor,
wherein the memory cell is electrically connected to a gate of the first transistor,
wherein the first reference cell is electrically connected to a gate of the second transistor,
wherein the second reference cell is electrically connected to a gate of the third transistor,
wherein the first wiring is electrically connected to a first terminal of the first transistor, a first terminal of the first switch, and the first sense amplifier,
wherein the second wiring is electrically connected to a first terminal of the second transistor, a first terminal of the second switch, and the first sense amplifier,
wherein the third wiring is electrically connected to a second terminal of the first switch and the second sense amplifier,
wherein the fourth wiring is electrically connected to a first terminal of the third transistor, a second terminal of the second switch, and the second sense amplifier,
wherein the first circuit is configured to correct a threshold voltage of the first transistor,
wherein the second circuit is configured to correct a threshold voltage of the second transistor,
wherein the third circuit is configured to correct a threshold voltage of the third transistor,
wherein the first circuit is configured to output a first potential corresponding to a first signal output from the memory cell to the first wiring and the third wiring, when the first switch is in an on state,
wherein the second circuit is configured to output a second potential corresponding to a second signal output from the first reference cell to the second wiring, when the second switch is in an off state, and
wherein the third circuit is configured to output a third potential corresponding to a third signal output from the second reference cell to the fourth wiring, when the second switch is in an off state.

2. The semiconductor device according to claim 1,
wherein the memory cell comprises a fourth transistor and a capacitor,
wherein a first terminal of the fourth transistor is electrically connected to a first terminal of the capacitor, and
wherein a second terminal of the fourth transistor is electrically connected to the first circuit.

3. The semiconductor device according to claim 2,
further comprising a first layer and a second layer,
wherein the first layer comprises the first sense amplifier and the second sense amplifier,
wherein the second layer comprises the memory cell, the first reference cell, and the second reference cell,
wherein the second layer is positioned above the first layer,
wherein the first to fourth transistors each comprise a metal oxide in a channel formation region, and
wherein transistors included in the first sense amplifier and the second sense amplifier each comprise silicon in a channel formation region.

4. A semiconductor device comprising:
a memory cell, a first reference cell, a second reference cell, a first sense amplifier, a second sense amplifier, a first circuit, a second circuit, a third circuit, a first switch, a second switch, a first wiring, a second wiring, a third wiring, and a fourth wiring,
wherein the first circuit comprises a first transistor,
wherein the second circuit comprises a second transistor,
wherein the third circuit comprises a third transistor,
wherein the memory cell is electrically connected to a gate of the first transistor,
wherein the first reference cell is electrically connected to a gate of the second transistor,
wherein the second reference cell is electrically connected to a gate of the third transistor,
wherein the first wiring is electrically connected to a first terminal of the first transistor, a first terminal of the first switch, and the first sense amplifier,
wherein the second wiring is electrically connected to a first terminal of the second transistor, a first terminal of the second switch, and the first sense amplifier,
wherein the third wiring is electrically connected to a second terminal of the first switch and the second sense amplifier,
wherein the fourth wiring is electrically connected to a first terminal of the third transistor, a second terminal of the second switch, and the second sense amplifier,
wherein the first circuit is configured to correct a threshold voltage of the first transistor,
wherein the second circuit is configured to correct a threshold voltage of the second transistor,
wherein the third circuit is configured to correct a threshold voltage of the third transistor,
wherein the first circuit is configured to output a first potential corresponding to a first signal output from the memory cell to the first wiring and the third wiring, when the first switch is in an on state,
wherein the second circuit is configured to output a second potential corresponding to a second signal output from the first reference cell to the second wiring, when the second switch is in an off state,
wherein the third circuit is configured to output a third potential corresponding to a third signal output from the second reference cell to the fourth wiring, when the second switch is in an off state,
wherein the first sense amplifier is configured to refer to the first potential of the first wiring and the second potential of the second wiring, change the first potential of the first wiring to one of a high-level potential and a low-level potential, and change the second potential of the second wiring to the other of the high-level potential and the low-level potential when the first switch and the second switch are each in an off state, and
wherein the second sense amplifier is configured to refer to the first potential of the third wiring and the third potential of the fourth wiring, change the first potential of the third wiring to one of a high-level potential and a low-level potential, and change the third potential of the fourth wiring to other of the high-level potential and the low-level potential when the first switch and the second switch are each in an off state.

5. The semiconductor device according to claim 4,
wherein the memory cell comprises a fourth transistor and a capacitor,
wherein a first terminal of the fourth transistor is electrically connected to a first terminal of the capacitor, and
wherein a second terminal of the fourth transistor is electrically connected to the first circuit.

6. The semiconductor device according to claim 5,
further comprising a first layer and a second layer,
wherein the first layer comprises the first sense amplifier and the second sense amplifier,
wherein the second layer comprises the memory cell, the first reference cell, and the second reference cell,
wherein the second layer is positioned above the first layer,
wherein the first to fourth transistors each comprise a metal oxide in a channel formation region, and
wherein transistors included in the first sense amplifier and the second sense amplifier each comprise silicon in a channel formation region.

7. An operation method of a semiconductor device comprising a memory cell, a first reference cell, a second reference cell, a first sense amplifier, a second sense amplifier, a first circuit, a second circuit, a third circuit, a first switch, a second switch, a first wiring, a second wiring, a third wiring, and a fourth wiring,
wherein the memory cell is electrically connected to the first circuit,
wherein the first reference cell is electrically connected to the second circuit,
wherein the second reference cell is electrically connected to the third circuit,
wherein the first wiring is electrically connected to the first circuit, a first terminal of the first switch, and the first sense amplifier,
wherein the second wiring is electrically connected to the second circuit, a first terminal of the second switch, and the first sense amplifier,
wherein the third wiring is electrically connected to a second terminal of the first switch and the second sense amplifier, and
wherein the fourth wiring is electrically connected to the third circuit, a second terminal of the second switch, and the second sense amplifier,
the operation method comprising a first period to a sixth period,
wherein the first period comprises a period in which a first signal output from the memory cell is input to the first circuit,
wherein the second period comprises a period in which the first switch is in an on state and a first potential corresponding to the first signal is output from the first circuit to the first wiring and the third wiring, and wherein the third period comprises a period in which the second switch is brought into an off state, the fourth period comprising:
- a period in which a second signal output from the first reference cell is input to the second circuit and a second potential corresponding to the second signal is output from the second circuit to the second wiring; and
- a period in which a third signal output from the second reference cell is input to the third circuit and a third potential corresponding to the third signal is output from the third circuit to the third wiring, wherein the fifth period comprises a period in which the first switch is brought into an off state, the sixth period comprising:
- a period in which the first sense amplifier refers to the first potential of the first wiring and the second potential of the second wiring, changes the first potential of the first wiring to one of a high-level potential and a low-level potential, and changes the second potential of the second wiring to the other of the high-level potential and the low-level potential; and
- a period in which the second sense amplifier refers to the first potential of the third wiring and the third potential of the fourth wiring, changes the first potential of the third wiring to one of a high-level potential and a low-level potential, and changes the third potential of the fourth wiring to the other of the high-level potential and the low-level potential.

8. The operation method of a semiconductor device, according to claim 7, wherein the first circuit comprises a first transistor, wherein the second circuit comprises a second transistor, wherein the third circuit comprises a third transistor, wherein a gate of the first transistor is electrically connected to the memory cell, wherein a first terminal of the first transistor is electrically connected to the first wiring, wherein a gate of the second transistor is electrically connected to the first reference cell, wherein a first terminal of the second transistor is electrically connected to the second wiring, wherein a gate of the third transistor is electrically connected to the second reference cell, and wherein a first terminal of the third transistor is electrically connected to the third wiring.

9. The operation method of a semiconductor device, according to claim 8, wherein the memory cell comprises a fourth transistor and a capacitor, wherein a first terminal of the fourth transistor is electrically connected to a first terminal of the capacitor, and wherein a second terminal of the fourth transistor is electrically connected to the first circuit.

10. The operation method of a semiconductor device, according to claim 9, wherein the semiconductor device further comprises a first layer and a second layer, wherein the first layer comprises the first sense amplifier and the second sense amplifier, wherein the second layer comprises the memory cell, the first reference cell, and the second reference cell, wherein the second layer is positioned above the first layer, wherein the first to fourth transistors each comprise a metal oxide in a channel formation region, and wherein transistors included in the first sense amplifier and the second sense amplifier each comprise silicon in a channel formation region.

* * * * *